US010172224B2

(12) United States Patent
Yabu et al.

(10) Patent No.: US 10,172,224 B2
(45) Date of Patent: Jan. 1, 2019

(54) EXTREME UV LIGHT GENERATOR

(71) Applicant: Gigaphoton Inc., Tochigi (JP)

(72) Inventors: Takayuki Yabu, Oyama (JP); Hirokazu Hosoda, Oyama (JP); Takuya Ishii, Oyama (JP)

(73) Assignee: Gigaphoton Inc., Tochigi (JP)

( * ) Notice: Subject to any disclaimer, the term of this patent is extended or adjusted under 35 U.S.C. 154(b) by 67 days.

(21) Appl. No.: 15/351,988

(22) Filed: Nov. 15, 2016

(65) Prior Publication Data

US 2017/0064799 A1    Mar. 2, 2017

Related U.S. Application Data

(63) Continuation of application No. PCT/JP2015/070740, filed on Jul. 21, 2015.

(30) Foreign Application Priority Data

Jul. 25, 2014  (WO) ................. PCT/JP2014/069715

(51) Int. Cl.
*H05G 2/00* (2006.01)
*G03F 7/20* (2006.01)
*G21F 3/00* (2006.01)

(52) U.S. Cl.
CPC .......... *H05G 2/006* (2013.01); *G03F 7/70033* (2013.01); *G21F 3/00* (2013.01); *H05G 2/008* (2013.01)

(58) Field of Classification Search
CPC ............................... H05G 2/006; H05G 2/008
See application file for complete search history.

(56) References Cited

U.S. PATENT DOCUMENTS 7,068,367 B2    6/2006  Stobrawa et al.
7,589,337 B2    9/2009  Bykanov et al.
(Continued)

FOREIGN PATENT DOCUMENTS

JP    H05-029109 U    4/1993
JP    H06-038210 U    5/1994
(Continued)

OTHER PUBLICATIONS

International Search Report issued in PCT/JP2015/070740; dated Oct. 27, 2015.
Written Opinion issued in PCT/JP2015/070740; dated Oct. 27, 2015.

*Primary Examiner* — Nicole Ippolito
*Assistant Examiner* — Sean Luck
(74) *Attorney, Agent, or Firm* — Studebaker & Brackett PC

(57) ABSTRACT

An extreme ultraviolet light generation apparatus may include: a chamber in which extreme ultraviolet light is generated from plasma generated by irradiating a target supplied into the chamber with a laser beam; a target generator that supplies the target into the chamber as a droplet; a droplet measurement unit that measures the droplet supplied from the target generator into the chamber; and a shielding member that shields the droplet measurement unit from electromagnetic waves emitted from the plasma, the droplet measurement unit including: a light source that emits continuous light to the droplet; a window provided in the chamber to allow the continuous light to transmit therethrough; and an optical sensor that receives the continuous light via the window. The shielding member includes a shielding body provided on the chamber side with respect to the window and configured to cover an optical path of the continuous light.

20 Claims, 32 Drawing Sheets

(56) References Cited

U.S. PATENT DOCUMENTS

| | | | |
|---|---|---|---|
| 7,602,307 B1 * | 10/2009 | Brennan | G01N 21/645 340/10.1 |
| 2008/0159414 A1 * | 7/2008 | Brecher | H04L 25/0266 375/258 |
| 2010/0019173 A1 * | 1/2010 | Someya | H05G 2/003 250/496.1 |
| 2010/0117009 A1 | 5/2010 | Moriya et al. | |
| 2011/0122387 A1 * | 5/2011 | Tao | H05G 2/001 355/67 |
| 2012/0080584 A1 | 4/2012 | Partlo et al. | |
| 2013/0186976 A1 | 7/2013 | Ishihara et al. | |
| 2014/0098830 A1 | 4/2014 | Yabu et al. | |
| 2014/0111635 A1 | 4/2014 | Suzuki et al. | |
| 2014/0191108 A1 | 7/2014 | Moriya et al. | |
| 2014/0353528 A1 | 12/2014 | Hayashi et al. | |
| 2015/0334814 A1 | 11/2015 | Moriya et al. | |
| 2015/0342015 A1 | 11/2015 | Hayashi et al. | |

FOREIGN PATENT DOCUMENTS

| | | |
|---|---|---|
| JP | H10-004016 A | 1/1998 |
| JP | 2013-084807 A | 5/2013 |
| JP | 2013-165256 A | 8/2013 |
| JP | 2013-175434 A | 9/2013 |
| JP | 2014-041828 A | 3/2014 |
| JP | 2014-078394 A | 5/2014 |
| JP | 2014-086523 A | 5/2014 |
| JP | 2014-235805 A | 12/2014 |

* cited by examiner

EXTREME UV LIGHT GENERATOR

CROSS-REFERENCE(S) TO RELATED APPLICATION(S)

This application claims the benefit of International Patent Application No. PCT/JP2014/069715 filed Jul. 25, 2014, which is incorporated herein by reference.

BACKGROUND

1. Technical Field

The present disclosure relates to an extreme ultraviolet (EUV) light generation apparatus.

2. Related Art

In recent years, as semiconductor processes become finer, transfer patterns for use in photolithographies of semiconductor processes have rapidly become finer. In the next generation, microfabrication at 70 nm to 45 nm, further, microfabrication at 32 nm or less would be demanded. In order to meet the demand for microfabrication at 32 nm or less, for example, it is expected to develop an exposure device in which an extreme ultraviolet (EUV) generation apparatus for generating EUV light at a wavelength of approximately 13 nm is combined with a reduced projection reflective optical system.

Three types of EUV light generation systems have been proposed, which include an LPP (laser produced plasma) type system using plasma generated by irradiating a target material with a laser beam, a DPP (discharge produced plasma) type system using plasma generated by electric discharge, and an SR (synchrotron radiation) type system using synchrotron orbital radiation.

CITATION LIST

Patent Literature

PTL1: U.S. Pat. No. 7,068,367
PTL2: U.S. Pat. No. 7,589,337
PTL3: U.S. Patent Application Publication No. 2012080584
PTL4: Japanese Patent Application No. 2013-114964

SUMMARY

According to an aspect of the present disclosure, an extreme ultraviolet light generation apparatus may include: a chamber in which extreme ultraviolet light is generated from plasma, the plasma being generated by irradiating a target supplied into the chamber with a laser beam; a target generator configured to supply the target into the chamber as a droplet; a droplet measurement unit configured to measure the droplet supplied from the target generator into the chamber; and a shielding member configured to shield the droplet measurement unit from electromagnetic waves emitted from the plasma, the droplet measurement unit including: a light source configured to emit continuous light to the droplet; a window provided in the chamber and configured to allow the continuous light to transmit therethrough; and an optical sensor configured to receive the continuous light via the window, wherein the shielding member includes a shielding body provided on the chamber side with respect to the window and configured to cover an optical path of the continuous light.

According to another aspect of the present disclosure, an extreme ultraviolet light generation apparatus may include: a chamber in which extreme ultraviolet light is generated from plasma, the plasma being generated by irradiating a target supplied into the chamber with a laser beam; a target generator configured to supply the target into the chamber as a droplet; and a droplet measurement unit configured to measure the droplet supplied from the target generator into the chamber, the droplet measurement unit including: a light source configured to emit continuous light to the droplet; a window provided in the chamber and configured to allow the continuous light to transmit therethrough; and an optical sensor configured to receive the continuous light via the window; and a transfer optical system disposed between the window and the optical sensor and configured to transfer an image of the droplet irradiated with the continuous light to the optical sensor and prevent light of electromagnetic waves emitted from the plasma from entering the optical sensor, wherein: the droplet measurement unit measures the droplet passing through a predetermined position in the chamber and outputs a passage timing signal indicating a timing at which the droplet is passing through the predetermined position; and a line filter is provided on a signal wire through which the passage timing signal outputted from the droplet measurement unit is transmitted to attenuate noise of the electromagnetic waves emitted from the plasma.

BRIEF DESCRIPTION OF THE DRAWINGS

Hereinafter, selected embodiments of the present disclosure will be described with reference to the accompanying drawings by way of example.

DESCRIPTION OF EXEMPLARY EMBODIMENTS

Figure 1:
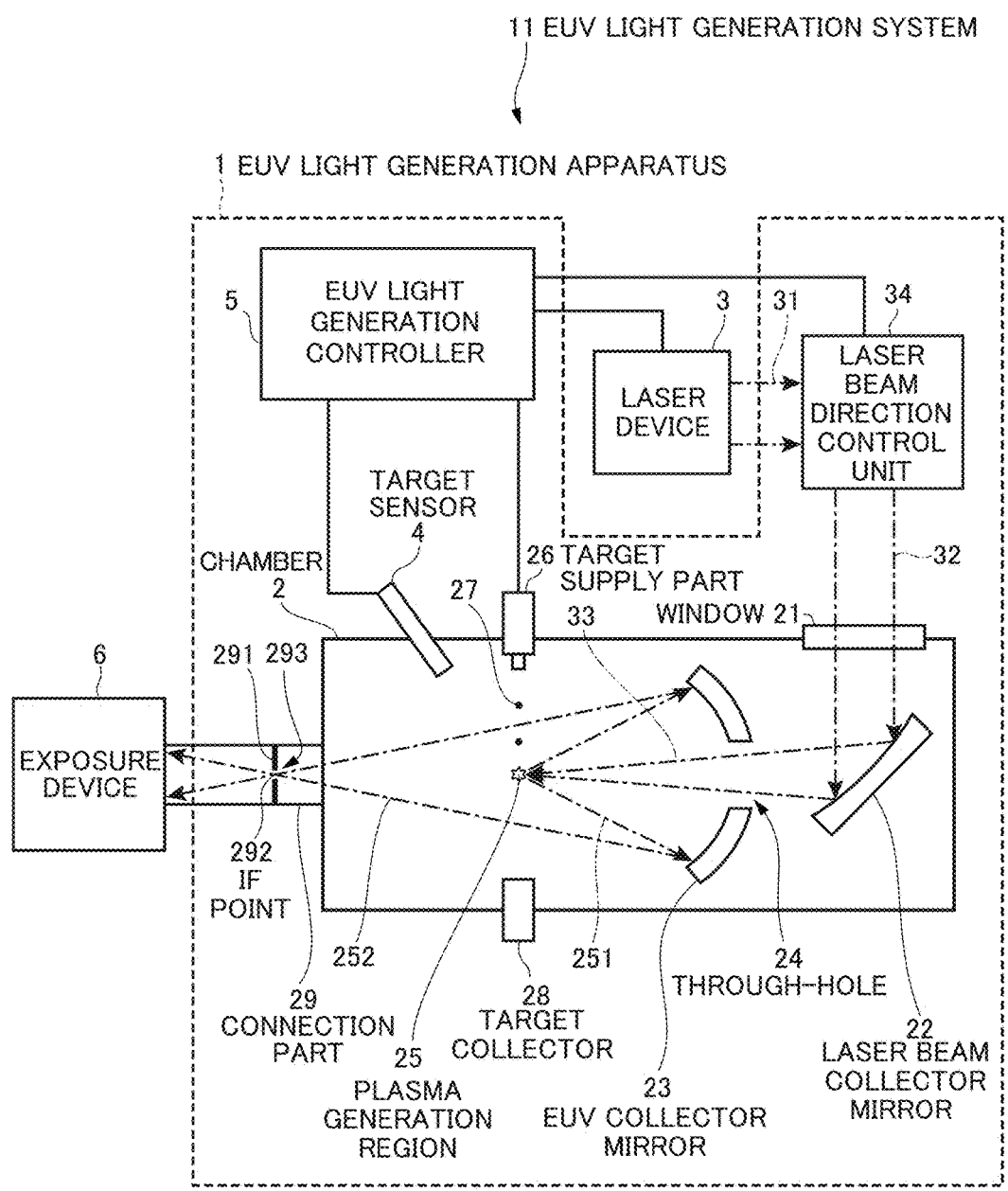
FIG. 1 schematically shows the configuration of an exemplary LPP type EUV light generation system.

<Contents>
1. Overview
2. Description of terms
3. Overview of the EUV light generation system
3.1 Configuration
3.2 Operation
4. EUV light generation apparatus including a droplet measurement unit
4.1 Configuration
4.2 Operation
4.3 Problem
5. EUV light generation apparatus according to Embodiment 1
5.1 Configuration
5.2 Modification 1
5.3 Modification 2
5.4 Modification 3
5.5 Modification 4
6. EUV light generation apparatus according to Embodiment 2
6.1 Configuration
6.2 Modification
7. EUV light generation apparatus according to Embodiment 3
7.1 Configuration
7.2 Modification
8. EUV light generation apparatus according to Embodiment 4
9. EUV light generation apparatus according to Embodiment 5
10. EUV light generation apparatus according to Embodiment 6
11. Shielding member, shielding plate and shielding body
12. EUV light generation apparatus according to Embodiment 7
12.1 Configuration
12.2 Modification
13. EUV light generation apparatus according to Embodiment 8
13.1 Configuration
13.2 Modification
14. EUV light generation apparatus according to Embodiment 9
14.1 Configuration
14.2 Operation
14.3 Effect
14.4 Modification
15. EUV light generation apparatus according to Embodiment 10
16. EUV light generation apparatus according to Embodiment 11
16.1 Configuration
16.2 Operation
16.3 Effect
17. Others
17.1 Detailed configuration of a line filter
17.2 Hardware environment of each controller
17.3 Other modifications Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Moreover, corresponding components are referenced by corresponding reference numerals and characters, and therefore duplicate descriptions will be omitted.

1. Overview

The present disclosure may disclose at least the following embodiments.

The EUV light generation apparatus 1 may include: a chamber 2 in which EUV light 252 is generated from plasma, the plasma being generated by irradiating a target 27 supplied into the chamber 2 with a laser beam; a target generator 7 configured to supply the target 27 into the chamber 2 as a droplet; a droplet measurement unit 41 configured to measure the droplet 271 supplied from the target generator 7 into the chamber 2; and a shielding member 9 configured to shield the droplet measurement unit 41 from electromagnetic waves emitted from the plasma. The droplet measurement unit 41 may include: a light source 411a configured to emit continuous light to the droplet 271; a window 421c provided in the chamber 2 and configured to allow the continuous light to transmit therethrough; and an optical sensor 412a configured to receive the continuous light via the window 412c. The shielding member 9 may include a shielding body 91A provided on the chamber 2 side with respect to the window 412c and formed to cover the optical path of the continuous light. With this configuration, the EUV light generation apparatus 1 can improve the energy stability of the outputted EUV light 252.

2. Description of Terms

"Target" refers to a substance which is introduced into the chamber and is irradiated with a laser beam. The target irradiated with the laser beam is turned into plasma and emits EUV light. "Droplet" may refer to one form of the target introduced into the chamber. "Axis of an optical path" refers to an axis passing through the center of the beam cross-section of a laser beam along the traveling direction of the laser beam. "Optical path" refers to a path through which the laser beam passes. The optical path may include the axis of the optical path.

3. Overview of the EUV Light Generation System 3.1 Configuration

FIG. 1 schematically shows the configuration of an exemplary LPP type EUV light generation system. The EUV light generation apparatus 1 may be used with at least one laser device 3. In the present disclosure, the system including the EUV light generation apparatus 1 and the laser device 3 may be referred to as an EUV light generation system 11. As shown in FIG. 1, and as described in detail later, the EUV light generation apparatus 1 may include the chamber 2 and a target supply part 26. The chamber 2 may be sealed airtight. The target supply part 26 may be mounted onto the chamber 2, for example, to penetrate a wall of the chamber 2. A target material to be supplied from the target supply part 26 may include, but is not limited to, tin, terbium, gadolinium, lithium, xenon, or a combination of any two or more of them.

The chamber 2 may have at least one through-hole in its wall. A window 21 may be provided on the through-hole. A pulsed laser beam 32 outputted from the laser device 3 may transmit through the window 21. In the chamber 2, an EUV collector mirror 23 having, for example, a spheroidal reflective surface may be provided. The EUV collector mirror 23 may have a first focusing point and a second focusing point. The surface of the EUV collector mirror 23 may have a multi-layered reflective film in which molybdenum layers and silicon layers are alternately laminated. Preferably, the EUV collector mirror 23 may be arranged such that the first focusing point is positioned in a plasma generation region 25 and the second focusing point is positioned in an intermediate focusing (IF) point 292. The EUV collector mirror 23 may have a through-hole 24 formed at the center thereof so that a pulsed laser beam 33 may pass through the through-hole 24.

The EUV light generation apparatus 1 may further include an EUV light generation controller 5 and a target sensor 4. The target sensor 4 may have an imaging function and detect the presence, trajectory, position and velocity of the target 27.

Further, the EUV light generation apparatus 1 may include a connection part 29 that allows the interior of the chamber 2 to be in communication with the interior of an exposure device 6. In the connection part 29, a wall 291 having an aperture 293 may be provided. The wall 291 may be positioned such that the second focusing point of the EUV collector mirror 23 lies in the aperture 293.

The EUV light generation apparatus 1 may also include a laser beam direction control unit 34, a laser beam focusing mirror 22, and the target collector 28 for collecting the target 27. The laser beam direction control unit 34 may include an optical element for defining the traveling direction of the laser beam and an actuator for adjusting the position, the posture and so forth of the optical element.

3.2 Operation

With reference to FIG. 1, a pulsed laser beam 31 outputted from the laser device 3 may pass through the laser beam direction control unit 34, transmit through the window 21 as a pulsed laser beam 32, and then enter the chamber 2. The pulsed laser beam 32 may travel through the chamber 2 along at least one laser beam path, be reflected from the laser beam focusing mirror 22, and be applied to at least one target 27 as the pulsed laser beam 33.

The target supply part 26 may be configured to output the target 27 to the plasma generation region 25 in the chamber 2. The target 27 may be irradiated with at least one pulse of the pulsed laser beam 33. Upon being irradiated with the pulsed laser beam, the target 27 may be turned into plasma, and EUV light 251 may be emitted from the plasma together with the emission of light at different wavelengths. The EUV light 251 may be selectively reflected from the EUV collector mirror 23. EUV light 252 reflected from the EUV collector mirror 23 may be focused onto the IF point 292, and outputted to the exposure device 6. Here, one target 27 may be irradiated with multiple pulses of the pulsed laser beam 33.

The EUV light generation controller 5 may be configured to totally control the EUV light generation system 11. The EUV light generation controller 5 may be configured to process the image data of the target 27 captured by the target sensor 4. In addition, the EUV light generation controller 5 may be configured to control at least one of: the timing at which the target 27 is outputted; and the direction in which the target 27 is outputted. Moreover, the EUV light generation controller 5 may be configured to control at least one of: the timing at which the laser device 3 oscillates; the traveling direction of the pulsed laser beam 32; and the position on which the pulsed laser beam 33 is focused. The various controls described above are merely examples, and other controls may be added as necessary.

Figure 2:
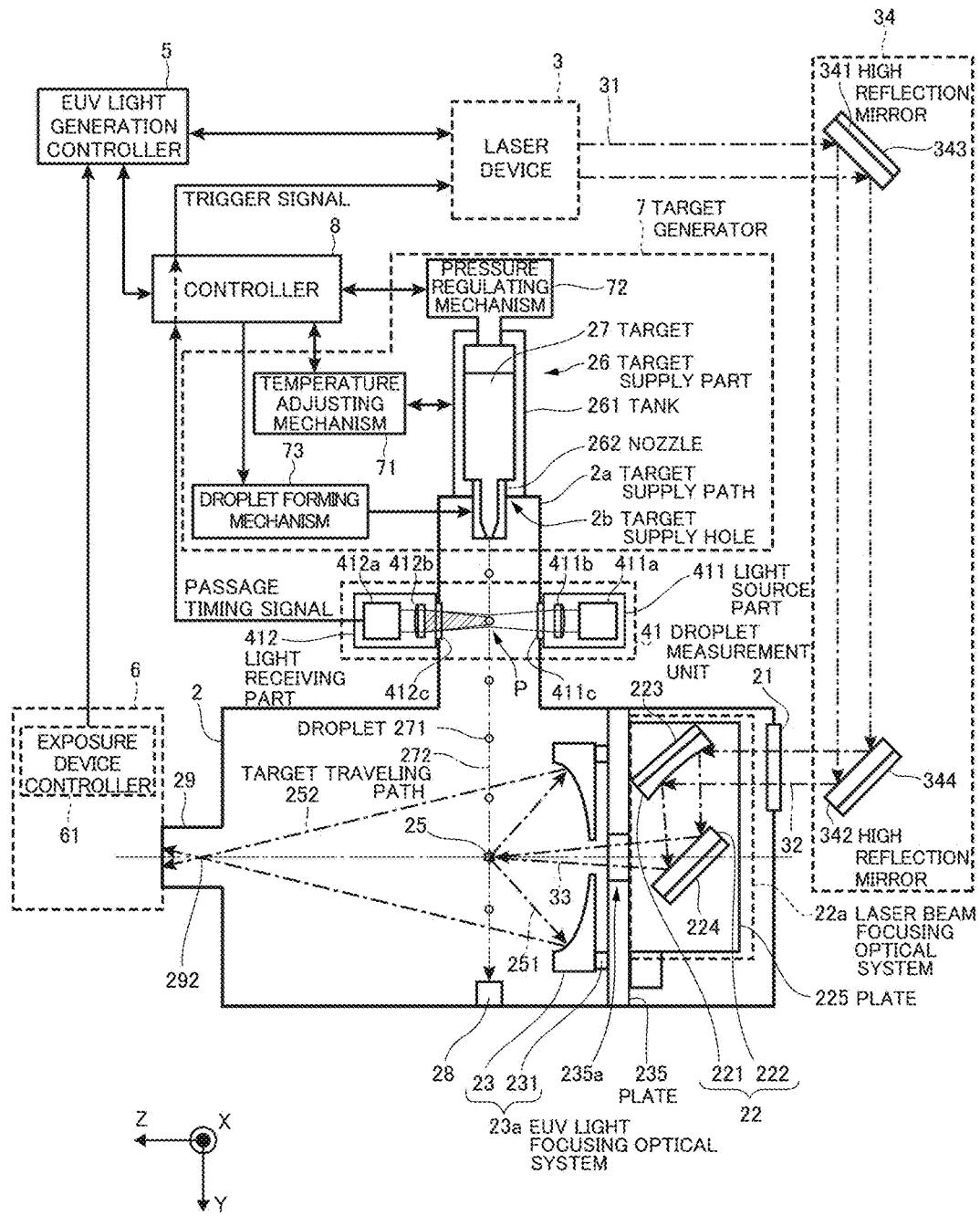
FIG. 2 is a drawing explaining the configuration of an EUV light generation apparatus including a droplet measurement unit.
Figure 3:
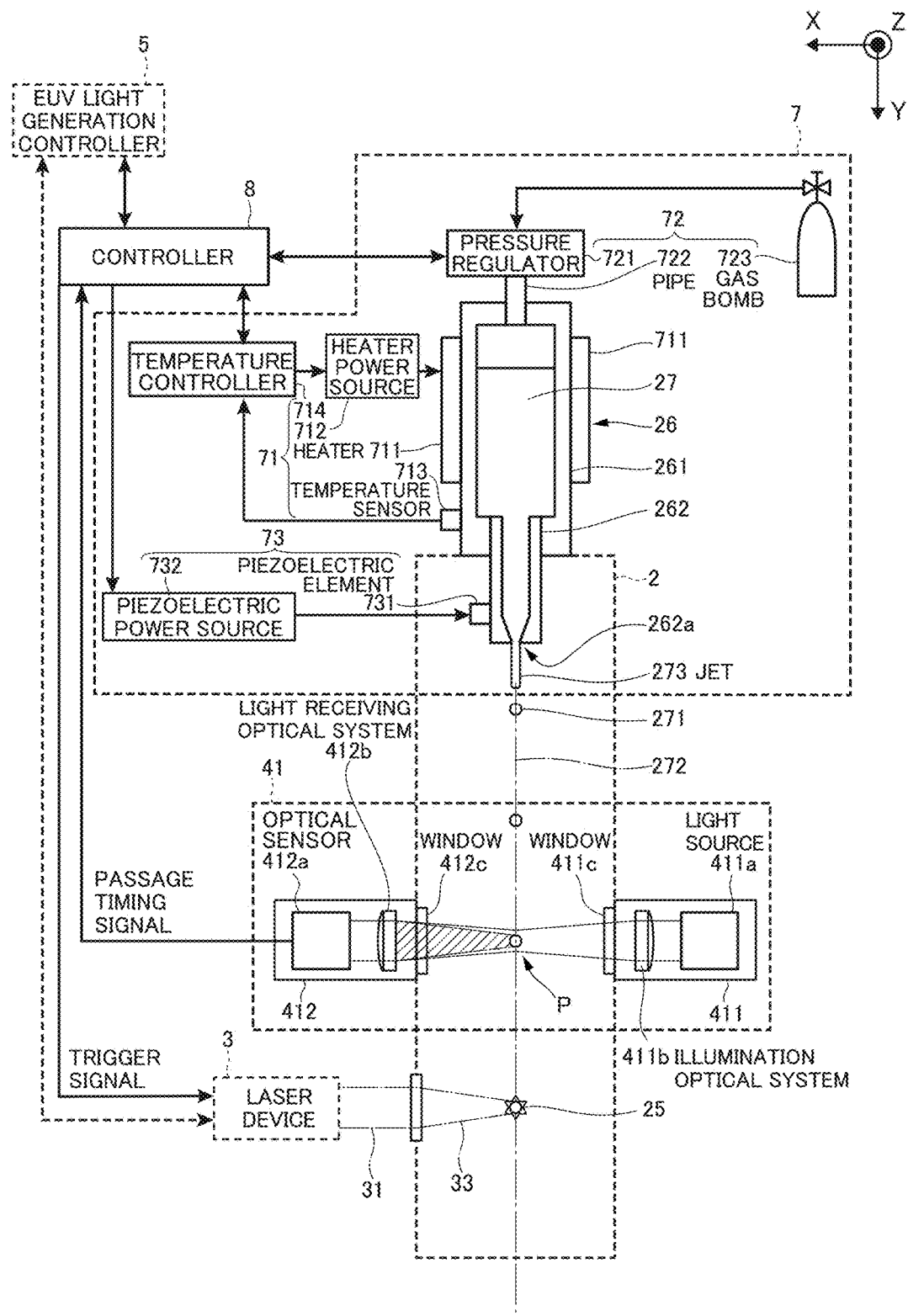
FIG. 3 is a drawing explaining the configuration of an output trigger control system of the EUV light generation apparatus.

4. EUV Light Generation Apparatus Including a Droplet Measurement Unit 4.1 Configuration Now, with reference to FIGS. 2 to 4, the configuration of the EUV light generation apparatus 1 including the droplet measurement unit 41 will be described. FIG. 2 is a drawing explaining the configuration of the EUV light generation apparatus 1 including the droplet measurement unit 41. FIG. 3 is a drawing explaining the configuration of an output trigger control system of the EUV light generation apparatus 1. In FIG. 2, the direction in which the EUV light 252 is outputted from the chamber 2 of the EUV light generation apparatus 1 to the exposure device 6 is defined as a Z-axis direction. The X-axis direction and the Y-axis direction are orthogonal to the Z-axis direction and are orthogonal to one another. The same applies to the subsequent drawings.

The chamber 2 of the EUV light generation apparatus 1 may be formed in, for example, a hollow spherical shape or a hollow cylindrical shape. The direction of the central axis of the cylindrical chamber 2 may be approximately the same as the direction in which the EUV light 252 is outputted to the exposure device 6.

A target supply path 2a may be formed on the side surface of the cylindrical chamber 2, for supplying the target 27 into the chamber 2 from the outside of the chamber 2. The target supply path 2a may be formed in a cylindrical shape. A target supply hole 2b may be formed in the leading end of the target supply path 2a. The direction of the central axis of the cylindrical target supply path 2a may be approximately orthogonal to the direction in which the EUV light 252 is outputted to the exposure device 6. If the chamber 2 is formed in a hollow spherical shape, the target supply path 2a may be formed on the wall surface of the chamber 2 at a position in which the window 21 and the connection part 29 are not provided.

In the chamber 2, a laser beam focusing optical system 22a, an EUV light focusing optical system 23a, the target collector 28, a plate 225 and a plate 235 may be provided. Meanwhile, the laser beam direction control unit 34, the EUV light generation controller 5, the target generator 7, the droplet measurement unit 41, and the controller 8 may be provided outside the chamber 2. Here, the target generator 7, the droplet measurement unit 41, and the controller 8 may constitute the output trigger control system of the EUV light generation apparatus 1. The output trigger control system may control the timing of the laser output of the laser device 3 in order to irradiate the droplet 271 outputted into the chamber 2 with the pulsed laser beam 33 at an appropriate timing.

The plate 235 may be fixed to the inner surface of the chamber 2. A hole 235a that allows the pulsed laser beam 33 to pass therethrough may be formed at the center of the plate 235 in the thickness direction of the plate 235. The opening direction of the hole 235a may be approximately the same as the direction of the axis passing through the through-hole 24 and the plasma generation region 25 shown in FIG. 1. The EUV light focusing optical system 23a may be provided on one surface of the plate 235. Meanwhile, on the other surface of the plate 235, the plate 225 may be provided.

The EUV light focusing optical system 23a provided on the one surface of the plate 235 may include the EUV collector mirror 23 and a holder 231. The holder 231 may hold the EUV collector mirror 23. The holder 231 holding the EUV collector mirror 23 may be fixed to the plate 235.

The plate 225 provided on the other surface of the plate 235 may be changed in its position and posture by a triaxial stage (not shown). The triaxial stage may include an actuator for moving the plate 225 in three axial directions of the X-axis direction, the Y-axis direction, and the Z-axis direction. The actuator of the triaxial stage may move the plate 225 according to the control of the EUV light generation controller 5. By this means, the position and the posture of the plate 225 may be changed. The laser beam focusing optical system 22a may be provided on the plate 225.

The laser beam focusing optical system 22a may include the laser beam collector mirror 22, a holder 223 and a holder 224. The laser beam collector mirror 22 may include an off-axis paraboloidal mirror 221 and a plane mirror 222.

The holder 223 may hold the off-axis paraboloidal mirror 221. The holder 223 holding the off-axis paraboloidal mirror 221 may be fixed to the plate 225. The holder 224 may hold the plane mirror 222. The holder 224 holding the plane mirror 222 may be fixed to the plate 225.

The off-axis paraboloidal mirror 221 may be placed to face each of the window 21 provided on the bottom portion of the chamber 2 and the plane mirror 222. The plane mirror 222 may be placed to face each of the hole 235a and the off-axis paraboloidal mirror 221. The positions and postures of the off-axis paraboloidal mirror 221 and the plane mirror 222 may be adjusted by changing the position and the posture of the plate 225 by the EUV light generation controller 5 via the triaxial stage. This adjustment may be performed such that the pulsed laser beam 33, which is a reflected beam of the pulsed laser beam 32 having entered the off-axis paraboloidal mirror 221 and the plane mirror 222, is focused on the plasma generation region 25.

The target collector 28 may be disposed on the extension of the traveling direction of the droplet 271 outputted into the chamber 2.

The laser beam direction control unit 34 may be provided between the window 21 formed on the bottom portion of the chamber 2 and the laser device 3. The laser beam direction control unit 34 may include a high reflection mirror 341, a high reflection mirror 342, a holder 343 and a holder 344.

The holder 343 may hold the high reflection mirror 341. The holder 344 may hold the high reflection mirror 342. The positions and postures of the holders 343 and 344 may be changed by an actuator (not shown) connected to the EUV light generation controller 5.

The high reflection mirror 341 may be placed to face each of the exit aperture of the laser device 3 from which the pulsed laser beam 31 exits, and the high reflection mirror 342. The high reflection mirror 342 may be placed to face each of the window 21 of the chamber 2 and the high reflection mirror 341. The positions and postures of the high reflection mirrors 341 and 342 may be adjusted by changing the positions and postures of the holders 343 and 344, respectively, according to the control of the EUV light generation controller 5. This adjustment may be performed such that the pulsed laser beam 32, which is the reflected beam of the pulsed laser beam 31 having entered the high reflection mirrors 341 and 342, transmits through the window 21 formed on the bottom portion of the chamber 2.

The EUV light generation controller 5 may send/receive various signals to/from an exposure device controller 61 provided in the exposure device 6. For example, the exposure device controller 61 may send, to the EUV light generation controller 5, signals related to a targeted pulse energy and a targeted output timing of the EUV light 252 outputted to the exposure device 6. The EUV light generation controller 5 may totally control the operation of each of the components of the EUV light generation system 11, based on the various signals sent from the exposure device 6.

The EUV light generation controller 5 may send/receive control signals to/from the laser device 3. By this means, the EUV light generation controller 5 may control the operation of the laser device 3. The EUV light generation controller 5 may send/receive the control signals to/from the respective actuators for the laser beam direction control unit 34 and the laser beam focusing optical system 22a. By this means, the EUV light generation controller 5 may adjust the traveling directions and the focusing positions of the pulsed laser beams 31 to 33. The EUV light generation controller 5 may send/receive control signals to/from the controller 8. By this means, the EUV light generation controller 5 may indirectly control the operations of a temperature adjusting mechanism 71, a pressure regulating mechanism 72, a droplet forming mechanism 73, and the droplet measurement unit 41. Here, a hardware configuration of the EUV light generation controller 5 will be described later with reference to FIG. 30.

The target generator 7 may be configured to generate the target 27 to be supplied into the chamber 2, and to supply the target 27 to the plasma generation region 25 in the chamber 2 as the droplet 271. The target generator 7 may be provided on the end of the target supply path 2a of the chamber 2. The target generator 7 may include the target supply part 26, the temperature adjusting mechanism 71, the pressure regulating mechanism 72, and the droplet forming mechanism 73.

The target supply part 26 may include a tank 261 and a nozzle 262. The tank 261 may be formed in a hollow cylindrical shape. The hollow tank 261 may accommodate the target 27. At least part of the tank 261 accommodating the target 27, which contacts the target 27, may be made of a material which is not easy to react with the target 27. The material which is not easy to react with the target 27 may be any of, for example, silicon carbide (SiC), silicon oxide ($SiO_2$), aluminum oxide ($Al_2O_3$), molybdenum, tungsten and tantalum.

The nozzle 262 may be provided on the bottom portion of the cylindrical tank 261. The nozzle 262 may be placed in the interior of the chamber 2 via the target supply hole 2b of the chamber 2. The target supply hole 2b may be closed by providing the target supply part 26. By this means, it is possible to isolate the interior of the chamber 2 from the atmosphere. At least a surface of the nozzle 262 in contact with the target 27 may be made of a material which is not easy to react with the target 27. One end of the pipe-like nozzle 262 may be fixed to the hollow tank 261. As shown in FIG. 3, a nozzle hole 262a may be formed in the other end of the pipe-like nozzle 262. The tank 261 provided in the one end side of the nozzle 262 may be located outside the chamber 2. Meanwhile, the nozzle hole 262a provided on the other end side of the nozzle 262 may be located inside the chamber 2. The plasma generation region 25 located inside the chamber 2 may be positioned on the extension of the central axis of the nozzle 262. The interiors of the tank 261, the nozzle 262, the target supply path 2a, and the chamber 2 may communicate with each other. The nozzle hole 262a may be formed in a shape that allows the molten target 27 to be jetted into the chamber 2.

The temperature adjusting mechanism 71 may adjust the temperature of the tank 261. As shown in FIG. 3, the temperature adjusting mechanism 71 may include a heater 711, a heater power source 712, a temperature sensor 713, and a temperature controller 714.

The heater 711 may heat the tank 261. The heater 711 may be fixed to the outer side surface of the cylindrical tank 261. The heater 711 may be connected to the heater power source 712. The heater 711 may heat the tank 261 by the electric power supplied from the heater power source 712.

The heater power source 712 may be connected to the temperature controller 714. The heater power source 712 may supply electric power to the heater 711 according to the control of the temperature controller 714.

The temperature sensor 713 may be fixed to the outer side surface of the cylindrical tank 261 in the vicinity of the nozzle 262. The temperature sensor 713 may be connected to the temperature controller 714. The temperature sensor 713 may detect the temperature of the tank 261 and output a detection signal to the temperature controller 714.

The temperature controller 714 may control the electric power supplied from the heater power source 712 to the heater 711. The temperature controller 714 may be connected to the controller 8. The temperature controller 714 may output, to the controller 8, a detection signal indicating the temperature of the tank 261 outputted from the temperature sensor 713. A control signal related to a targeted temperature of the tank 261 and outputted from the controller 8 may be inputted to the temperature controller 714. The temperature controller 714 may control the electric power supplied to the heater 711, based on the inputted control signal. By this means, the temperature in the tank 261 may be adjusted to the targeted temperature. Here, a hardware configuration of the temperature controller 714 will be described later with reference to FIG. 30.

The pressure regulating mechanism 72 may regulate the pressure in the tank 261. As shown in FIG. 3, the pressure regulating mechanism 72 may include a pressure regulator 721, a pipe 722, and a gas bomb 723.

The pipe 722 may connect the bottom portion of the cylindrical tank 261 on the opposite side of the nozzle 262 to the pressure regulator 721. The pipe 722 allows the target supply part 26 including the tank 261 and the pressure regulator 721 to communicate with one another. The pipe 722 may be covered with a heat insulating material (not shown). A heater (not shown) may be provided on the pipe 722. The temperature in the pipe 722 may be maintained at the same temperature as the temperature in the tank 261 of the target supply part 26.

The gas bomb 723 may be filled with inert gas such as helium, argon and so forth. The gas bomb 723 may supply the inert gas into the tank 261 via the pressure regulator 721.

The pressure regulator 721 may be provided on the bottom portion of the cylindrical tank 261 on the opposite side of the nozzle 262 via the pipe 722, as described above. The pressure regulator 721 may include solenoid valves for air supply and exhaust, a pressure sensor and so forth. The pressure regulator 721 may detect the pressure in the tank 261 by using the pressure sensor. The pressure regulator 721 may be connected to the gas bomb 723. The pressure regulator 721 may supply the inert gas filled in the gas bomb 723 to the tank 261. The pressure regulator 721 may be connected to an exhaust pump (not shown) The pressure regulator 721 may activate the exhaust pump to discharge the gas from the tank 261. The pressure regulator 721 may increase or decrease the pressure in the tank 261 by supplying/discharging the gas into/out of the tank 261.

The pressure regulator 721 may be connected to the controller 8. The pressure regulator 721 may output a detection signal indicating the pressure in the tank 261 to the controller 8. A control signal related to the targeted pressure of the tank 261 and outputted from the controller 8 may be inputted to the pressure regulator 721. The pressure regulator 721 may supply/discharge the gas into/out of the tank 261, based on the inputted control signal. By this means, it is possible to regulate the pressure in the tank 261 at the targeted pressure.

The droplet forming mechanism 73 may form the droplet 271 by, for example, the continuous jet method. To be more specific, the droplet forming mechanism 73 may form the droplet 271 by periodically dividing jet 273 which is a stream of the target 27 jetted from the nozzle 262. As shown in FIG. 3, the droplet forming mechanism 73 may include a piezoelectric element 731 and a piezoelectric power source 732.

The piezoelectric element 731 may be fixed to the outer side surface of the pipe-like nozzle 262. The piezoelectric element 731 may cause a vibration of the nozzle 262. The piezoelectric element 731 may be connected to the piezoelectric power source 732.

The piezoelectric power source 732 may supply electric power to the piezoelectric element 731. The piezoelectric power source 732 may be connected to the controller 8. The controller 8 may output a control signal to supply the electric power with a predetermined waveform to the piezoelectric power source 732. The piezoelectric power source 732 may supply electric power to the piezoelectric element 731, based on the inputted control signal. The piezoelectric element 731 may cause a vibration of the nozzle 262 with a predetermined waveform, based on the electric power supply from the piezoelectric power source 732. By this means, the jet 273 from the nozzle 262 may have a stationary wave, and therefore be divided at intervals. The divided jet 273 may form a free interface by means of its own surface tension to form the droplet 271. As a result, the droplet 271 may be generated at a predetermined "generation frequency" and outputted into the chamber 2. Here, the generation frequency may mean the number of the droplets 271 generated per unit time.

The droplet measurement unit 41 may measure the droplet 271 outputted into the chamber 2. To be more specific, the droplet measurement unit 41 may measure the timing at which the droplet 271 is passing through a predetermined position P in the chamber 2. Alternatively, the droplet measurement unit 41 may measure the trajectory of the droplet 271 traveling in the chamber 2, or the diameter and the velocity of the droplet 271. The droplet measurement unit 41 shown in FIGS. 2 and 3 may measure the timing at which the droplet 271 outputted into the chamber 2 is passing through the predetermined position P. The droplet measurement unit 41 may be provided at the predetermined position P on the side surface of the target supply path 2a, as shown in FIG. 2. The droplet measurement unit 41 may be located between the target supply part 26 and the plasma generation region 25.

As shown in FIG. 3, the droplet measurement unit 41 may include a light source part 411 and a light receiving part 412. The light source part 411 and the light receiving part 412 may be disposed to face one another via a target traveling path 272 through which the target 27 outputted into the chamber 2 travels. The direction in which the light source part 411 and the light receiving part 412 face one another may be approximately orthogonal to the target traveling path 272.

Note that although FIG. 2 shows an arrangement where the light source part 411 and the light receiving part 412 face one another in the Z-axis direction for the sake of convenience, the direction in which the light source part 411 and the light receiving part 412 face one another is not limited to that. The light source part 411 and the light receiving part 412 may face one another in the X-axis direction as shown in FIG. 3, or in a direction inclined to the X-Z plane.

The light source part 411 may irradiate the droplet 271 traveling on the target traveling path 272 with continuous light. The continuous light with which the droplet 271 is irradiated may be a continuous laser beam. The light source part 411 may include a light source 411a, an illumination optical system 411b, and a window 411c.

The light source 411a may be, for example, a CW (continuous wave) laser outputting unit that emits a continuous laser beam.

The illumination optical system 411b may be an optical system including a lens and so forth. This lens may be, for example, a cylindrical lens. The illumination optical system 411b may focus the continuous laser beam emitted from the light source 411a on the predetermined position P on the target traveling path 272, via the window 411c. The size of the continuous laser beam focused on the predetermined position P may be sufficiently greater than the diameter (e.g., 20 μm) of the droplet 271.

The light receiving part 412 may receive the continuous laser beam emitted from the light source part 411 and detect the optical intensity of the continuous laser beam. The light receiving part 412 may include the optical sensor 412a, a light receiving optical system 412b, and the window 412c.

The light receiving optical system 412b may be an optical system such as a collimator, or be formed by an optical element such as a lens. The light receiving optical system 412b may guide the continuous laser beam emitted from the light source part 411, to the optical sensor 412a via the window 412c.

The optical sensor 412a may be a light receiving element including a photodiode. The optical sensor 412a may detect the optical intensity of the continuous laser beam guided by the light receiving optical system 412b. The optical sensor 412a may be connected to the controller 8. The optical sensor 412a may output a detection signal, indicating the detected optical intensity, to the controller 8.

With the above-described configuration, the light source part 411 may emit the continuous laser beam to the predetermined position P on the target traveling path 272. Upon passing through the predetermined position P, the droplet 271 traveling on the target traveling path 272 may be irradiated with the continuous laser beam emitted from the light source part 411. The light receiving part 412 may detect the light intensity of the continuous laser beam emitted from the light source part 411. When the droplet 271 is passing through the predetermined position P in the chamber 2, the continuous laser beam emitted from the light source part 411 may be blocked by the droplet 271, and therefore the light receiving part 412 may detect the shadow of the droplet 271. Then, the optical intensity of the continuous laser beam detected by the light receiving part 41 when the continuous laser beam is blocked by the droplet 271 may be significantly lower than when the droplet 271 is not passing through the predetermined position P. The light receiving part 412 may generate a detection signal according to a change in the optical intensity, and output the detection signal to the controller 8. By this means, the droplet measurement unit 41 can measure the timing at which the droplet 271 outputted into the chamber 2 is passing through the predetermined position P. Here, the detection signal according to a change in the optical intensity, which is generated by the light receiving part 412, may be referred to as "passage timing signal."

The controller 8 may send/receive control signals to/from the EUV light generation controller 5. The controller 8 may control the operations of the temperature adjusting mechanism 71, the pressure regulating mechanism 72, the droplet forming mechanism 73, and the droplet measurement unit 41, based on the control signals from the EUV light generation controller 5. The controller 8 may output a control signal to the temperature controller 714 to control the operation of the temperature adjusting mechanism 71 including the temperature controller 714. The controller 8 may output a control signal to the pressure regulator 721 to control the operation of the pressure regulating mechanism 72 including the pressure regulator 721. The controller 8 may output a control signal to the piezoelectric power source 732 to control the operation of the droplet forming mechanism 73.

Figure 4:
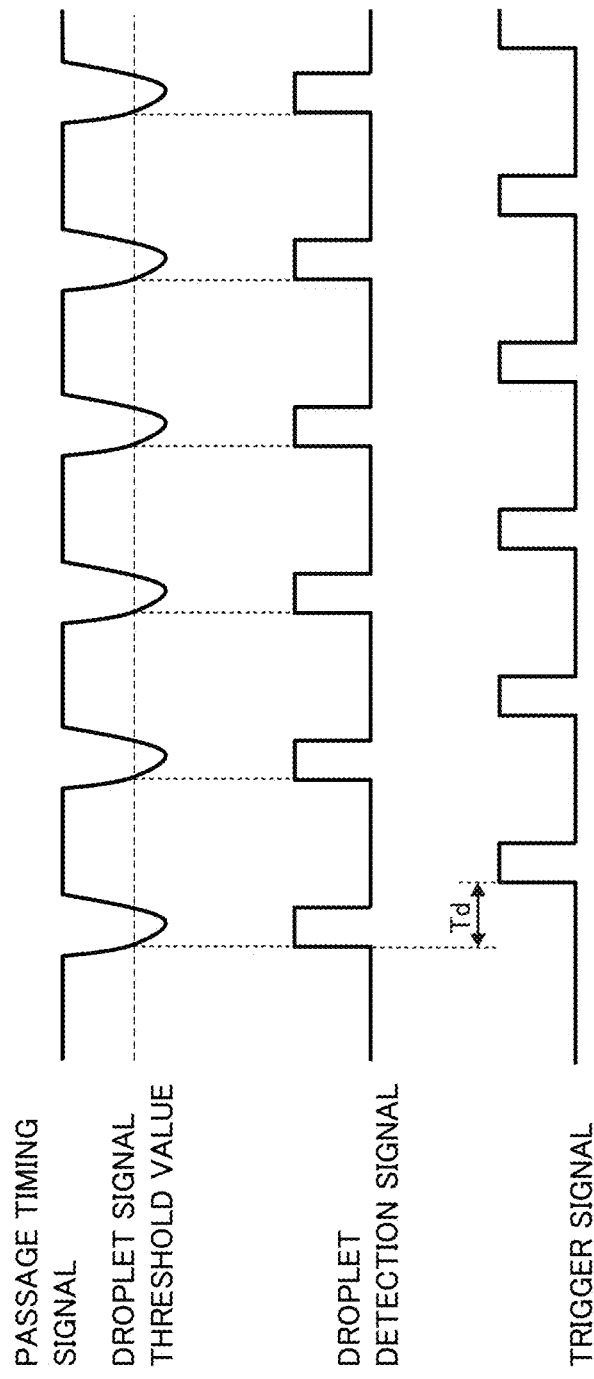
FIG. 4 is a drawing explaining the output timing of a laser device, which is controlled by a controller.

Moreover, the controller 8 may control the timing of the laser output of the laser device 3. FIG. 4 is a drawing explaining the output timing of the laser device 3, which is controlled by the controller 8.

The passage timing signal outputted from the droplet measurement unit 41 may be inputted to the controller 8. As described above, the optical intensity of the passage timing signal inputted to the controller 8 when the droplet 271 is passing through the predetermined position P may be lower than the optical intensity of the passage timing signal inputted to the controller 8 when the droplet 271 is not passing through the predetermined position P. When the optical intensity of the inputted passage timing signal indicates a lower value than "a threshold value for generating a droplet detection signal" (hereinafter referred to as "droplet signal threshold value"), the controller 8 may determine that the droplet 271 has passed through the predetermined position P. As a result, the controller 8 may generate a "droplet detection signal" indicating that the droplet 271 passing through the predetermined position P is detected. Here, the droplet signal threshold value may be a predetermined threshold value based on a range within which the optical intensity of the passage timing signal can fall when the droplet 271 is passing through the predetermined position P. The droplet detection signal may be a signal indicating that the droplet 271 passing through the predetermined position P is detected.

The controller 8 may output a "trigger signal" to the laser device 3 at the timing that is delayed by "delay time Td" from the timing at which the droplet detection signal is generated. The trigger signal may be a signal that triggers the laser device 3 to output the pulsed laser beam 31. The delay time Td may be defined to synchronize the timing at which the pulsed laser beam 33 is focused on the plasma generation region 25 with the timing at which the droplet 271 reaches the plasma generation region 25.

With the above-described configuration, the controller 8 can output the trigger signal to the laser device 3 in synchronization with the change in the optical intensity of the inputted passage timing signal to control the timing at which the laser device 3 outputs a laser beam. The controller 8 can control the timing at which the laser device 3 outputs a laser beam such that the pulsed laser beam 33 is focused on the plasma generation region 25 at the timing at which the droplet 271 having passed through the predetermined position P reaches the plasma generation region 25. By this means, when the droplet 271 outputted into the chamber 2 reaches the plasma generation region 25, the droplet 271 may be irradiated with the pulsed laser beam 33. Here, the hardware configuration of the controller 8 will be described later with reference to FIG. 30.

4.2 Operation

Now, the outline of the operation of the EUV light generation apparatus 1 including the droplet measurement unit 41 will be described. The controller 8 may determine whether or not the target generation signal has been inputted from the EUV light generation controller 5. The target generation signal may be a control signal to cause the target generator 7 to supply the target 27 to the plasma generation region 25 in the chamber 2. Upon receiving the target generation signal, the controller 8 may perform the following process until a target generation stop signal is inputted from the EUV light generation controller 5. The target generation stop signal may be a control signal to cause the target generator 7 to stop supplying the target 27 to the plasma generation region 25.

The controller 8 may output a control signal related to a targeted temperature to the temperature controller 714, and set a targeted temperature value in the temperature controller 714. The targeted temperature value may be a set value to make the temperature of the target 27 in the tank 261 be equal to or higher than the melting point of the target 27. The targeted temperature value may be, for example, equal to or higher than 232 degrees Celsius and lower than 300 degrees Celsius, or equal to or higher than 250 degrees Celsius and equal to or lower than 290 degrees Celsius. The temperature controller 714 may control the heating of the tank 261 via the heater power source 712 and the heater 711 such that the temperature of the tank 261 becomes the set targeted temperature value. Here, the controller 8 may continuously control the heating of the tank 261 to maintain the temperature in the tank 261 within a predetermined range of values equal to or higher than the melting point of the target 27.

The controller 8 may output a control signal related to a targeted pressure to the pressure regulator 721, and set a targeted pressure value in the pressure regulator 721. The targeted pressure value may be a set value of the pressure in the tank 261 to output the jet 273 from the nozzle hole 262a at a predetermined velocity. The predetermined velocity may be, for example, 60 m/s to 100 m/s. The pressure regulator 721 may control the supply/discharge of the gas to/from the tank 261 to make the pressure in the tank 261 be the set targeted pressure value.

The controller 8 may output a control signal to supply electric power with a predetermined waveform, to the piezoelectric power source 732. This predetermined waveform may allow the droplets 271 to be generated at a predetermined generation frequency. The predetermined generation frequency may be, for example, 50 kHz to 100 kHz. The piezoelectric power source 732 may supply electric power with a predetermined waveform to the piezoelectric element 731. The piezoelectric element 731 may cause a vibration of the nozzle 262 with the predetermined waveform, in response to the power supply from the piezoelectric power source 732. By this means, the jet 273 from the nozzle 262 may have a stationary wave, and therefore be periodically divided. As a result, the droplets 271 can be generated at a predetermined generation frequency, and outputted into the chamber 2.

The droplet 271 having been outputted into the chamber 2 may travel on the target traveling path 272, and pass through the predetermined position P. The droplet measurement unit 41 may output the passage timing signal indicating a decrease in the optical intensity to the controller 8 at the timing at which the droplet 271 is passing through the predetermined position P.

The controller 8 may generate the droplet detection signal when the optical intensity of the inputted passage timing signal is lower than the droplet signal threshold value. The controller 8 may output the trigger signal to the laser device 3 at a timing that is delayed by the delay time Td from the timing at which the droplet detection signal is generated.

Upon receiving the trigger signal, the laser device 3 may output the pulsed laser beam 31. The pulsed laser beam 31 outputted from the laser device 3 may be introduced into the chamber 2 via the laser beam direction control unit 34, as the pulsed laser beam 32. The pulsed laser beam 32 introduced into the chamber 2 may be focused by the laser beam focusing optical system 22a, and guided to the plasma generation region 25 as the pulsed laser beam 33. The pulsed laser beam 33 may be guided to the plasma generation region 25 in synchronization with the timing at which the droplet 271 reaches the plasma generation region 25. The droplet 271 reaching the plasma generation region may be irradiated with the pulsed laser beam 33 guided to the plasma generation region 25. The droplet 271 irradiated with the pulsed laser beam 33 may be turned into plasma, and it is possible to generate the EUV light 251 from the plasma.

4.3 Problem

Figure 5:
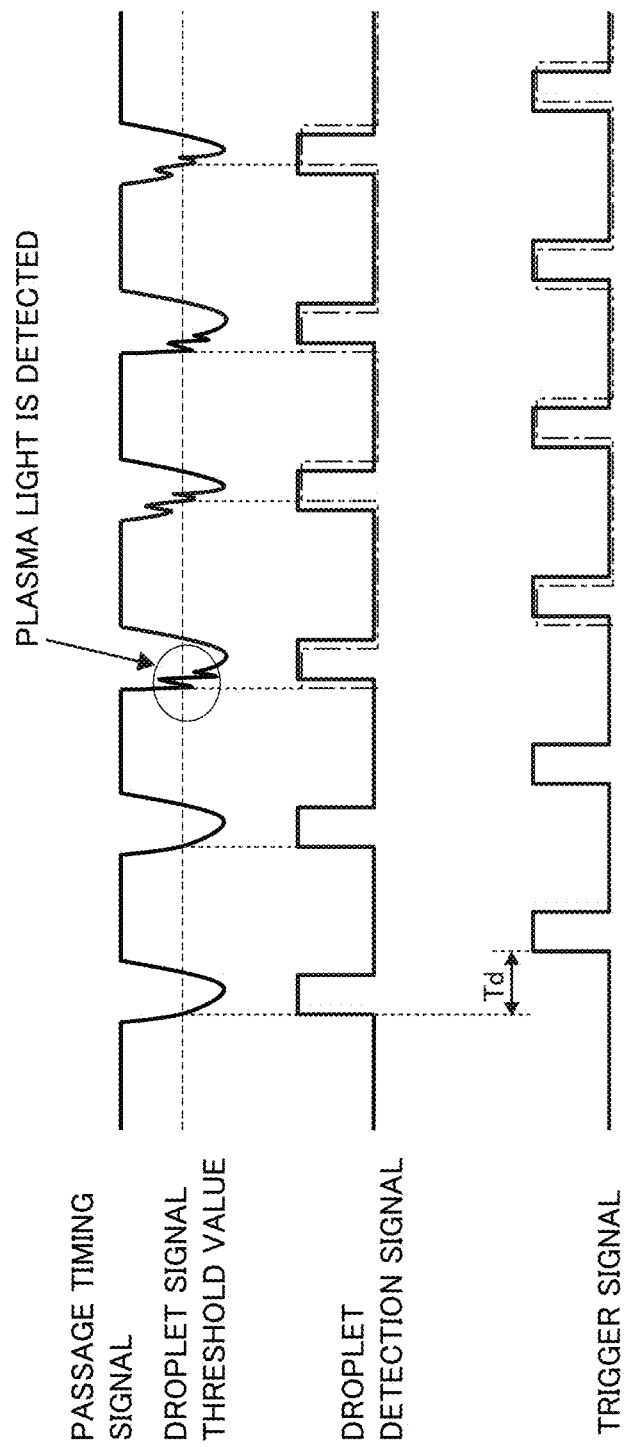
FIG. 5 is a drawing explaining the effect of light of electromagnetic waves emitted from plasma at the output timings of the laser device controlled by the controller.

The controller 8 of the EUV light generation apparatus 1 can output the trigger signal to the laser device 3 in synchronization with the change in the optical intensity of the passage timing signal outputted from the droplet measurement unit 41, thereby to control the output timing of the laser device 3. By this means, it is possible to irradiate the droplet 271 reaching the plasma generation region 25 with the pulsed laser beam 33, and therefore to generate plasma. The generated plasma may emit electromagnetic waves. The electromagnetic waves emitted from the plasma may include, for example, visible light as well as the EUV light 251, and other electromagnetic waves which have various wavelengths. In this case, the light of the electromagnetic waves emitted from the plasma may enter the droplet measurement unit 41. Then, the light of the electromagnetic waves may be detected by the droplet measurement unit 41 by mistake, and this may cause noise of the passage timing signal outputted from the droplet measurement unit 41, as shown in FIG. 5. Then, the controller 8 of the EUV light generation apparatus 1 may generate the droplet detection signal based on the passage timing signal containing the noise, and generate the trigger signal, as shown in FIG. 5. Therefore, the timing at which the trigger signal is outputted from the controller 8 to the laser device 3 may have an error. Accordingly, the timing at which the droplet 271 reaches the plasma generation region may not match the timing at which the pulsed laser beam 33 is focused on the plasma generation region 25. As a result, the pulse energy of the EUV light 252 outputted from the EUV light generation apparatus 1 may be significantly different for each pulse. Therefore, there is a demand for technology of improving the energy stability of the EUV light 252 by reducing the effect of the light of the electromagnetic waves emitted from the plasma. Here, a dashed-dotted line shown in FIG. 5 schematically represents that the droplet detection signal and the trigger signal are generated at wrong timings due to the noise of the passage timing signal.

Figure 13:
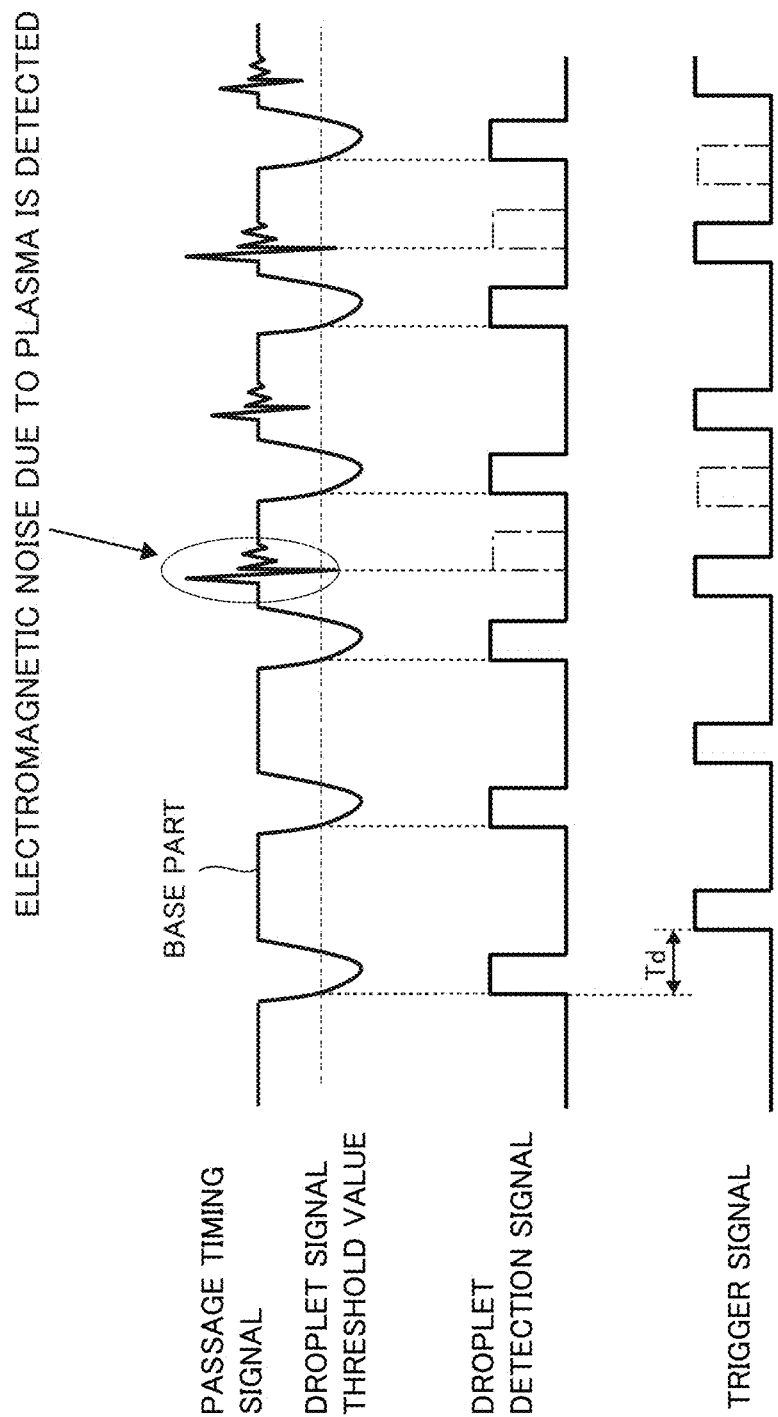
FIG. 13 is a drawing explaining the effect of noise of electromagnetic waves emitted from plasma at the output timings of the laser device controlled by the controller.

The electromagnetic waves emitted from the plasma may include electromagnetic waves having different wavelengths, as well as the visible light. Therefore, even though the light of the electromagnetic waves emitted from the plasma is prevented from entering the light receiving part 412, the light receiving part 412 may detect noise of the electromagnetic waves emitted from the plasma when the noise is high. In this case, as shown in FIG. 13, the noise of the electromagnetic waves may be superposed on the base part of the passage timing signal outputted from the droplet measurement unit 41. Then, as shown in FIG. 13, the controller 8 of the EUV light generation apparatus 1 may generate the droplet detection signal at a wrong timing, and generate the trigger signal even though the droplet 271 is not passing through the predetermined position P. Therefore, the trigger signal may be outputted from the controller 8 to the laser device 3 at a wrong timing. As a result, the laser device 3 repeats the laser output at undesired timings, and consequently the laser output may become unstable. Moreover, when the laser device 3 includes an amplifier, the laser output may become unstable due to a fluctuation in the amplification factor of the amplifier. As a result, the pulse energy of the EUV light 252 outputted from the EUV light generation apparatus 1 may be significantly different for each pulse. Therefore, there is a demand for technology of improving the energy stability of the EUV light 252 by suppressing the noise of the electromagnetic waves emitted from the plasma. Here, a dashed-dotted line shown in FIG. 13 schematically represents that the droplet detection signal and the trigger signal are generated at wrong timings due to the noise contained in the passage timing signal.

5. EUV Light Generation Apparatus According to Embodiment 1

Now, with reference to FIGS. 6 to 10, the EUV light generation apparatus 1 according to Embodiment 1 will be described. The EUV light generation apparatus 1 according to Embodiment 1 may have a configuration where the shielding member 9 is added to the EUV light generation apparatus 1 shown in FIGS. 2 and 3. The shielding member 9 may be configured to shield the droplet measurement unit 41 from the electromagnetic waves emitted from the plasma. The configuration of the EUV light generation apparatus 1 according to Embodiment 1, which is the same as that of the EUV light generation apparatus 1 shown in FIGS. 2 and 3, will not be described again here.

5.1 Configuration

Figure 6:
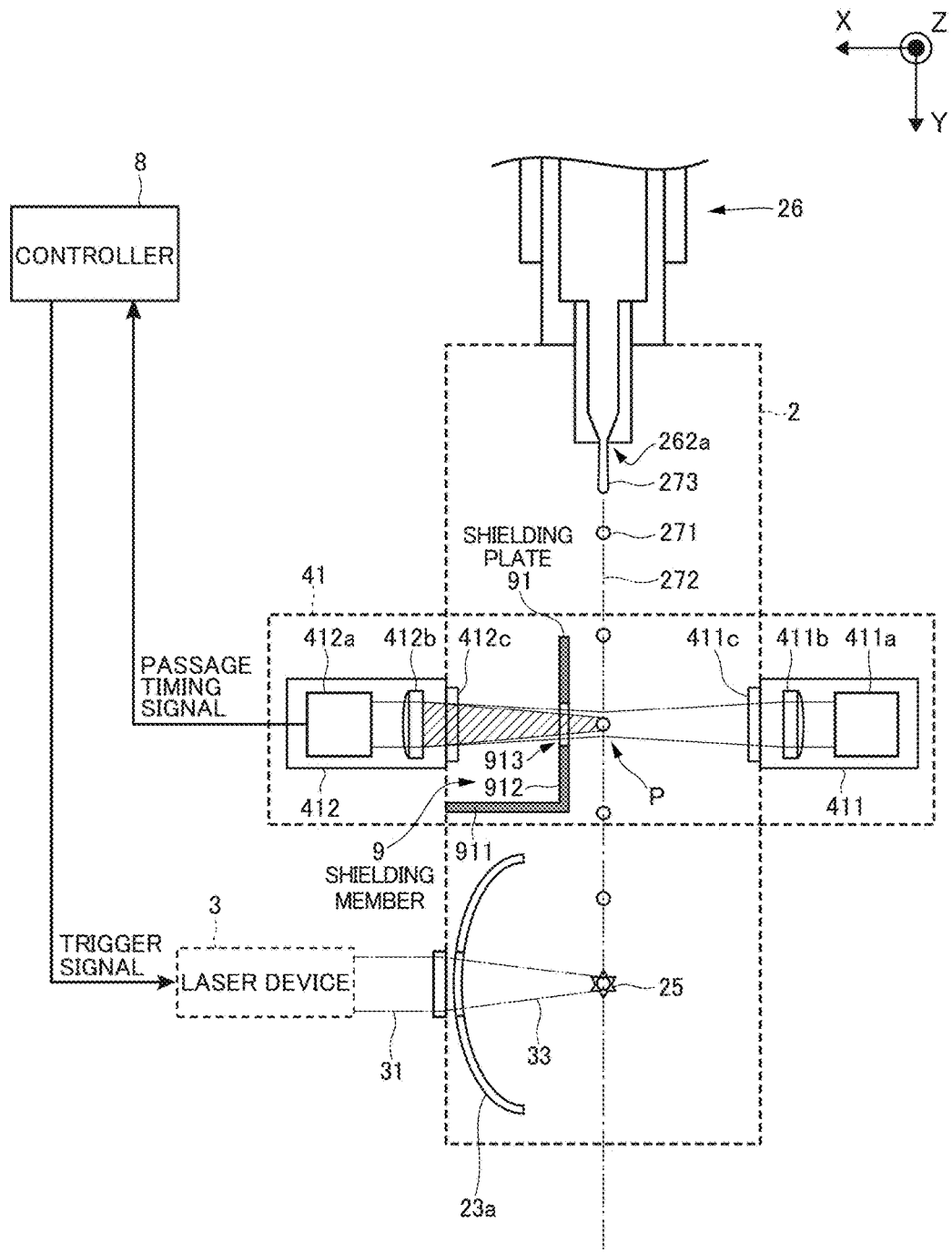
FIG. 6 is a drawing explaining the EUV light generation apparatus according to Embodiment 1.

FIG. 6 is a drawing explaining the EUV light generation apparatus 1 according to Embodiment 1. The shielding member 9 of the EUV light generation apparatus 1 according to Embodiment 1 may be constituted by a shielding plate 91.

The shielding plate 91 may prevent the light of the electromagnetic waves emitted from the plasma from entering the droplet measurement unit 41. The shielding plate 91 may be formed by using a material which does not allow the light of the electromagnetic waves emitted from the plasma to transmit therethrough. Preferably, the shielding plate 91 may be formed by using a metallic material. The shielding plate 91 may be disposed in the vicinity of the light receiving part 412 of the droplet measurement unit 41. The shielding plate 91 may have an approximately L-shaped cross section taken along a line along the target traveling path 272. The shielding plate 91 having the approximately L-shaped cross section may include a bottom surface part 911, a side surface part 912 and an opening 913.

The bottom surface part 911 may be disposed to face the plasma generation region 25 in which the plasma is generated.

The bottom surface part 911 may be formed to be approximately perpendicular to the target traveling path 272. The bottom surface part 911 may be formed to be approximately parallel to the direction in which the light source part 411 and the light receiving part 412 face one another. The bottom surface part 911 may be fixed to the wall of the chamber 2 near the position at which the light receiving part 412 is located. The bottom surface part 911 may be formed to extend from its base end corresponding to the wall of the chamber 2 closer to the plasma generation region 25 than the light receiving part 412, toward the target traveling path 272. The leading end of the bottom surface part 911 may be formed not to intersect with the target traveling path 272.

The side surface part 912 may be formed to be approximately parallel to the target traveling path 272. The side surface part 912 may be formed to be approximately perpendicular to the direction in which the light source part 411 and the light receiving part 412 face one another. The side surface part 912 may be located between the window 412c of the light receiving part 412 and the target traveling path 272. The side surface part 912 may be formed such that its leading end extends beyond the light receiving part 412 toward the target supply part 26, from its base end corresponding to the leading end of the bottom surface part 911. The leading end of the side surface part 912 may be located closer to the plasma generation region 25 than the nozzle hole 262a of the target supply part 26.

The opening 913 may be formed in the side surface part 912 at a position at which the optical path of the continuous laser beam emitted from the light source part 411 intersects with the side surface part 912. The size of the opening 913 may be sufficiently greater than the diameter of the continuous laser beam at the position at which the continuous laser beam intersects with the side surface part 912. The opening 913 may be formed in a size to prevent the light of the electromagnetic waves emitted from the plasma from entering the light receiving part 412. If the opening 913 is circular, the center of the opening 913 may be located on the axis of the optical path of the continuous laser beam emitted from the light source part 411.

Here, although not shown in FIG. 6, two plates which are similar to the side surface part 912 without the opening 913 and are approximately parallel to the plane of the drawing may be provided on end surfaces of the bottom surface part 911 approximately parallel to the plane of the drawing, respectively.

With the above-described configuration, the shielding plate 91 can prevent the light of the electromagnetic waves emitted from the plasma from entering the light receiving part 412 of the droplet measurement unit 41, without blocking the continuous laser beam emitted from the light source part 411. Therefore, the passage timing signal outputted from the droplet measurement unit 41 may not be likely to have noise. Therefore, the timing at which the trigger signal is outputted from the controller 8 to the laser device 3 may not be likely to have an error. Therefore, the timing at which the droplet 271 reaches the plasma generation region 25 can substantially match the timing at which the pulsed laser beam 33 is focused on the plasma generation region 25. As a result, the EUV light generation apparatus 1 according to Embodiment 1 can improve the energy stability of the outputted EUV light 252. Here, the other configuration of the EUV light generation apparatus 1 according to Embodiment 1 may be the same as the configuration of the EUV light generation apparatus 1 shown in FIGS. 2 and 3.

5.2 Modification 1

Figure 7:
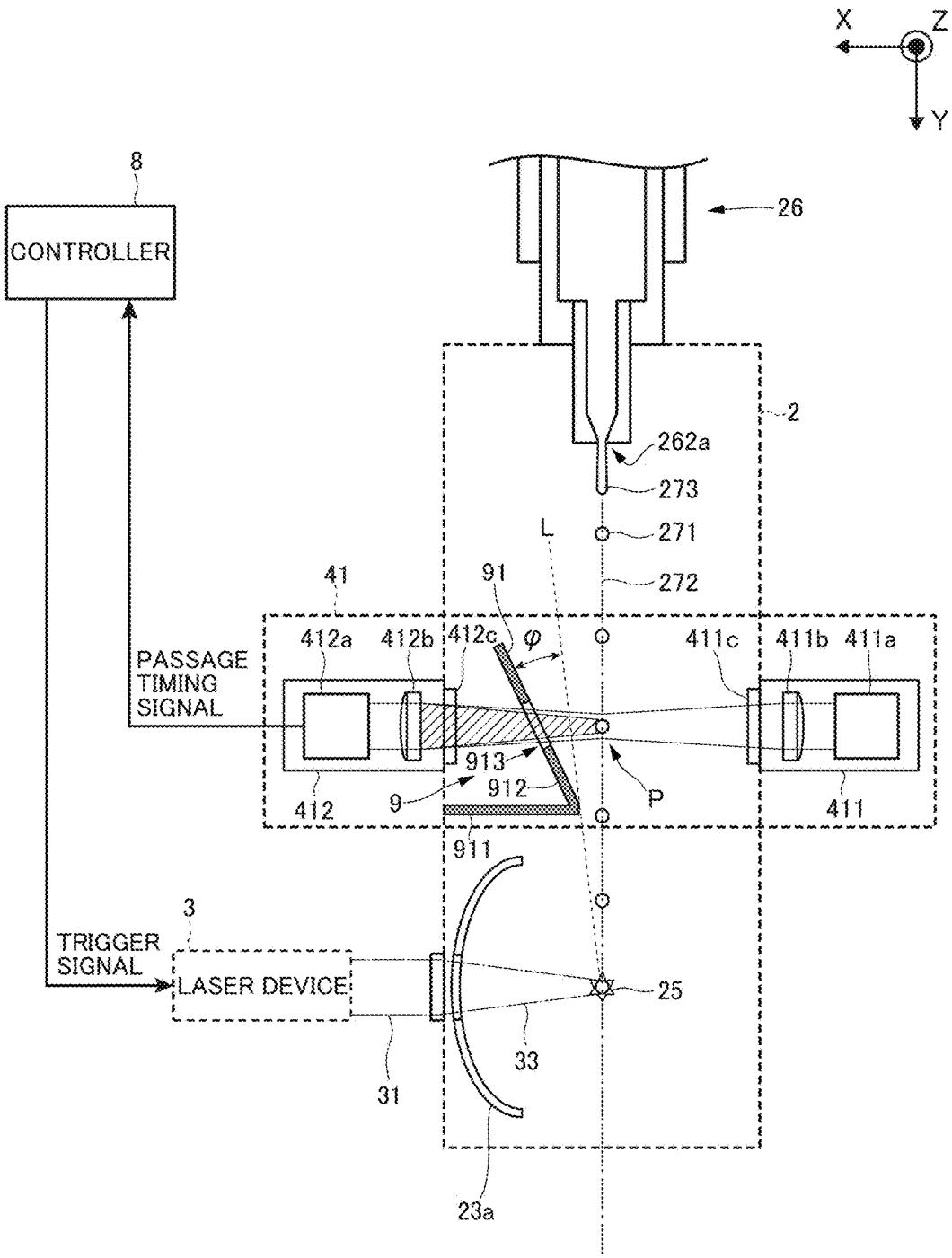
FIG. 7 is a drawing explaining the EUV light generation apparatus according to Modification 1 of Embodiment 1.

FIG. 7 is a drawing explaining the EUV light generation apparatus 1 according to Modification 1 of Embodiment 1. The EUV light generation apparatus 1 according to Modification 1 of Embodiment 1 may be different in the configuration of the shielding plate 91 from the EUV light generation apparatus 1 according to Embodiment 1 shown in FIG. 6. The configuration of the EUV light generation apparatus 1 according to Modification 1 of Embodiment 1, which is the same as that of the EUV light generation apparatus 1 according to Embodiment 1 shown in FIG. 6, will not be described again here.

The side surface part 912 of the shielding plate 91 shown in FIG. 7 may be inclined to the light receiving part 412, as compared to the side surface part 912 of the shielding plate 91 shown in FIG. 6. To be more specific, the side surface part 912 of the shielding plate 91 shown in FIG. 7 may be formed to be inclined to the light receiving part 412 by 4 degrees from a straight line L connecting between the plasma generation region and the leading end of the bottom surface part 911. The straight line L connecting between the plasma generation region and the leading end of the bottom surface part 911 may define a boundary of a range in which the light of the electromagnetic waves emitted from the plasma is directly blocked by the bottom surface part 911.

With the above-described configuration, the opening 913 of the shielding plate 91 shown in FIG. 7 can lie in the shadow of the light of the electromagnetic waves emitted from the plasma. Therefore, the shielding plate 91 shown in FIG. 7 can more effectively prevent the light of the electromagnetic magnetic waves emitted from the plasma from entering the light receiving part 412 of the droplet measurement unit 41 than the shielding plate 91 shown in FIG. 6. As a result, the EUV light generation apparatus 1 according to Modification 1 of Embodiment 1 can further improve the energy stability of the outputted EUV light 252. Here, the other configuration of the EUV light generation apparatus 1 according to Modification 1 of Embodiment 1 may be the same as the configuration of the EUV light generation apparatus 1 according to Embodiment 1 shown in FIG. 6.

5.3 Modification 2

Figure 8:
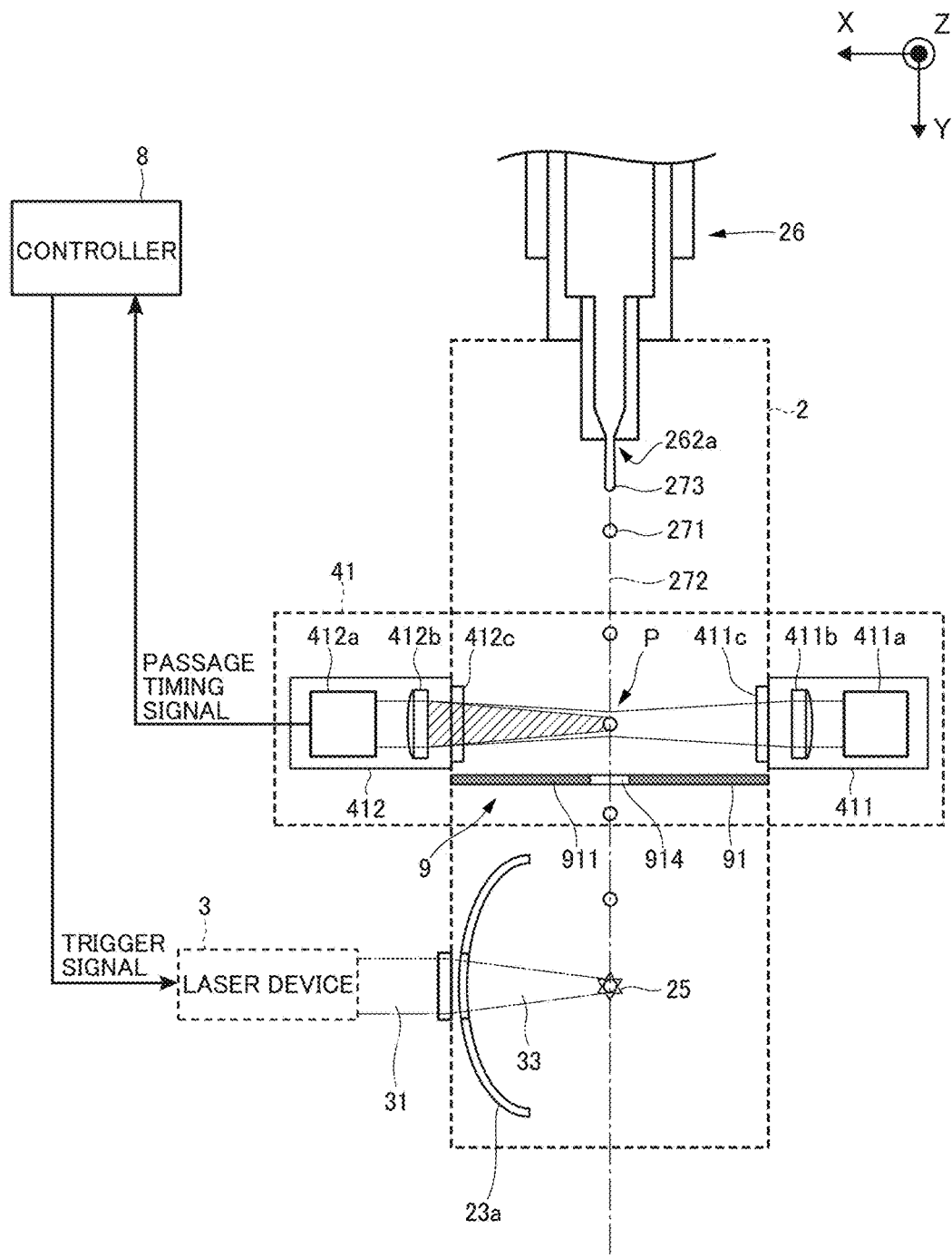
FIG. 8 is a drawing explaining the EUV light generation apparatus according to Modification 2 of Embodiment 1.

FIG. 8 is a drawing explaining the EUV light generation apparatus 1 according to Modification 2 of Embodiment 1. The EUV light generation apparatus 1 according to Modification 2 of Embodiment 1 may be different in the configuration of the shielding plate 91 from the EUV light generation apparatus 1 according to Embodiment 1 shown in FIG. 6. The configuration of the EUV light generation apparatus 1 according to Modification 2 of Embodiment 1, which is the same as that of the EUV light generation apparatus 1 according to Embodiment 1 shown in FIG. 6, will not be described again here.

The shielding plate 91 shown in FIG. 8 may be formed between the droplet measurement unit 41 and the plasma generation region to partition the internal space of the chamber 2. The shielding plate 91 shown in FIG. 8 may include the bottom surface part 911 and a via hole 914.

The bottom surface part 911 of the shielding plate 91 shown in FIG. 8 may be formed such that the leading end of the bottom surface part 911 extends to the wall of the chamber 2 on the light source part 411 side beyond the target traveling path 272. The via hole 914 of the shielding plate 91 shown in FIG. 8 may be formed in the bottom surface part 911 at a position at which the target traveling path 272 intersects with the bottom surface part 911. The size of the via hole 914 may be sufficiently greater than the diameter of the droplet 271 outputted into the chamber 2. The via hole 914 may be formed in a size to prevent the light of the electromagnetic waves emitted from the plasma from entering the light receiving part 412. If the via hole 914 is circular, the central axis of the via hole 914 may substantially match the target traveling path 272.

With the above-described configuration, the shielding plate 91 shown in FIG. 8 can prevent the light of the electromagnetic waves emitted from the plasma from entering the light receiving part 412, even though the light is reflected from, for example, the wall of the chamber 2 toward the droplet measurement unit 41. Therefore, the shielding plate 91 shown in FIG. 8 can more effectively prevent the light of the electromagnetic waves emitted from the plasma from entering the light receiving part 412 of the droplet measurement unit 41 than the shielding plate 91 shown in FIG. 6. As a result, the EUV light generation apparatus 1 according to Modification 2 of Embodiment 1 can further improve the energy stability of the outputted EUV light 252. Here, the other configuration of the EUV light generation apparatus 1 according to Modification 2 of Embodiment 1 may be the same as the configuration of the EUV light generation apparatus 1 according to Embodiment 1 shown in FIG. 6.

5.4 Modification 3

Figure 9:
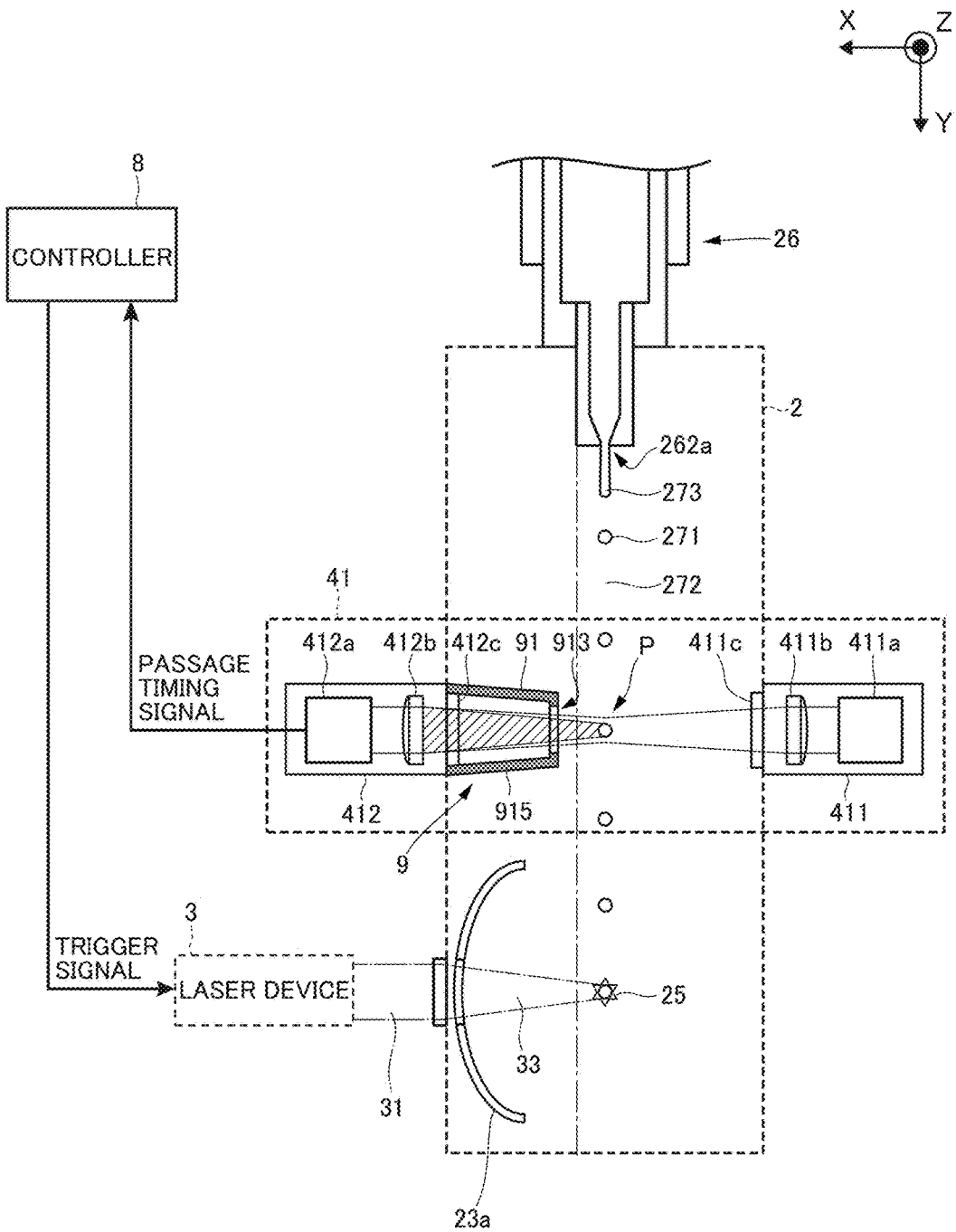
FIG. 9 is a drawing explaining the EUV light generation apparatus according to Modification 3 of Embodiment 1.

FIG. 9 is a drawing explaining the EUV light generation apparatus 1 according to Modification 3 of Embodiment 1. The EUV light generation apparatus 1 according to Modification 3 of Embodiment 1 may be different in the configuration of the shielding plate 91 from the EUV light generation apparatus 1 according to Embodiment 1 shown in FIG. 6. The configuration of the EUV light generation apparatus 1 according to Modification 3 of Embodiment 1, which is the same as that of the EUV light generation apparatus 1 according to Embodiment 1 shown in FIG. 6, will not be described again here.

The shielding plate 91 shown in FIG. 9 may be formed to cover the optical path of the continuous laser beam emitted from the light source part 411. The shielding plate 91 shown in FIG. 9 may include a cylinder part 915 and the opening 913.

The cylinder part 915 of the shielding plate 91 shown in FIG. 9 may be formed as a hollow truncated cone with the open top and bottom. The bottom edge of the truncated conical cylinder part 915 may be located on the outer periphery of the window 412c of the light receiving part 412. Meanwhile, the top edge of the truncated conical cylinder part 915 may be located on the target traveling path 272 side. The truncated conical cylinder part 915 may be disposed such that its side surface does not intersect with the target traveling path 272. The central axis of the cylinder part 915 may substantially match the axis of the optical path of the continuous laser beam emitted from the light source part 411.

The opening 913 of the shielding plate 91 shown in FIG. 9 may be formed in the top edge of the cylinder part 915 not to obstruct the optical path of the continuous laser beam emitted from the light source part 411.

With the above-described configuration, the shielding plate 91 shown in FIG. 9 can reduce the light coming to the droplet measurement unit 41 from any directions except the traveling direction of the continuous laser beam emitted from the light source part 411. Even though the light of the electromagnetic waves emitted from the plasma is reflected from the wall of the chamber 2, it may be very difficult to match the traveling direction of the light of the electromagnetic waves emitted from the plasma with the traveling direction of the continuous laser beam emitted from the light source part 411. Therefore, the shielding plate 91 shown in FIG. 9 can more effectively prevent the light of the electromagnetic waves emitted from the plasma from entering the light receiving part 412 of the droplet measurement unit 41 than the shielding plate 91 shown in FIG. 6. As a result, the EUV light generation apparatus 1 according to Modification 3 of Embodiment 1 can further improve the energy stability of the outputted EUV light 252. Here, the other configuration of the EUV light generation apparatus 1 according to Modification 3 of Embodiment 1 may be the same as the configuration of the EUV light generation apparatus 1 according to Embodiment 1 shown in FIG. 6.

5.5 Modification 4

Figure 10:
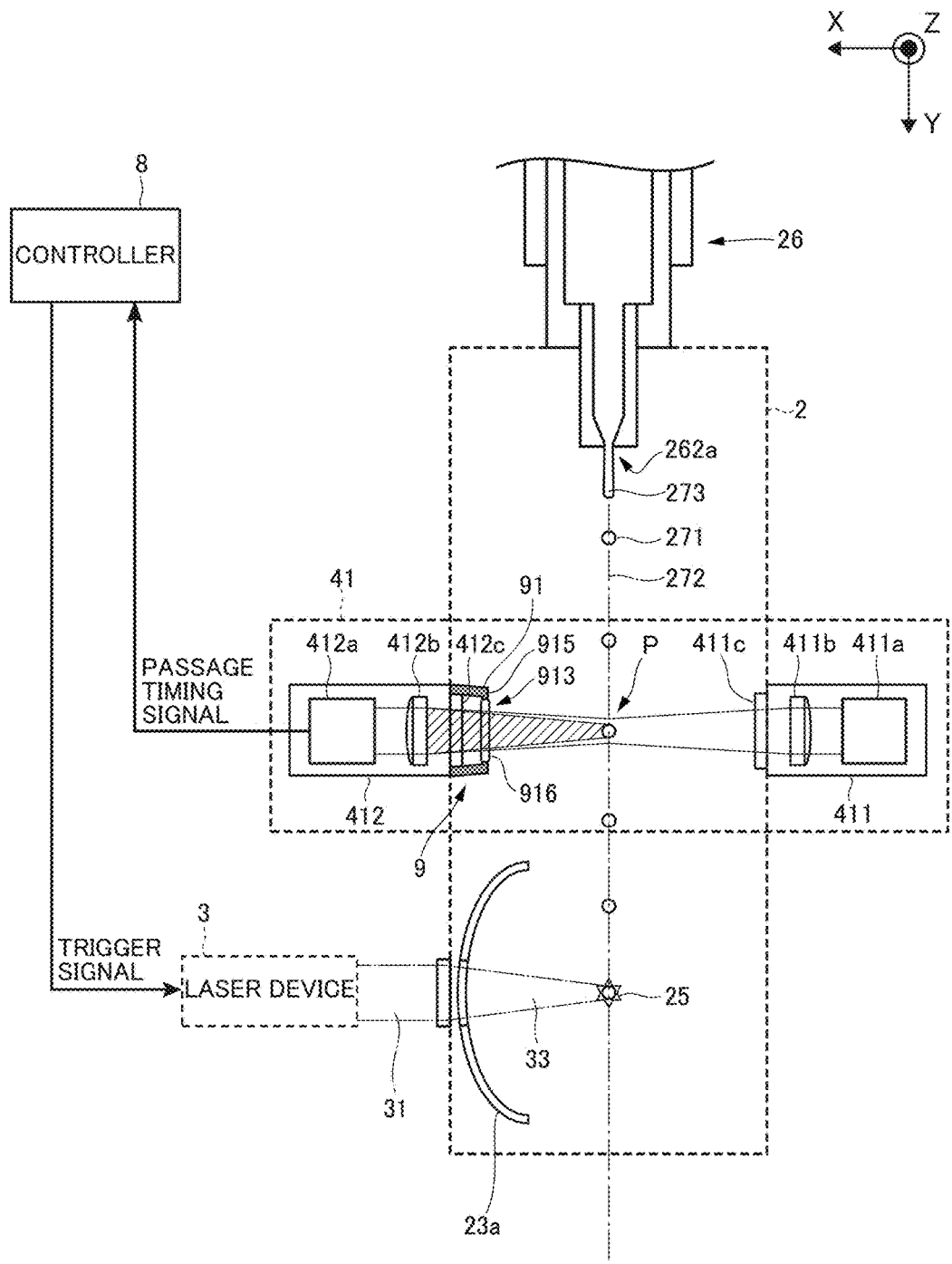
FIG. 10 is a drawing explaining the EUV light generation apparatus according to Modification 4 of Embodiment 1.

FIG. 10 is a drawing explaining the EUV light generation apparatus 1 according to Modification 4 of Embodiment 1. The EUV light generation apparatus 1 according to Modification 4 of Embodiment 1 may be different in the configuration of the shielding plate 91 from the EUV light generation apparatus 1 according to Modification 3 of Embodiment 1 shown in FIG. 9. The configuration of the EUV light generation apparatus 1 according to Modification 4 of Embodiment 1, which is the same as that of the EUV light generation apparatus 1 according to Modification 3 of Embodiment 1 shown in FIG. 9, will not be described again here.

The shielding plate 91 shown in FIG. 10 may include the cylinder part 915, the opening 913, and an optical filter 916.

The optical filter 916 of the shielding plate 91 shown in FIG. 10 may be disposed to close the opening 913. The optical filter 916 may be an optical component having a high transmittance for the wavelength of the continuous laser beam emitted from the light source part 411. The optical filter 916 may be a bandpass filter configured to allow the light having the wavelength of the continuous laser beam emitted from the light source part 411 to transmit therethrough. The optical filter 916 may be an optical component having a low transmittance for different wavelengths of the light of the electromagnetic waves emitted from the plasma. Here, the optical filter 916 may be provided instead of the window 412c of the light receiving part 412. In this case, the cylinder part 915 of the shielding plate 91 may be omitted.

With the above-described configuration, the optical filter 916 of the shielding plate 91 shown in FIG. 10 can allow the light receiving part 412 to transmit the continuous laser beam emitted from the light source part 411 therethrough, thereby to attenuate the light of the electromagnetic waves emitted from the plasma. Therefore, the shielding plate 91 shown in FIG. 10 can more effectively prevent the light of the electromagnetic waves emitted from the plasma from entering the light receiving part 412 of the droplet measurement unit 41 than the shielding plate 91 shown in FIG. 9. As a result, the EUV light generation apparatus 1 according to Modification 4 of Embodiment 1 can further improve the energy stability of the outputted EUV light 252. Here, the other configuration of the EUV light generation apparatus 1 according to Modification 4 of Embodiment 1 may be the same as the configuration of the EUV light generation apparatus 1 according to Modification 3 of Embodiment 1 shown in FIG. 9.

6. EUV Light Generation Apparatus According to Embodiment 2

Now, with reference to FIGS. 11 and 12, the EUV light generation apparatus 1 according to Embodiment 2 will be described. The EUV light generation apparatus 1 according to Embodiment 2 may be different in the configuration of the light receiving part 412 of the droplet measurement unit 41 from the EUV light generation apparatus 1 shown in FIGS. 2 and 3. The configuration of the EUV light generation apparatus 1 according to Embodiment 2, which is the same as that of the EUV light generation apparatus 1 shown in FIGS. 2 and 3, will not be described again here.

6.1 Configuration

Figure 11:
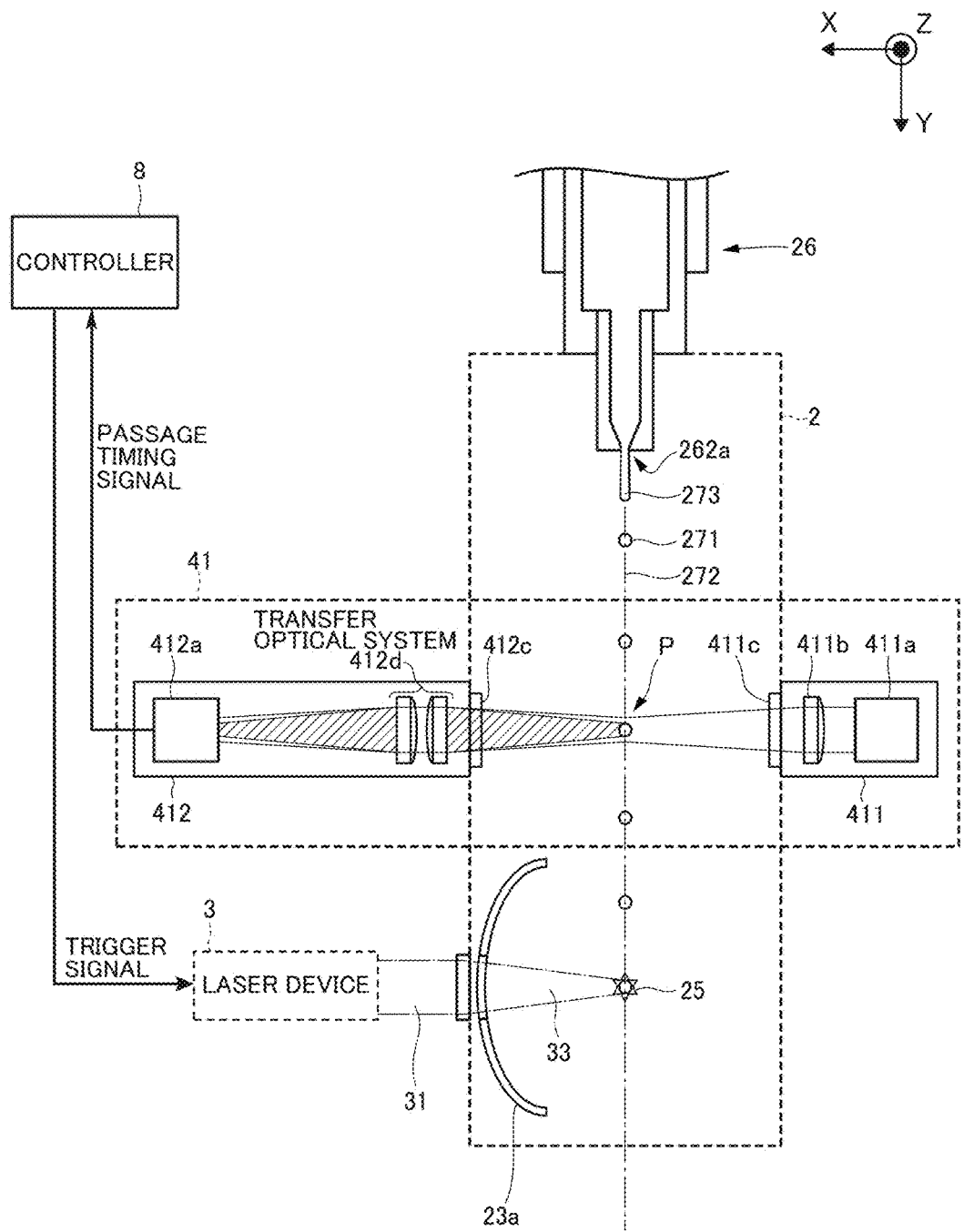
FIG. 11 is a drawing explaining the EUV light generation apparatus according to Embodiment 2.

FIG. 11 is a drawing explaining the EUV light generation apparatus 1 according to Embodiment 2. The light receiving part 412 shown in FIG. 11 may include the optical sensor 412a, a transfer optical system 412d and the window 412c. That is, the light receiving part 412 according to Embodiment 2 may include the transfer optical system 412d instead of the light receiving optical system 412b. The EUV light generation apparatus 1 according to Embodiment 2 may not include the shielding member 9.

The transfer optical system 412d may transfer images of the continuous laser beam emitted from the light source part 411 at and around the predetermined position P to the light receiving surface of the optical sensor 412a, and form the images thereon. The transfer optical system 412d may be disposed to substantially match the position of an object at a level of the transfer optical system 412*d* with the predetermined position P. In addition, the transfer optical system 412*d* may be disposed to substantially match the position of the image on the transfer optical system 412*d* with the position of the light receiving surface of the optical sensor 412*a*, in the traveling direction of the droplet. The transfer optical system 412*d* may be formed by combining two convex lenses. However, this is by no means limiting. The transfer optical system 412*d* may be formed by combining, for example, a convex lens and a concave lens. Alternatively, the transfer optical system 412*d* may be constituted by one lens. Otherwise, the transfer optical system 412*d* may be formed by a mirror optical system.

With the above-described configuration, the light receiving part 412 according to Embodiment 2 can allow the optical sensor 412*a* to receive the images of the continuous laser beam emitted from the light source part 411, formed only at and around the predetermined position P. By this means, the EUV light generation apparatus 1 according to Embodiment 2 can prevent the light of the electromagnetic waves emitted from the plasma from entering the light receiving part 412 of the droplet measurement unit 41, without the shielding member 9. As a result, the EUV light generation apparatus 1 according to Embodiment 2 can improve the energy stability of the outputted EUV light 252 with a simple configuration. Here, the light receiving part 412 of the EUV light generation apparatus 1 according to Embodiment 2 may further include a slit or an aperture plate between the transfer optical system 412*d* and the light sensor 412*a*, on the optical path of the continuous laser beam emitted from the light source part 411. In this case, the EUV light generation apparatus 1 according to Embodiment 2 can more effectively prevent the light of the electromagnetic waves emitted from the plasma from entering the light receiving part 412 of the droplet measurement unit 41. The other configuration of the EUV light generation apparatus 1 according to Embodiment 2 may be the same as the configuration of the EUV light generation apparatus 1 shown in FIGS. 2 and 3.

6.2 Modification

Figure 12:
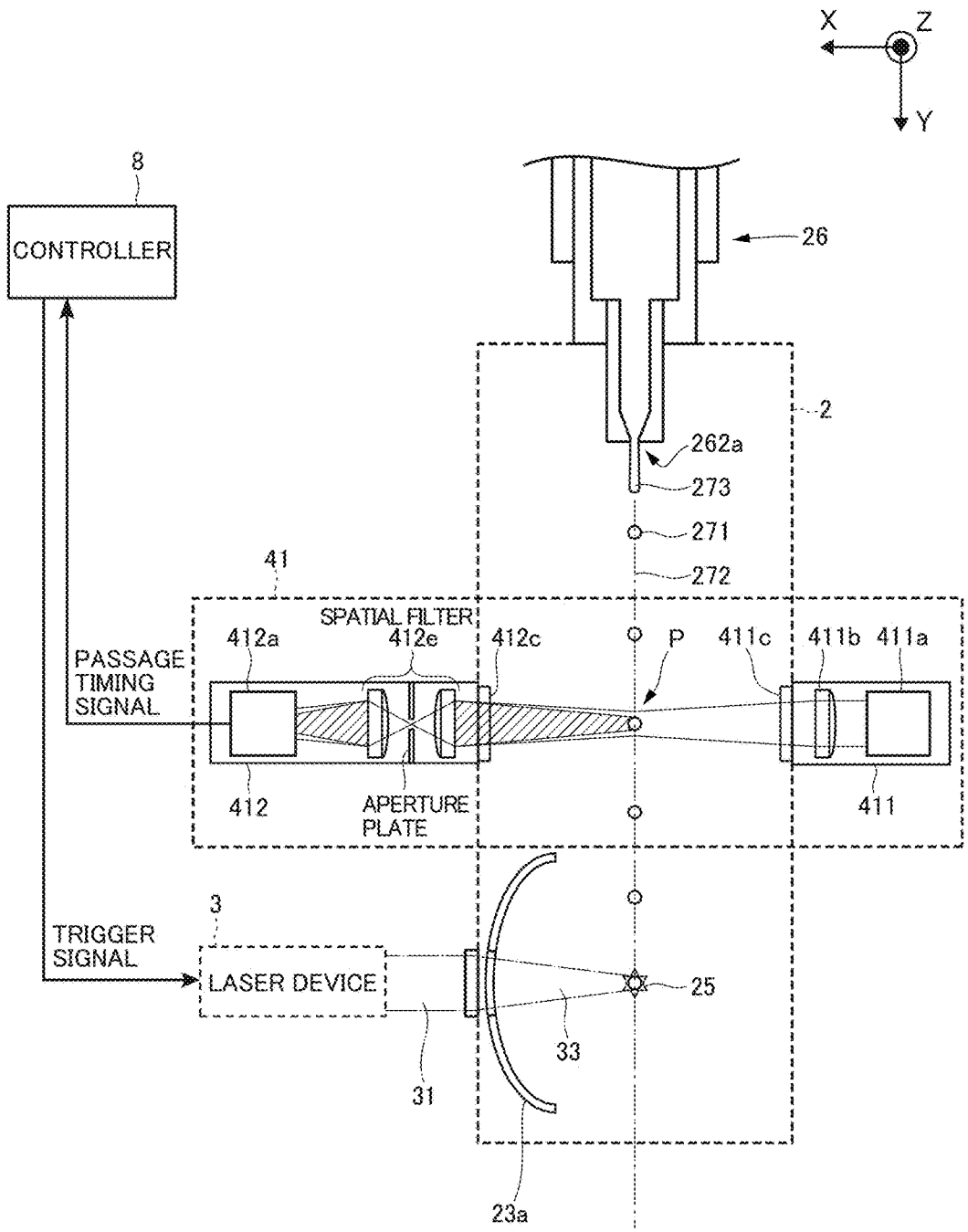
FIG. 12 is a drawing explaining the EUV light generation apparatus according to a modification of Embodiment 2.

FIG. 12 is a drawing explaining the EUV light generation apparatus 1 according to a modification of Embodiment 2. The EUV light generation apparatus 1 according to the modification of Embodiment 2 may be different in the configuration of the light receiving part 412 from the EUV light generation apparatus 1 according to Embodiment 2 shown in FIG. 11. The configuration of the EUV light generation apparatus 1 according to the modification of Embodiment 2, which is the same as that of the EUV light generation apparatus 1 according to Embodiment 2 shown in FIG. 11, will not be described again here.

The light receiving part 412 shown in FIG. 12 may include the optical sensor 412*a*, a spatial filter 412*e*, and the window 412*c*. That is, the light receiving part 412 according to the modification of Embodiment 2 may include the spatial filter 412*e* instead of the transfer optical system 412*d*.

The spatial filter 412*e* may prevent the passage of the light which is not traveling on the optical path of the continuous laser beam emitted from the light source part 411. The spatial filter 412*e* may include two convex lenses and an aperture plate. These two convex lenses of the spatial filter 412*e* may have approximately the same focal distance. The two convex lenses may be disposed to face one another at an interval which is twice as long as the focal distance. These two convex lenses may be disposed such that their optical axes substantially match the axis of the optical path of the continuous laser beam emitted from the light source part 411. The aperture plate of the spatial filter 412*e* may be disposed at the midpoint of the two convex lenses. An aperture may be formed at the center of the aperture plate. The aperture plate may be disposed such that the position of the aperture substantially matches the focal position of each of the two convex lenses.

With the above-described configuration, the light receiving part 412 of the EUV light generation apparatus 1 according to the modification of Embodiment 2 can prevent the light, except the continuous laser beam emitted from the light source part 411, from entering the light receiving part 412. By this means, the EUV light generation apparatus 1 according to the modification of Embodiment 2 can prevent the light of the electromagnetic waves emitted from the plasma from entering the light receiving part 412 of the droplet measurement unit 41, without the shielding member 9. As a result, the EUV light generation apparatus 1 according to the modification of Embodiment 2 can improve the energy stability of the outputted EUV light 252 with a simple configuration. The other configuration of the EUV light generation apparatus 1 according to the modification of Embodiment 2 may be the same as the configuration of the EUV light generation apparatus 1 according to Embodiment 2 shown in FIG. 11.

7. EUV Light Generation Apparatus According to Embodiment 3

Now, with reference to FIGS. 13 to 15, the EUV light generation apparatus 1 according to Embodiment 3 will be described.

As described above, the EUV light generation apparatus 1 according to Embodiments 1 and 2 can prevent the light of the electromagnetic waves emitted from the plasma from entering the light receiving part 412 of the droplet measurement unit 41. Therefore, with the EUV light generation apparatus 1 according to Embodiments 1 and 2, the passage timing signal outputted from the droplet measurement unit 41 is not likely to have noise, and consequently the output timing of the trigger signal may not be likely to have an error. As a result, the EUV light generation apparatus 1 according to Embodiments 1 and 2 can substantially match the timing at which the droplet 271 reaches the plasma generation region 25 with the timing at which the pulsed laser beam 33 is focused on the plasma generation region 25, and therefore improve the energy stability of the EUV light 252.

The EUV light generation apparatus 1 according to Embodiment 3 may suppress the noise of the electromagnetic waves emitted from the plasma, thereby to improve the energy stability of the EUV light 252. The EUV light generation apparatus 1 according to Embodiment 3 may be different in the configuration of the shielding member 9 from the EUV light generation apparatus 1 according to Embodiment 1 shown in FIGS. 6 to 10. The configuration of the EUV light generation apparatus 1 according to Embodiment 3, which is the same as that of the EUV light generation apparatus 1 according to Embodiment 1 shown in FIGS. 6 to 10, will not be described again here.

7.1 Configuration

Figure 14:
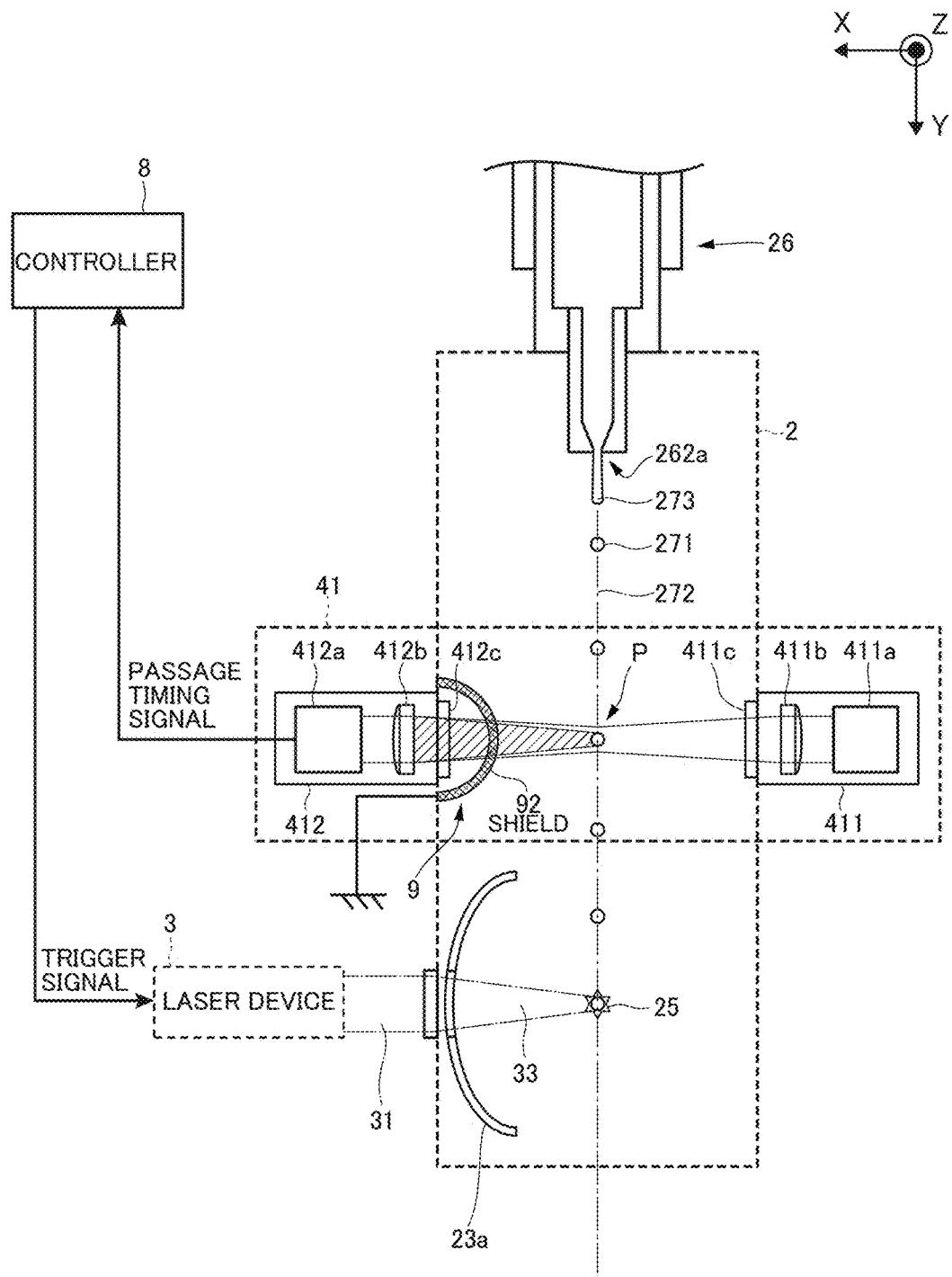
FIG. 14 is a drawing explaining the EUV light generation apparatus according to Embodiment 3.

FIG. 14 is a drawing explaining the EUV light generation apparatus 1 according to Embodiment 3. The shielding member 9 of the EUV light generation apparatus 1 according to Embodiment 3 may be constituted by a shield 92 instead of the shielding plate 91.

The shield 92 may prevent the noise of the electromagnetic waves emitted from the plasma from entering the droplet measurement unit 41. The shield 92 may attenuate the noise of the electromagnetic waves emitted from the plasma to prevent the noise of the electromagnetic waves from entering the light receiving part 412 of the droplet measurement unit 41. The shield 92 may attenuate the noise of the electromagnetic waves to the extent that the controller 8 does not mistake the noise of the electromagnetic waves as the passage of the droplet 271. The shield 92 may be formed by using a material that attenuates the noise of the electromagnetic waves emitted from the plasma. Preferably, the shield 92 may be formed by using mesh metal, punched metal, or expanded metal. The open area ratio of the shield 92 may be appropriately designed, based on the relationship between an amount of the light required for the optical sensor 412*a* of the light receiving part 412 to detect the passage of the droplet 271 and the frequency of the noise component obtained when the noise of the electromagnetic waves to be attenuated is detected.

The shield 92 may be provided in the vicinity of the light receiving part 412 of the droplet measurement unit 41. The shield 92 may be formed in a hollow hemispheric shape with the open bottom. The bottom edge of the hemispheric shield 92 may be located outside the outer periphery of the window 412*c* of the light receiving part 412. The top of the hemispheric shield 92 may be provided to face the target traveling path 272. The hemispheric shield 92 may be disposed not to intersect with the target traveling path 272.

The shield 92 may be connected to the ground. The shield 92 may be connected directly to the ground, or via an electric conductor such as the wall of the chamber 2.

With the above-described configuration, the shield 92 can prevent the noise of the electromagnetic waves emitted from the plasma from entering the light receiving part 412 of the droplet measurement unit 41, without hindering the light receiving part 412 from detecting the passage of the droplet 271. As a result, the passage timing signal outputted from the droplet measurement unit 41 is not likely to have a noise which causes the controller 8 to mistake for the passage of the droplet 271. Therefore, the trigger signal is not likely to be outputted from the controller 8 to the laser device 3 at a wrong timing. By this means, it is possible to prevent the unstable output of the laser device 3 caused by repeated laser outputs of the laser device 3 at undesired timings, or a change in the amplification factor of the amplifier. As a result, the EUV light generation apparatus 1 according to Embodiment 3 can improve the energy stability of the outputted EUV light 252. Here, the other configuration of the EUV light generation apparatus 1 according to Embodiment 3 may be the same as the configuration of the EUV light generation apparatus 1 according to Embodiment 1 shown in FIGS. 6 to 10.

7.2 Modification

Figure 15:
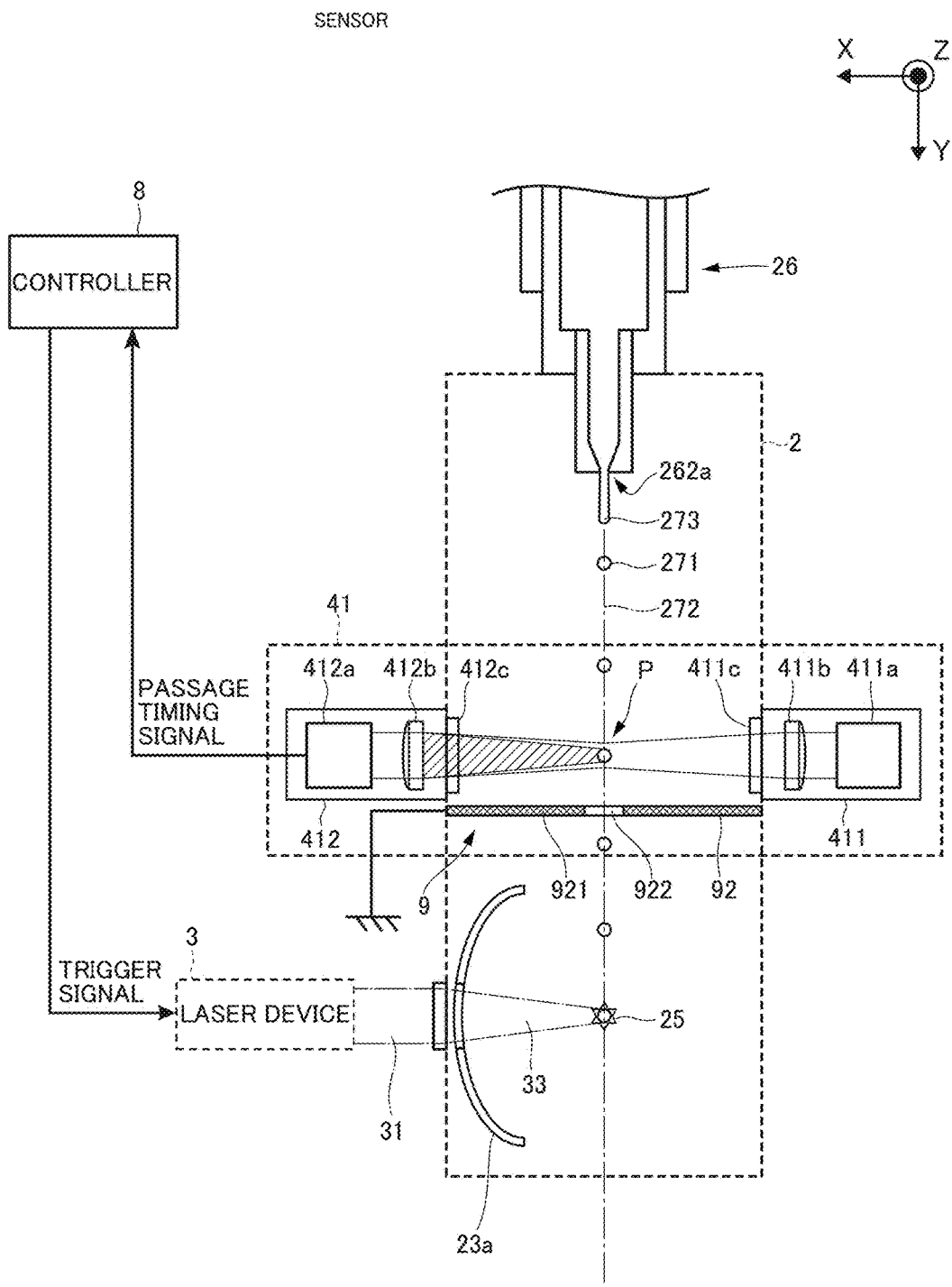
FIG. 15 is a drawing explaining the EUV light generation apparatus according to a modification of Embodiment 3.

FIG. 15 is a drawing explaining the EUV light generation apparatus 1 according to a modification of Embodiment 3. The EUV light generation apparatus 1 according to the modification of Embodiment 3 may be different in the configuration of the shield 92 from the EUV light generation apparatus 1 according to Embodiment 3 shown in FIG. 14. The configuration of the EUV light generation apparatus 1 according to the modification of Embodiment 3, which is the same as that of the EUV light generation apparatus 1 according to Embodiment 3 shown in FIG. 14, will not be described again here.

The shield 92 shown in FIG. 15 may be formed between the droplet measurement unit 41 and the plasma generation region 25 to partition the internal space of the chamber 2. The shield 92 shown in FIG. 15 may include a main body 921 and a via hole 922.

The main body 921 of the shield 92 shown in FIG. 15 may be formed to be approximately perpendicular to the target traveling path 272. In addition, the main body 921 may be formed to be approximately parallel to the direction in which the light source part 411 and the light receiving part 412 face one another. The main body 921 may be fixed to the wall of the chamber 2 in the vicinity of the light receiving part 412. The main body 921 may be formed such that its leading end extends to the wall of the chamber 2 on the light source part 411 side beyond the target traveling path 272, from its base end corresponding to the wall of the chamber 2 closer to the plasma generation region 25 than the light receiving part 412.

The via hole 922 of the shield 92 shown in FIG. 15 may be formed in the main body 921 at the position at which the target traveling path 272 intersects with the main body 921. The size of the via hole 922 may be sufficiently greater than the diameter of the droplet 271 outputted into the chamber 2. If the via hole 922 is circular, the central axis of the via hole 922 may substantially match the target traveling path 272.

With the above-described configuration, the shield 92 shown in FIG. 15 can prevent the noise of the electromagnetic waves emitted from the plasma from entering the light receiving part 412 of the droplet measurement unit 41, in the same way as the shield 92 shown in FIG. 14. As a result, the EUV light generation apparatus 1 according to the modification of Embodiment 3 can improve the energy stability of the outputted EUV light 252. Here, the other configuration of the EUV light generation apparatus 1 according to the modification of Embodiment 3 may be the same as the configuration of the EUV light generation apparatus 1 according to Embodiment 3 shown in FIG. 14.

8. EUV Light Generation Apparatus According to Embodiment 4

Now, with reference to FIGS. 16 and 17, the EUV light generation apparatus 1 according to Embodiment 4 will be described. The EUV light generation apparatus 1 according to Embodiment 4 may have a configuration in combination with Embodiments 1 to 3 including the modifications shown in FIGS. 6 to 15. The configuration of the EUV light generation apparatus 1 according to Embodiment 4, which is the same as that of the EUV light generation apparatus 1 according to Embodiments 1 to 3 including the modifications shown in FIG. 6 to 15, will not be described again here.

Figure 16:
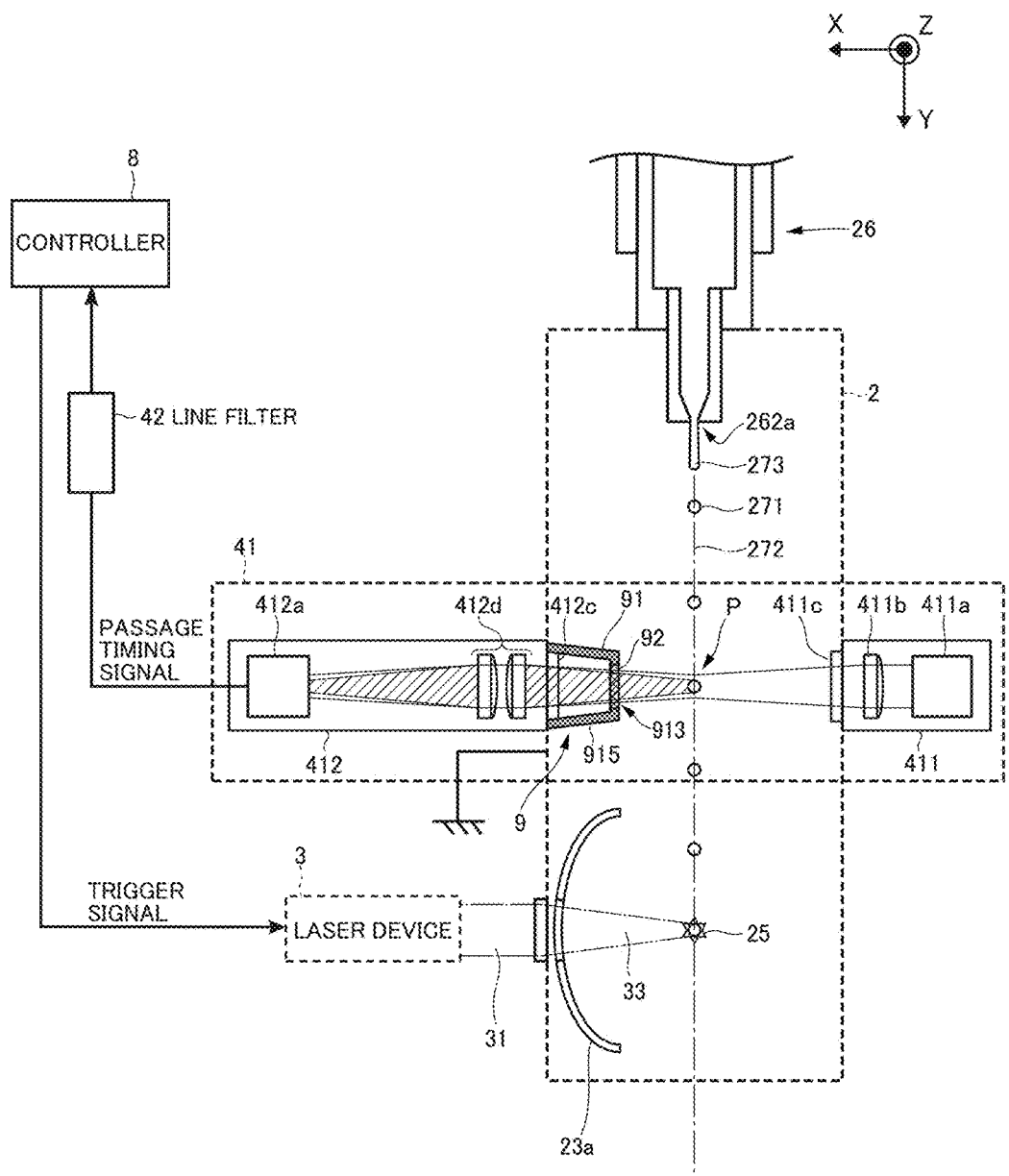
FIG. 16 is a drawing explaining the EUV light generation apparatus according to Embodiment 4.

FIG. 16 is a drawing explaining the EUV light generation apparatus 1 according to Embodiment 4. The shielding member 9 of the EUV light generation apparatus 1 according to Embodiment 4 may be constituted by the shielding plate 91 and the shield 92. The EUV light generation apparatus 1 according to Embodiment 4 may be constituted by combining, for example, the shielding plate 91 according to Modification 3 of Embodiment 1 shown in FIG. 9, the transfer optical system 412*d* according to Embodiment 2 shown in FIG. 11, and the shield 92 according to Embodiment 3 shown in FIG. 14. The EUV light generation apparatus 1 according to Embodiment 4 may further include a line filter 42.

The shield 92 shown in FIG. 16 may be disposed to close the opening 913 of the shielding plate 91.

The line filter 42 shown in FIG. 16 may be provided on a signal wire through which a signal outputted from the droplet measurement unit 41 is transmitted. The line filter 42 may be provided on the signal wire connecting between the droplet measurement unit 41 and the controller 8 to transmit the passage timing signal. The line filter 42 may have a function to allow a signal component at a desired frequency to pass through, and to attenuate signal components at a desired frequency. The line filter 42 may allow the signal component of the passage timing signal indicating a change in the optical intensity in response to the passage of the droplet 271 to pass through, and attenuate the other signal components. The line filter 42 may be a filter circuit such as a low-pass filter and a bandpass filter. The filter circuit may be constituted by an LCR circuit or an operational amplifier. The line filter 42 may be, for example, a ferrite core or a choke coil.

As described above, the shielding member 9 includes the shielding plate 91 and the shield 92, and therefore the EUV light generation apparatus 1 according to Embodiment 4 can prevent the light and the noise of the electromagnetic waves emitted from the plasma from entering the light receiving part 412 of the droplet measurement unit 41. In addition, the light receiving part 412 includes the transfer optical system 412d, and therefore the EUV light generation apparatus 1 according to Embodiment 4 can further prevent the light of the electromagnetic waves emitted from the plasma from entering the light receiving part 412 of the droplet measurement unit 41. Moreover, the EUV light generation apparatus 1 according to Embodiment 4 includes the line filter 42, and therefore even though the passage timing signal outputted from the droplet measurement unit 41 has noise, it is possible to attenuate the noise and input the passage timing signal to the controller 8. Therefore, the passage timing signal inputted to the controller 8 may not be more likely to contain a noise. Consequently, the trigger signal can be outputted from the controller 8 to the laser device 3 at a desired timing with more precision. This prevents the pulsed laser beam 31 from being outputted from the laser device 3 at an undesired timing, and therefore it is possible to irradiate the droplet 271 with the pulsed laser beam 33 in the plasma generation region 25 with precision. As a result, the EUV light generation apparatus 1 according to Embodiment 4 can further improve the energy stability of the outputted EUV light 252. Here, the other configuration of the EUV light generation apparatus 1 according to Embodiment 4, which is the same as the configuration of the EUV light generation apparatus 1 according to Embodiments 1 to 3 including the modifications shown in FIGS. 6 to 15, will not be described again here.

9. EUV Light Generation Apparatus According to Embodiment 5

Figure 17:
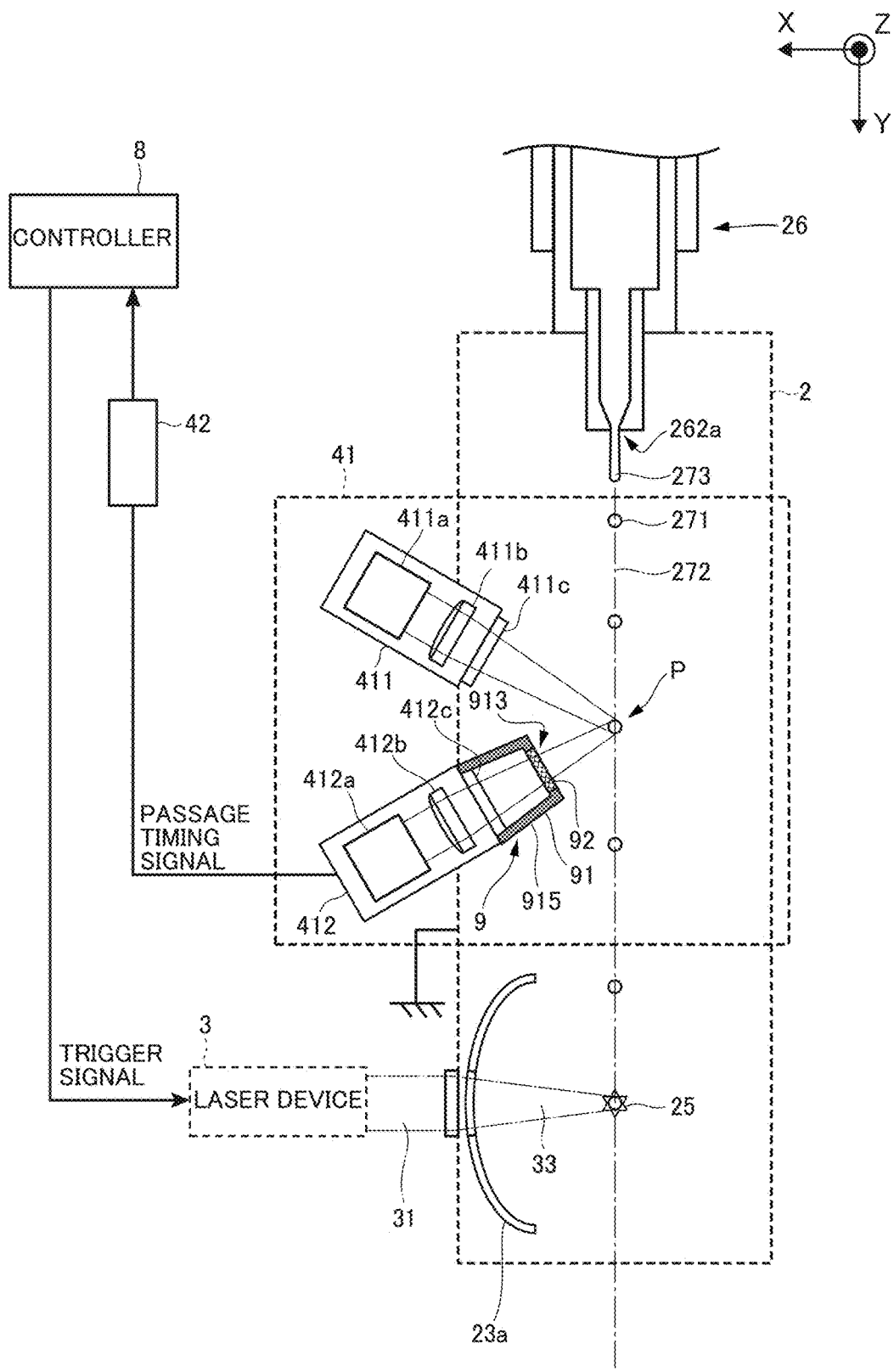
FIG. 17 is a drawing explaining the EUV light generation apparatus according to Embodiment 5.

FIG. 17 is a drawing explaining the EUV light generation apparatus 1 according to Embodiment 5. The EUV light generation apparatus 1 according to Embodiment 5 may be different in the configuration of the droplet measurement unit 41 from the EUV light generation apparatus 1 according to Embodiment 4 shown in FIG. 16. The configuration of the EUV light generation apparatus 1 according to Embodiment 5, which is the same as that of the EUV light generation apparatus 1 according to Embodiment 4 shown in FIG. 16, will not be described again here.

In the droplet measurement unit 41 shown in FIG. 17, the light source part 411 and the light receiving part 412 may not face one another via the target traveling path 272. The light source part 411 and the light receiving part 412 of the droplet measurement unit 41 shown in FIG. 17 may be disposed such that the window 411c of the light source part 411 and the window 412c of the light receiving part 412 are disposed on the same side to face the predetermined position P from the directions which are not parallel to one another. The layout of the window 411c of the light source part 411 and the window 412c of the light receiving part 412 may not be limited as long as the light receiving part 412 can detect the reflected light from the droplet 271.

The light receiving part 412 shown in FIG. 17 may detect not the shadow of the droplet 271 but the reflected light from the droplet 271. The light receiving part 412 shown in FIG. 17 may include the light receiving optical system 412b instead of the transfer optical system 412d. When the droplet 271 is not passing through the predetermined position P, the continuous laser beam emitted from the light source part 411 may not be reflected from the droplet 271 but travel straight. At this time, the continuous laser beam does not directly enter the light receiving part 412. Alternatively, before entering the light receiving part 412, the continuous laser beam may be reflected from the wall of the chamber 2, and therefore the continuous laser beam entering the light receiving part 412 may be significantly attenuated. Consequently, at this time, the optical intensity of the light detected by the light receiving part 412 may be low. Meanwhile, when the droplet 271 is passing through the predetermined position P, part of the continuous laser beam emitted from the light source part 411 may be reflected from the droplet 271 and enter the light receiving part 412. At this time, an amount of this reflected light from the droplet 271 which is entering the light receiving part 412 may be greater than when the droplet 271 is not passing through the predetermined position P. Therefore, at this time, the optical intensity of the light detected by the light receiving part 412 is significantly higher than when the droplet 271 is not passing through the predetermined position P. Consequently, the light receiving part 412 shown in FIG. 17 may generate the passage timing signal in which the optical intensity of the detected light increases in synchronization with the timing at which the droplet 271 is passing through the predetermined position P, and output this passage timing signal to the controller 8.

The controller 8 shown in FIG. 17 may determine that the droplet 271 is passing through the predetermined position P when the optical intensity of the inputted passage timing signal is higher than the droplet signal threshold value. Then, the controller 8 may generate the droplet detection signal indicating that the droplet 271 passing through the predetermined position P is detected. Then, the controller 8 may output the trigger signal to the laser device 3 at the timing that is delayed by the delay time Td from the timing at which the droplet detection signal is generated.

With the above-described configuration, the EUV light generation apparatus 1 according to Embodiment 5 can improve the energy stability of the outputted EUV light 252. Here, the other configuration of the EUV light generation apparatus 1 according to Embodiment 5, which is the same as the configuration of the EUV light generation apparatus 1 according to Embodiment 4 shown in FIG. 16, will not be described again here.

10. EUV Light Generation Apparatus According to Embodiment 6

Now, with reference to FIG. 18, the EUV light generation apparatus 1 according to Embodiment 6 will be described. The EUV light generation apparatus 1 according to Embodiment 6 may be different in the configuration of the droplet measurement unit 41 from the EUV light generation apparatus 1 according to Embodiment 4 shown in FIG. 16. The configuration of the EUV light generation apparatus 1 according to Embodiment 6, which is the same as that of the EUV light generation apparatus 1 according to Embodiment 4 shown in FIG. 16, will not be described again here.

Figure 18:
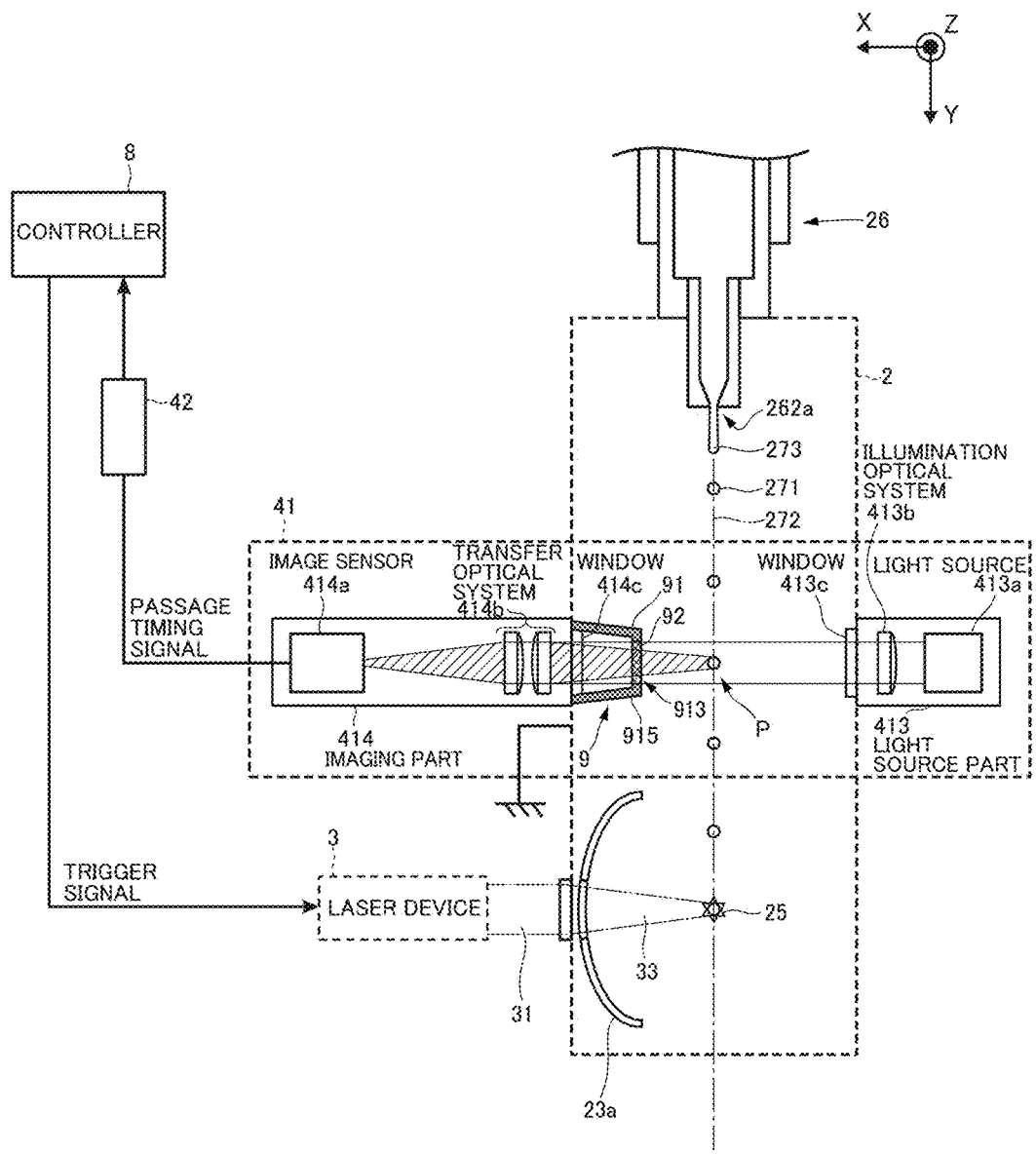
FIG. 18 is a drawing explaining the EUV light generation apparatus according to Embodiment 6.

FIG. 18 is a drawing explaining the EUV light generation apparatus 1 according to Embodiment 6. The droplet measurement unit 41 shown in FIG. 18 may measure the trajectory of the droplet 271 traveling in the chamber 2, and the diameter, velocity and so forth of the droplet 271, as well as the timing at which the droplet 271 is passing through the predetermined position P in the chamber 2. The droplet measurement unit 41 shown in FIG. 18 may include a light source part 413 and an imaging part 414, instead of the light source part 411 and the light receiving part 412.

The light source part 413 may emit a pulsed light to the droplet 271 traveling on the target traveling path 272. The light source part 413 may include a light source 413a, an illumination optical system 413b, and a window 413c.

The light source 413a may be, for example, a xenon flash tube or a laser beam source which perform pulse-lighting. Although not shown in FIG. 18, the light source 413a may be connected to the controller 8. A control signal outputted from the controller 8 may be inputted to the light source 413a to cause the light source 413a to perform pulse-lighting at a predetermined timing. The light source 413a may emit a pulsed light based on the inputted control signal. A lighting period of time and a lighting interval of the light source 413a may be sufficiently shorter than the period for which the droplet 271 is outputted from the target supply part 26.

The illumination optical system 413b may be an optical system such as a collimator, or be formed by an optical element such as lens. The illumination optical system 413b may guide the pulsed light emitted from the light source 413a to the predetermined position P on the target traveling path 272, via the window 413c.

The imaging part 414 may capture an image of the shadow of the droplet 271 irradiated with the pulsed light by the light source part 413. The imaging part 414 may include an image sensor 414a, a transfer optical system 414b and a window 414c.

The transfer optical system 414b may transfer an image of the pulsed light emitted from the light source part 413, formed in the vicinity of the predetermined position P, to the light receiving surface of the image sensor 414a, and form the image thereon. The transfer optical system 414b may be disposed to substantially match the position of an object at a level of the transfer optical system 412d with the predetermined position P. In addition, the transfer optical system 414b may be disposed to substantially match the position of the image at a level of the transfer optical system 412d with the position of the light receiving surface of the image sensor 414a. The transfer optical system 414b may be formed by combining two convex lenses in the same way as the transfer optical system 412d shown in FIGS. 11 and 16.

The image sensor 414a may be a two-dimensional image sensor such as a CCD (charge-coupled device) and a CMOS (complementary metal oxide semiconductor). The image sensor 414a may capture the image of the pulsed laser beam in the vicinity of the predetermined position P which is formed by the transfer optical system 414b. Although not shown in FIG. 18, the image sensor 414a may be connected to the controller 8. A control signal outputted from the controller 8 may be inputted to the image sensor 414a to capture the image of the pulsed light at a predetermined timing. The predetermined timing at which the image sensor 414a captures an image may synchronize with the timing at which the light source 413a performs lighting. The image sensor 414a may capture the image of the pulsed light based on the inputted control signal. The exposure time and the imaging interval of the image sensor 414a may be sufficiently shorter than the period for which the droplet 271 is outputted from the target supply part 26. The exposure time and the imaging interval of the image sensor 414a may be associated with the lighting time and the lighting interval of the light source 413a, respectively.

Although not shown in FIG. 18, the image sensor 414a may include an image analysis and control unit for analyzing the image data of the captured image of the pulsed light. The image analysis and control unit may measure the timing at which the droplet 271 is passing through the predetermined position P, and the trajectory, the diameter, the velocity and so forth of the droplet 271, based on the image data. When the droplet 271 is passing through the predetermined position P, the pulsed light emitted from the light source part 413 may be blocked by the droplet 271, and therefore the image sensor 414 may capture the image of the shadow of the droplet 271. The image analysis and control unit may measure the timing at which the image of the shadow of the droplet 271 reaches a position in the image data which corresponds to the predetermined position P, as the timing at which the droplet 271 is passing through the predetermined position P. The image analysis and control unit may analyze a plurality of image data obtained by capturing the images of the shadow of one droplet 271 at different timings, and measure a trajectory of the shadow of the droplet 271 as the trajectory of the droplet 27. The image analysis and control unit may measure the width of the image of the shadow of the droplet 271 of the image data, as the diameter of the droplet 271. The image analysis and control unit may analyze a plurality of image data obtained by capturing the images of the shadow of one droplet 271 at different timings, and measure a value obtained by dividing a change in position of the shadow of the droplet 271 by the imaging interval, as the velocity of the droplet 271. The image sensor 414a may output the results of the above-described measurements to the controller 8. The image sensor 414a may generate the passage timing signal according to the result of the measurement of the timing at which the droplet 271 is passing through the predetermined position P, and output the passage timing signal to the controller 8.

With the above-described configuration, the EUV light generation apparatus 1 according to Embodiment 6 can improve the energy stability of the outputted EUV light 252. The other configuration of the EUV light generation apparatus 1 according to Embodiment 6, which is the same as the configuration of the EUV light generation apparatus 1 according to Embodiment 4 shown in FIG. 16, will not be described again here.

11. Shielding Member, Shielding Plate and Shielding Body

As described above, the shielding member 9 may be configured to shield the droplet measurement unit 41 from the electromagnetic waves emitted from the plasma. As described above with reference to Embodiments 1 to 6, the shielding member 9 may be constituted by at least one of the shielding plate 91 and the shield 92. The shielding plate 91 constituting the shielding member 9 may prevent the light of the electromagnetic waves emitted from the plasma from entering the droplet measurement unit 41. The shield 92 constituting the shielding member 9 may prevent the noise of the electromagnetic waves emitted from the plasma from entering the droplet measurement unit 41.

Here, the shielding member 91 may be formed by a plate-like member as shown in FIGS. 6 to 8, or a cylindrical member as shown in FIGS. 9, 10, and 16 to 18. That is, as described with reference to Embodiments 1 to 6, the shape of the shielding member 91 is not limited to a plate. In order to eliminate a possibility of limited interpretation that the shielding plate 91 is formed in a plate-like shape, hereinafter a term "shielding body 91A" will be used instead of the shielding plate 91 in Embodiments 7 to 11. Naturally, the shielding body 91A may be a subordinate concept of the shielding member 9, like the shielding plate 91, and configured to prevent the light of the electromagnetic waves emitted from the plasma from entering the droplet measurement unit 41.

12. EUV Light Generation Apparatus According to Embodiment 7

Now, with reference to FIGS. 19 and 20, the EUV light generation apparatus 1 according to Embodiment 7 will be described. The EUV light generation apparatus 1 according to Embodiment 7 may be different in the configuration of the light receiving part 412 from the EUV light generation apparatus 1 according to Embodiment 2 shown in FIGS. 11 and 12. The configuration of the EUV light generation apparatus 1 according to Embodiment 7, which is the same as that of the EUV light generation apparatus 1 according to Embodiment 2 shown in FIGS. 11 and 12, will not be described again here.

12.1 Configuration

Figure 19:
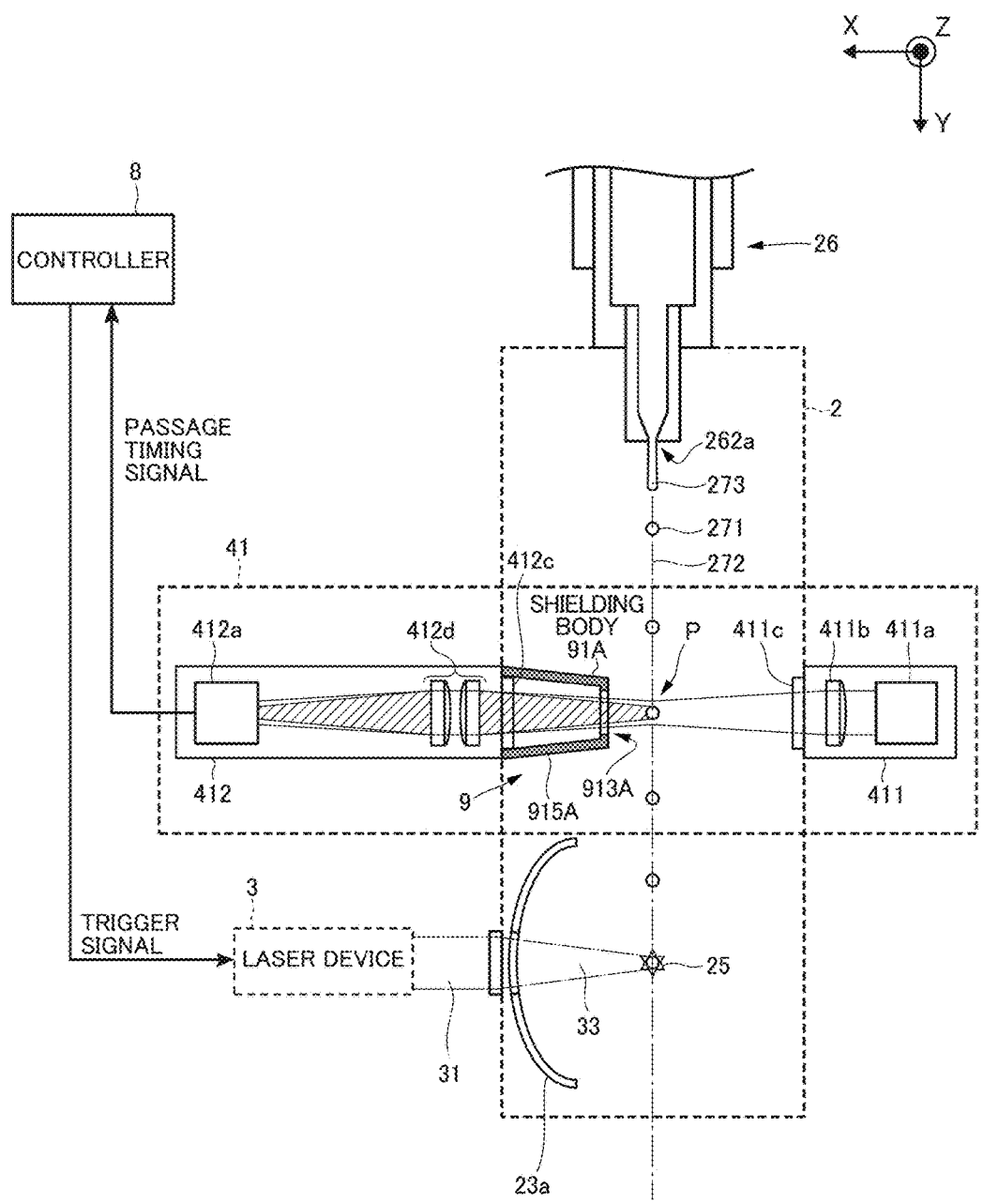
FIG. 19 is a drawing explaining the EUV light generation apparatus according to Embodiment 7.

FIG. 19 is a drawing explaining the EUV light generation apparatus 1 according to Embodiment 7. The light receiving part 412 according to Embodiment 7 may have a configuration where the shielding body 91A is added to the light receiving part 412 according to Embodiment 2 shown in FIG. 11. The shielding body 91A shown in FIG. 19 may have the same configuration as the shielding plate 91 according to Modification 3 of Embodiment 1 shown in FIG. 9. That is, the shielding body 91A may include a cylinder part 915A and an opening 913A. Then, the cylinder part 915A and the opening 913A may have the same configurations as the cylinder part 915 and the opening 913 of the shielding plate 91 shown in FIG. 9, respectively.

To be more specific, the cylinder part 915A shown in FIG. 19 may be provided on the chamber 2 side with respect to the window 412c, like the cylinder part 915 shown in FIG. 9. The cylinder part 915A may be formed as a hollow truncated cone, like the cylinder part 915 shown in FIG. 9. The cylinder part 915A may be formed to cover the optical path of the continuous laser beam emitted from the light source part 411. The cylinder part 915A may be disposed in the chamber 2 between the predetermined position P and the window 412c, like the cylinder part 915 shown in FIG. 9.

The opening 913A shown in FIG. 19 may be provided in the cylinder part 915A at a position at which the optical path of the continuous laser beam emitted from the light source part 411 intersects with the cylinder part 915A, like the opening 913 shown in FIG. 9. The opening 913A may be formed in one end of the cylinder part 915A on the predetermined position P side, like the opening 913 shown in FIG. 9. The opening 913A may be formed in the base surface of the end of the cylinder part 915A on the predetermined position P side, which is the upper base of the cylinder part 915A, like the opening 913 shown in FIG. 9.

As described above, the light receiving part 412 according to Embodiment 7 may be constituted by combining the transfer optical system 412d of the light receiving part 412 according to Embodiment 2 shown in FIG. 11 and the shielding body 91A equivalent to the shielding plate 91 according to Modification 3 of Embodiment 1 shown in FIG. 9. By this means, the EUV light generation apparatus 1 according to Embodiment 7 can more effectively prevent the light of the electromagnetic waves emitted from the plasma from entering the light receiving part 412 of the droplet measurement unit 41, than the EUV light generation apparatus 1 according to Embodiment 2. As a result, the EUV light generation apparatus 1 according to Embodiment 7 can further improve the energy stability of the outputted EUV light 252. Here, the other configuration of the EUV light generation apparatus 1 according to Embodiment 7 may be the same as the configuration of the EUV light generation apparatus 1 according to Embodiment 2 shown in FIG. 11.

12.2 Modification

Figure 20:
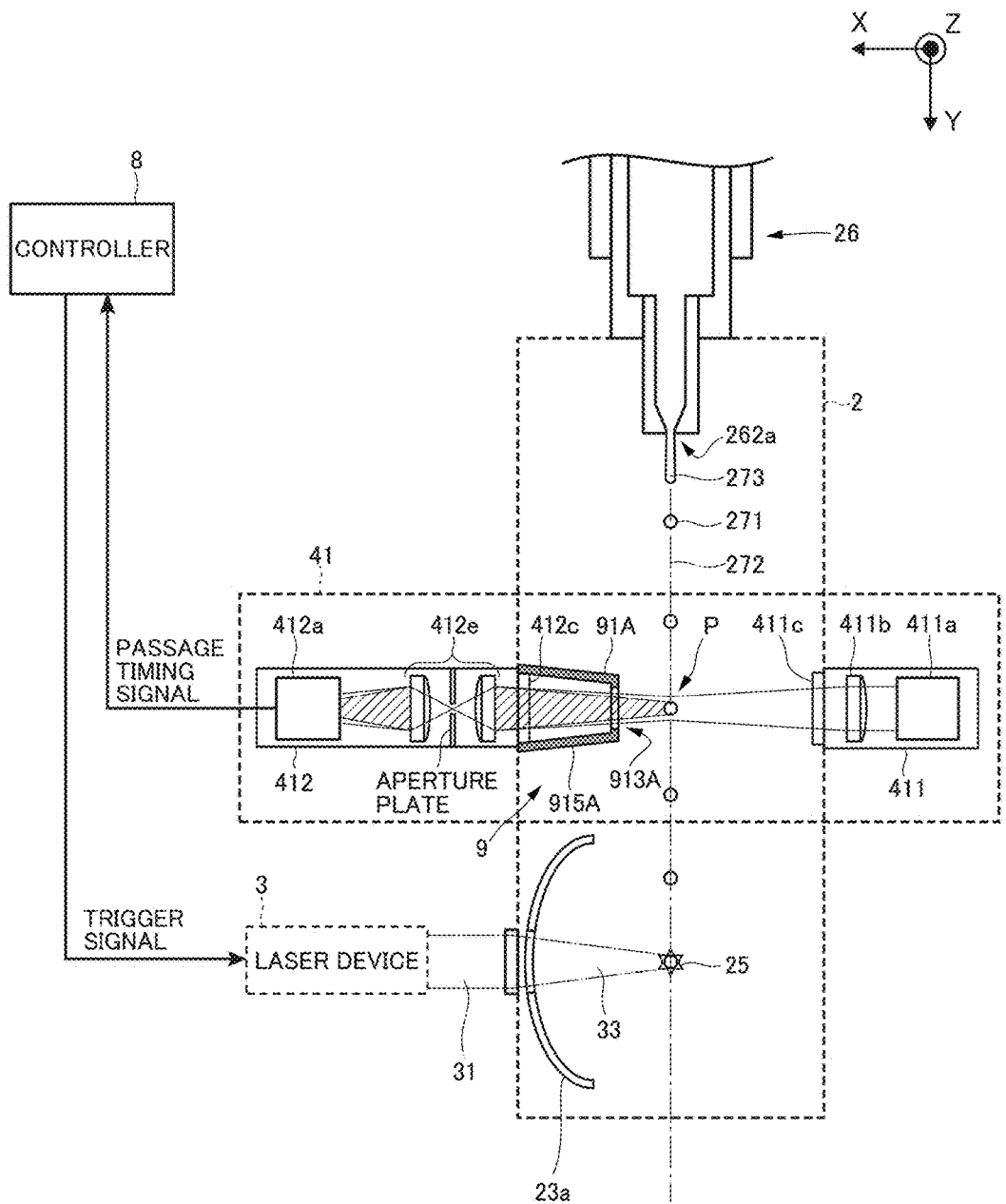
FIG. 20 is a drawing explaining the EUV light generation apparatus according to a modification of Embodiment 7.

FIG. 20 is a drawing explaining the EUV light generation apparatus 1 according to a modification of Embodiment 7. The light receiving part 412 according to the modification of Embodiment 7 may have a configuration where the shielding body 91A is added to the light receiving part 412 according to the modification of Embodiment 2 shown in FIG. 12. The shielding body 91A shown in FIG. 20 may have the same configuration as the shielding body 91A according to Embodiment 7 shown in FIG. 19.

As described above, the light receiving part 412 according to the modification of Embodiment 7 may be constituted by combining the spatial filter 412e of the light receiving part 412 according to the modification of Embodiment 2 shown in FIG. 12 and the shielding body 91A. By this means, the EUV light generation apparatus 1 according to the modification of Embodiment 7 can more effectively prevent the light of the electromagnetic waves emitted from the plasma from entering the light receiving part 412 of the droplet measurement unit 41, than the EUV light generation apparatus 1 according to the modification of Embodiment 2. As a result, the EUV light generation apparatus 1 according to the modification of Embodiment 7 can further improve the energy stability of the outputted EUV light 252. Here, the other configuration of the EUV light generation apparatus 1 according to the modification of Embodiment 7 may be the same as the configuration of the EUV light generation apparatus 1 according to the modification of Embodiment 2 shown in FIG. 12.

13. EUV Light Generation Apparatus According to Embodiment 8

Now, with reference to FIGS. 21 to 23, the EUV light generation apparatus 1 according to Embodiment 8 will be described. As described above, the transfer optical system 412d may be disposed between the window 412c and the optical sensor 412a, and transfer the image of the droplet 271 irradiated with the continuous laser beam, which is formed at the predetermined position P, to the light receiving surface of the optical sensor 412a. In addition, the spatial filter 412e may be disposed between the window 412c and the optical sensor 412a, and prevent the passage of the light which is not traveling on the optical path of the continuous laser beam. By this means, the transfer optical system 412d and the spatial filter 412e can prevent the light of the electromagnetic waves emitted from the plasma from entering the optical sensor 412a. That is, as described above with reference to FIG. 11 or 12, the EUV light generation apparatus 1 equipped with the transfer optical system 412*d* and the spatial filter 412*e* can prevent the light of the electromagnetic waves emitted from the plasma from entering the light receiving part 412 without the shielding member 9. However, when the noise of the electromagnetic waves emitted from the plasma enters the light receiving part 412, the EUV light generation apparatus 1 without the shielding member 9 as shown in FIG. 11 or FIG. 12 may not satisfactorily suppress the noise of the electromagnetic waves.

In addition, as described above, the line filter 42 provided on the signal wire through which the passage timing signal is transmitted may pass a signal component of the passage timing signal indicating a change in the optical intensity in response to the passage of the droplet 271, and attenuate the other signal components. By this means, even though the noise of the electromagnetic waves emitted from the plasma is mixed into the passage timing signal, the line filter 42 can attenuate the noise of the electromagnetic waves to prevent the noise of the electromagnetic waves from being transmitted to the controller 8. However, when a lot of amount of the light of the electromagnetic waves emitted from the plasma enters the light receiving part 412, the EUV light generation apparatus 1 without the shielding member 9 may not satisfactorily suppress the noise due to the light of the electromagnetic waves, even though having the line filter 42.

Figure 21:
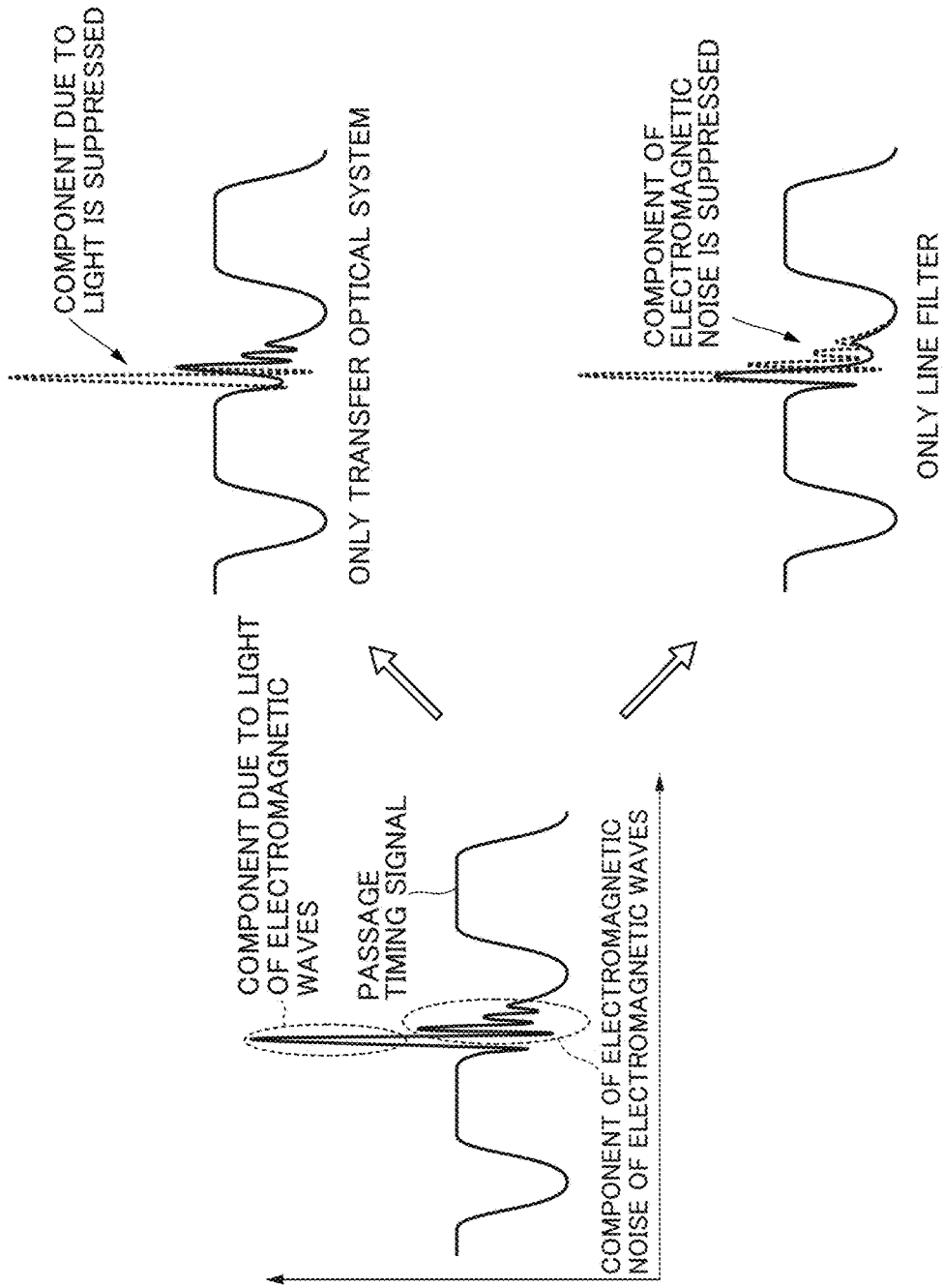
FIG. 21 is a drawing explaining noise components which may be contained in a passage timing signal.

FIG. 21 is a drawing explaining noise components which may be contained in the passage timing signal. For example, as shown in FIG. 21, noise which may be contained in the passage timing signal may be constituted by a noise component due to the light of the electromagnetic waves emitted from the plasma, and noise components of the electromagnetic waves except for the light. Therefore, the EUV light generation apparatus 1 equipped with only the transfer optical system 412*d* and the spatial filter 412*e* may suppress the noise component due to the light of the electromagnetic waves, but may not satisfactorily suppress the noise components of the electromagnetic waves except for the light. Likewise, the EUV light generation apparatus 1 equipped with the line filter 42 may suppress the noise components of the electromagnetic waves except for the light, but may not satisfactorily suppress the component due to the light of the electromagnetic waves.

The EUV light generation apparatus 1 according to Embodiment 8 may include the transfer optical system 412*d*, the spatial filter 412*e*, and the line filter 42, without the shielding member 9. The configuration of the EUV light generation apparatus 1 according to Embodiment 8, which is the same as that of the EUV light generation apparatus 1 according to Embodiment 2 shown in FIGS. 11 and 12, will not be described again here.

13.1 Configuration

Figure 22:
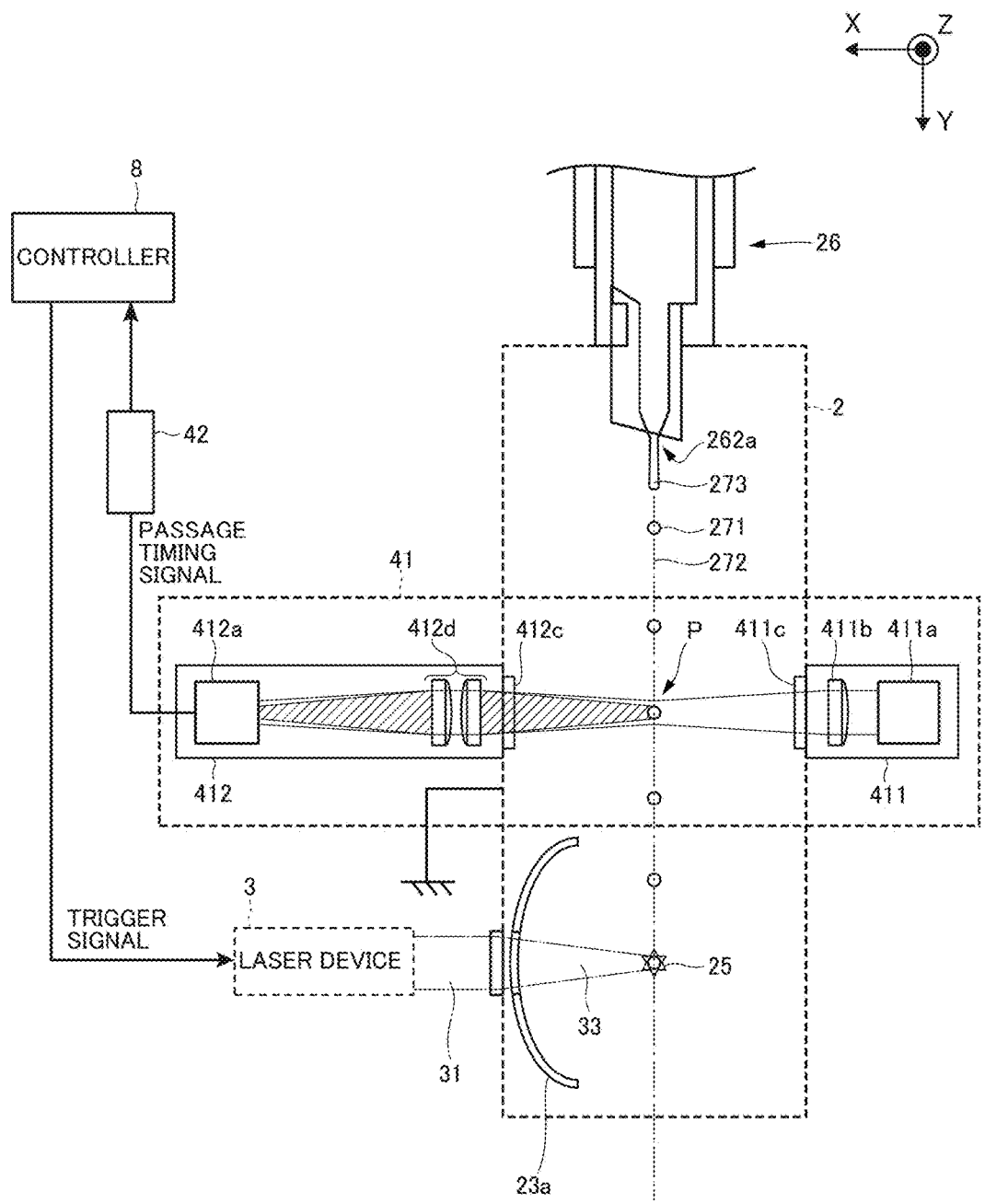
FIG. 22 is a drawing explaining the EUV light generation apparatus according to Embodiment 8.

FIG. 22 is a drawing explaining the EUV light generation apparatus 1 according to Embodiment 8. The EUV light generation apparatus 1 according to Embodiment 8 may have a configuration where the line filter 42 is added to the EUV light generation apparatus 1 according to Embodiment 2 shown in FIG. 11. The configuration of the line filter 42 shown in FIG. 22 may be the same as that of the line filter 42 according to Embodiment 4 shown in FIG. 16. The wall of the chamber 2 shown in FIG. 22 may be connected to the ground.

As described above, the EUV light generation apparatus 1 according to Embodiment 8 may include both the transfer optical system 412*d* according to Embodiment 2 shown in FIG. 11 and the line filter 42 according to Embodiment 4 shown in FIG. 16. By this means, even though not including the shielding member 9, the EUV light generation apparatus 1 according to Embodiment 8 can satisfactorily suppress both the noise component due to the light of the electromagnetic waves emitted from the plasma and the noise components of the electromagnetic waves except for the light of the passage timing signal. As a result, the EUV light generation apparatus 1 according to Embodiment 8 can further improve the energy stability of the outputted EUV light 252. Here, the other configuration of the EUV light generation apparatus 1 according to Embodiment 8 may be the same as the configuration of the EUV light generation apparatus 1 according to Embodiment 2 shown in FIG. 11.

13.2 Modification

Figure 23:
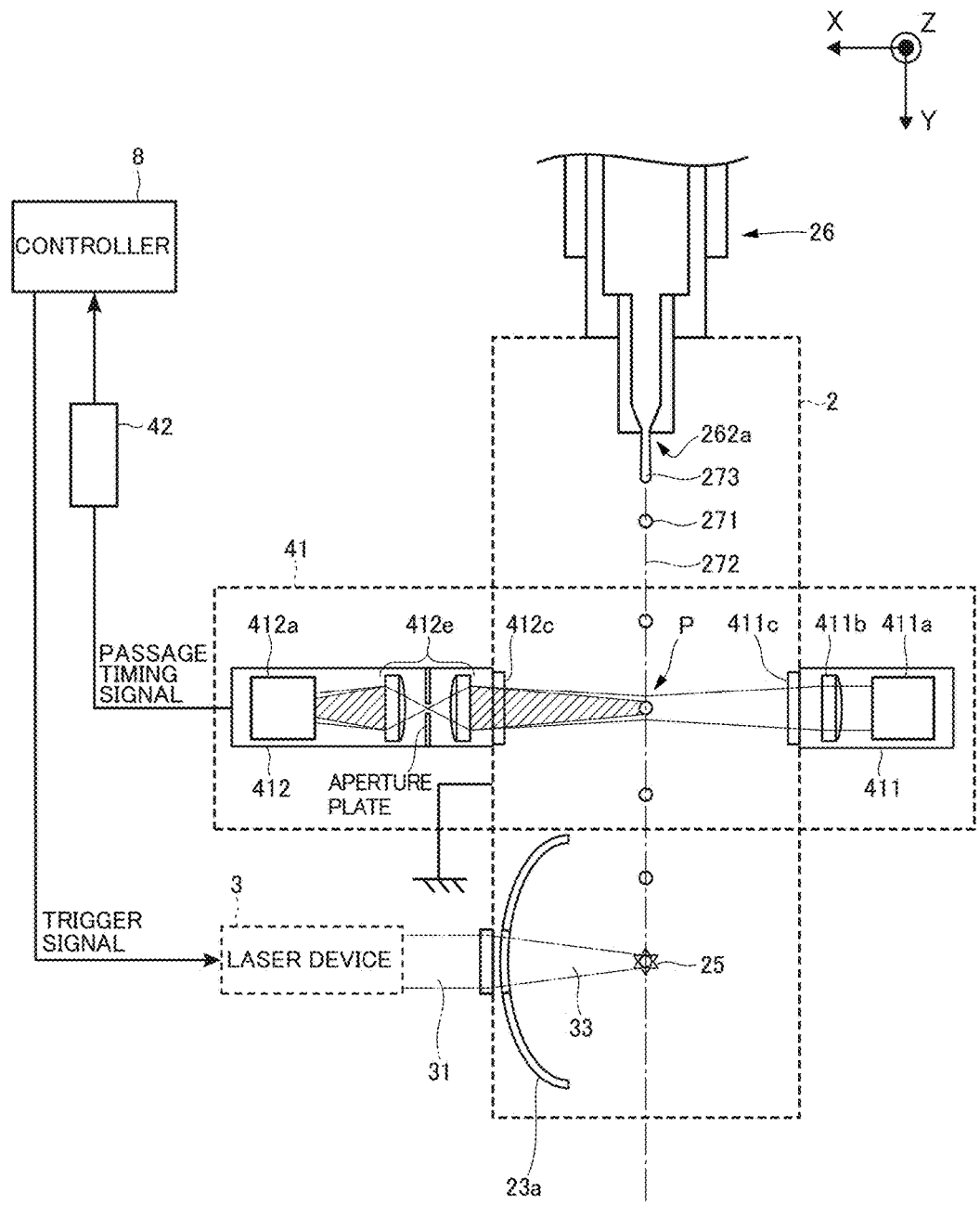
FIG. 23 is a drawing explaining the EUV light generation apparatus according to a modification of Embodiment 8.

FIG. 23 is a drawing explaining the EUV light generation apparatus 1 according to a modification of Embodiment 8. The EUV light generation apparatus 1 according to the modification of Embodiment 8 may have a configuration where the line filter 42 is added to the EUV light generation apparatus 1 according to the modification of Embodiment 2 shown in FIG. 12. The configuration of the line filter 42 shown in FIG. 23 may be the same as that of the line filter 42 according to Embodiment 7 shown in FIG. 22. The wall of the chamber 2 shown in FIG. 23 may be connected to the ground.

As described above, the EUV light generation apparatus 1 according to the modification of Embodiment 8 may include both the spatial filter 412*e* according to the modification of Embodiment 2 shown in FIG. 12, and the line filter 42. By this means, even though not including the shielding member 9, the EUV light generation apparatus 1 according to the modification of Embodiment 8 can satisfactorily suppress both the noise component due to the light of the electromagnetic waves emitted from the plasma and the noise components of the electromagnetic waves except for the light of the passage timing signal. As a result, the EUV light generation apparatus 1 according to the modification of Embodiment 8 can further improve the energy stability of the outputted EUV light 252. Here, the other configuration of the EUV light generation apparatus 1 according to the modification of Embodiment 8 may be the same as the configuration of the EUV light generation apparatus 1 according to the modification of Embodiment 2 shown in FIG. 12.

14. EUV Light Generation Apparatus According to Embodiment 9

Now, with reference to FIGS. 24 and 25, the EUV light generation apparatus 1 according to Embodiment 9 will be described. The EUV light generation apparatus 1 according to Embodiment 9 may have a configuration where a gas lock mechanism 910 is added to the EUV light generation apparatus 1 according to Modification 3 of Embodiment 1 shown in FIG. 9. Then, in the EUV light generation apparatus 1 according to Embodiment 9, the shielding body 91A equivalent to the shielding plate 91 according to Modification 3 of Embodiment 1 shown in FIG. 9 may be formed as part of the gas lock mechanism 910. In addition, the EUV light generation apparatus 1 according to Embodiment 9 may be different in the configuration of the light receiving part 412 from the EUV light generation apparatus 1 according to Modification 3 of Embodiment 1 shown in FIG. 9. The configuration of the EUV light generation apparatus 1 according to Embodiment 9, which is the same as that of the EUV light generation apparatus 1 according to Modification 3 of Embodiment 1 shown in FIG. 9, will not be described again here.

14.1 Configuration

Figure 24:
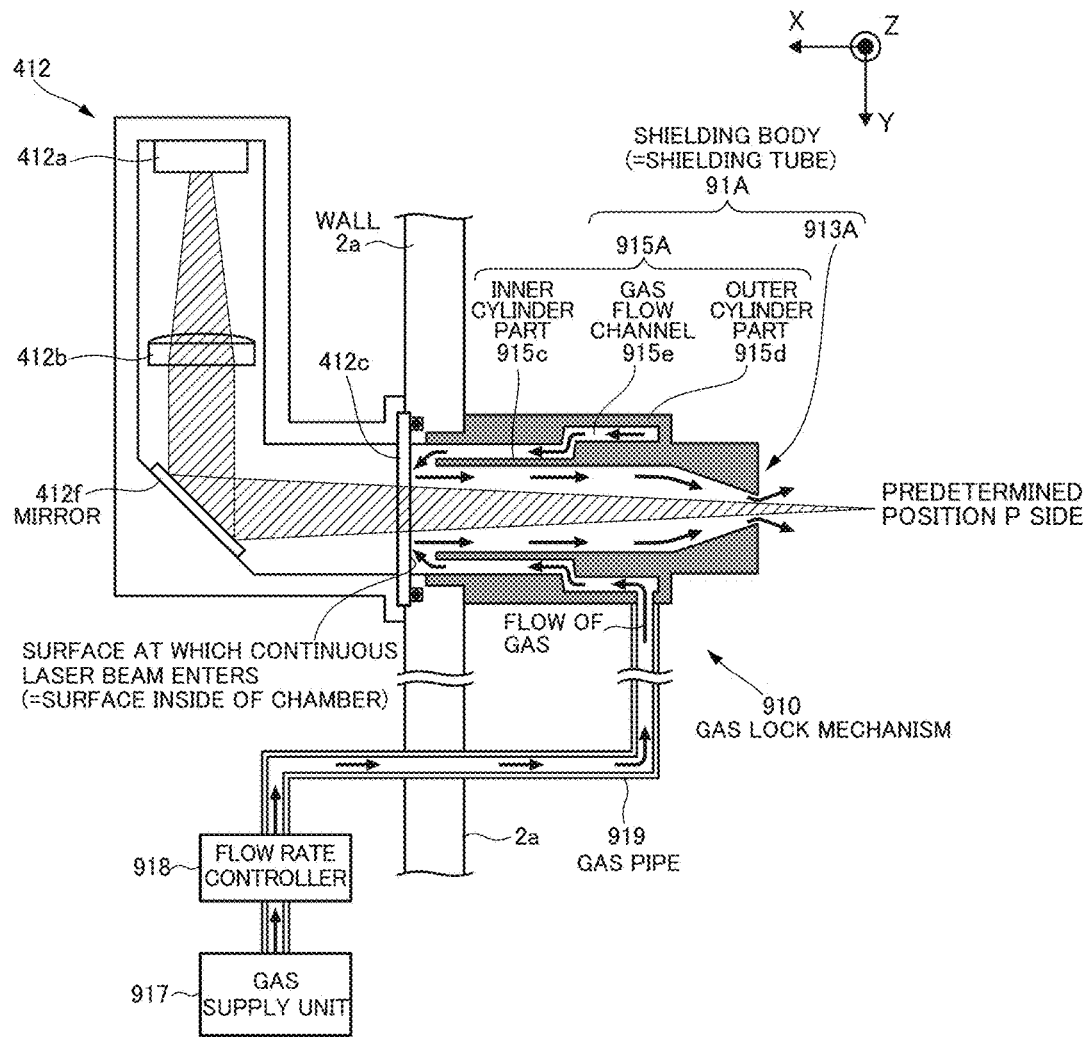
FIG. 24 is a drawing explaining the EUV light generation apparatus according to Embodiment 9.

FIG. 24 is a drawing explaining the EUV light generation apparatus 1 according to Embodiment 9. When the droplet 271 irradiated with the pulsed laser beam 33 is turned into plasma so that the EUV light 252 is generated, the droplet 271 may be broken into a plurality of fine targets 27 and diffused due to the impact of the expanding pressure of the plasma. Part of the diffused targets 27 may fly to the window 412c of the light receiving part 412 as debris. When the debris adheres to the window 412c, the continuous laser beam emitted from the light source part 411 may be diffusely reflected by the adherent debris on the window 412c. In this case, the amount of the continuous laser beam entering the optical sensor 412a is reduced, and therefore an appropriate passage timing signal may not be outputted. The gas lock mechanism 910 shown in FIG. 24 may be configured to prevent the debris from adhering to the window 412c of the light receiving part 420. The gas lock mechanism 910 may include a gas supply unit 917, a flow rate controller 918, a gas pipe 919, and a shielding tube.

The gas supply unit 917 may be a device configured to supply gas into the shielding tube. The gas supplied into the shielding tube may have a high reactivity with the debris caused by the plasma generation. When the target 27 is tin, the gas supplied into the shielding tube may be gas containing hydrogen, such as hydrogen gas or hydrogen radical. When the debris of tin reacts with the gas containing hydrogen, stannane ($SnH_4$) gas may be generated. The gas supply unit 917 may be located outside of the chamber 2. The gas supply unit 917 may be connected to the shielding tube via the gas pipe 919. The operation of the gas supply unit 917 may be controlled by the controller 8.

The flow rate controller 918 may be a device configured to control the flow rate of the gas supplied from the gas supply unit 917 into the shielding tube. The flow rate controller 918 may be a valve or an orifice. The flow rate controller 918 may be provided on the gas pipe 919. The flow rate controller 918 may regulate the flow of the gas through the gas pipe 919 to control the flow rate of the gas supplied from the gas supply unit 917 into the shielding tube. The operation of the flow rate controller 918 may be controlled by the controller 8.

The shielding tube in the gas lock mechanism 910 may be a member to protect the window 412c from the debris flying toward the window 412c due to the plasma generation. The shielding tube may be constituted by the shielding body 91A. The shielding body 91A constituting the shielding tube may include the cylinder part 915A and the opening 913A.

The cylinder part 915A shown in FIG. 24 may have a double cylinder structure formed by an inner cylinder part 915c and an outer cylinder part 915d. The respective central axes of the inner cylinder part 915c and the outer cylinder part 915d may substantially match the axis of the optical path of the continuous laser beam emitted from the light source part 411.

One end of the inner cylinder part 915c may face a surface of the window 412c on the chamber 2 side. The continuous laser beam emitted from the light source part 411 may enter the surface of the window 412c on the chamber 2 side. At least part of the base surface of the one end of the inner cylinder part 915c may be spaced from the surface of the window 412c at which the continuous laser beam enters and the inner surface of the outer cylinder part 915d. The other end of the inner cylinder part 915c may face the predetermined position P in the chamber 2. The opening 913A may be formed in the base surface of the other end of the inner cylinder part 915c. The internal space of the inner cylinder part 915c may communicate with the internal space of the chamber 2 via the opening 913A. The inner diameter of the other end of the inner cylinder part 915c may be reduced from the window 412c side to the opening 913A.

One end of the outer cylinder part 915d may be connected to a wall 2a of the chamber 2. The base surface of the one end of the outer cylinder part 915d may contact the wall 2a of the chamber 2. The space between the inner surface of the outer cylinder part 915d and the outer surface of the inner cylinder part 915c may be closed on or around the base end of the other end of the outer cylinder part 915d. An air inlet is formed in the outer surface of the outer cylinder part 915d on the predetermined position P side. The gas pipe 919 may be connected to the air inlet of the outer cylinder part 915d.

A gas flow channel 915e may be defined as space between the inner cylinder part 915c and the outer cylinder part 915d. The gas flow channel 915e may be formed such that the gas entering from the air inlet of the outer cylinder part 915d flows to the window 412c along the inner surface of the outer cylinder part 915d. The gas flow channel 915e may be formed across the whole circumference of the inner surface of the outer cylinder part 915d. The gas flow channel 915e may be formed to extend from the predetermined position P side to the window 421c side. The gas flow channel 915e may communicate with the internal space of the inner cylinder part 915c via the gap between the surface of the window 412c at which the continuous laser beam enters and the base surface of the one end of the inner cylinder part 915c.

The opening 913A shown in FIG. 24 may be formed to allow the continuous laser beam emitted from the light source part 411 to pass therethrough. The shape of the opening 913A may be similar to the cross-section shape of the continuous laser beam passing through the opening 913A, and, for example, may be circular. The diameter of the circular opening 913A may be, for example, several millimeters. As described above, the opening 913A may be formed at the end of the inner cylinder part 915c of the cylinder part 915A on the predetermined position P side.

The other configuration of the shielding body 91A shown in FIG. 24 may be the same as the configuration of the shielding body 91A according to Embodiment 7 shown in FIG. 19.

The light receiving part 412 shown in FIG. 24 may include a mirror 412f, in addition to the optical sensor 412a, the light receiving optical system 412b, and the window 412c. The mirror 412f may be disposed on the optical path of the continuous laser beam emitted from the light source part 411 and passing through the window 412c. The mirror 412f may be disposed to face both the window 412c and the light receiving optical system 412b. The mirror 412f may reflect the continuous laser beam having passed through the window 412c and guide the beam to the light receiving optical system 412b. The other configuration of the light receiving part 412 shown in FIG. 24 may be the same as the configuration of the light receiving part 412 according to Modification 3 of Embodiment 1 shown in FIG. 9.

14.2 Operation

The operation of the EUV light generation apparatus 1 according to Embodiment 9 will be described. To be more specific, the operation of the gas lock mechanism 910 will be described. Here, the operation of the EUV light generation apparatus 1 according to Embodiment 9, which is the same as that of the EUV light generation apparatus 1 according to Modification 3 of Embodiment 1 shown in FIG. 9, will not be described again here.

The gas supply unit 917 may flow the gas to be supplied into the cylinder part 915A of the shielding body 91A constituting the shielding tube into the gas pipe 919, according to the control of the controller 8. The flow rate controller 918 may control the flow rate of the gas flowing through the gas pipe 919 to supply a predetermined amount of the gas into the cylinder part 915A, according to the control of the controller 8.

The predetermined amount of the gas controlled by the flow rate controller 918 may flow from the gas pipe 919 into the air inlet provided in the outer cylinder part 915d. The gas having flowed into the air inlet may flow through the gas flow channel 915e and flow into the inner cylinder part 915c. At this time, the gas to flow into the inner cylinder part 915c may flow from the whole circumference of the window 412c to the center of the window 412c, being jetted to the window 412c.

The gas jetted to the window 412c may flow in the internal space of the inner cylinder part 915c from the window 412c side toward the predetermined position P side, and be discharged from the opening 913A. The gas being discharged from the opening 913A may allow the debris flying toward the window 412c due to the plasma generation to be moved away from the window 412c.

As described above, the gas lock mechanism 910 may supply the gas into the cylinder part 915A of the shielding body 91A, and discharge the gas in the cylinder part 915A from the opening 913A. By this means, the gas lock mechanism 910 can prevent the debris from adhering to the window 412c.

In addition, the light of the electromagnetic waves emitted from the plasma may be blocked by the cylinder part 915A of the shielding body 91A. Meanwhile, the continuous laser beam emitted from the light source part 411 may pass through the opening 913A of the shielding body 91A, transmit through the window 412c, be reflected from the mirror 412f toward the light receiving optical system 412b, and then enter the optical sensor 412a.

14.3 Effect

In the EUV light generation apparatus 1 according to Embodiment 9, the shielding body 91A may also serve as a shielding tube of the gas lock mechanism 910. Therefore, the EUV light generation apparatus 1 according to Embodiment 9 can prevent a decrease in the amount of the continuous laser beam entering the optical sensor 412a due to the adhesion of the debris to the window 412c. Moreover, the gas lock mechanism 910 can jet the gas having a high reactivity with the debris to the window 412c, and therefore, even if the debris adheres to the window 412c, the EUV light generation apparatus 1 according to Embodiment 9 can etch the adherent debris on the window 412c by the gas. Therefore, the EUV light generation apparatus 1 according to Embodiment 9 can more effectively prevent a decrease in the amount of the continuous laser beam emitted from the light source part 411 and entering the optical sensor 412a. By this means, in the EUV light generation apparatus 1 according to Embodiment 9, the light receiving part 412 can stably receive the continuous laser beam emitted from the light source part 411, and therefore the droplet measurement unit 41 can more stably measure the droplet 271. As a result, the EUV light generation apparatus 1 can further improve the energy stability of the outputted EUV light 252. Here, the other configuration of the EUV light generation apparatus 1 according to Embodiment 9 may be the same as the configuration of the EUV light generation apparatus 1 according to Modification 3 of Embodiment 1 shown in FIG. 9.

14.4 Modification

Figure 25:
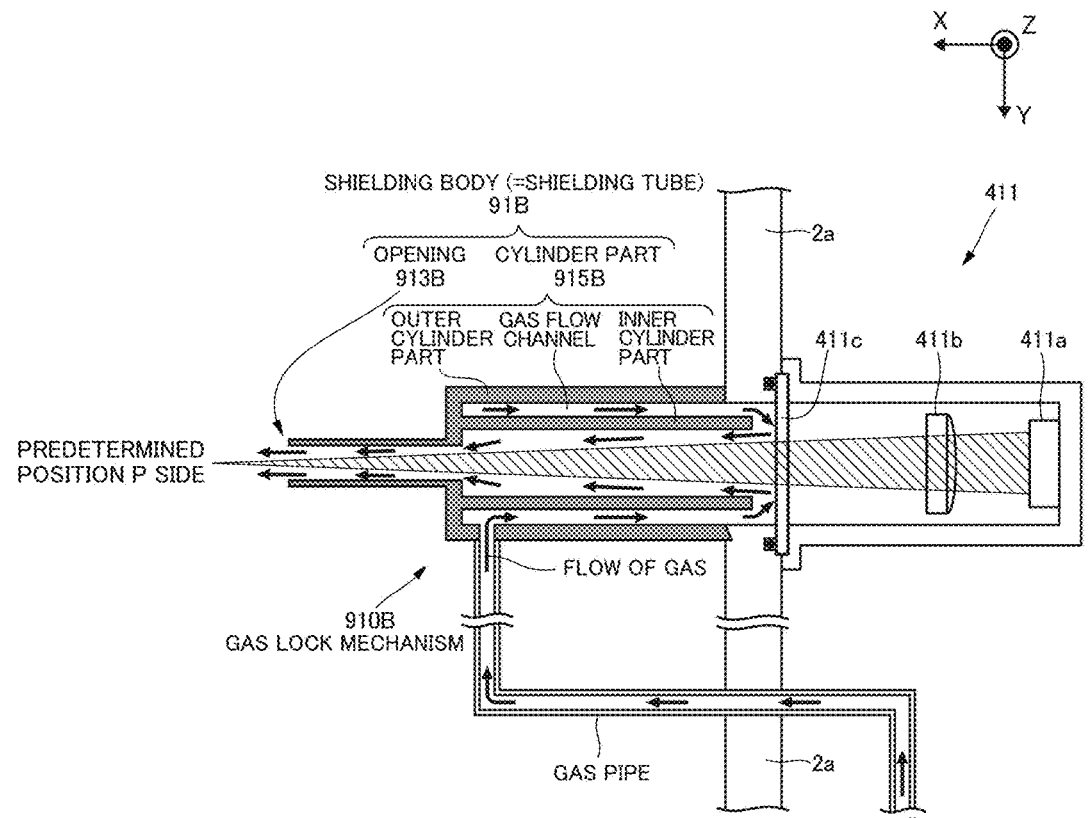
FIG. 25 is a drawing explaining the EUV light generation apparatus according to a modification of Embodiment 9.

FIG. 25 is a drawing explaining the EUV light generation apparatus 1 according to a modification of Embodiment 9. In the EUV light generation apparatus 1 according to the modification of Embodiment 9, the gas lock mechanism 910 according to Embodiment 9 shown in FIG. 24 may be provided not only in the light receiving part 412 but also in the light source part 411. A gas lock mechanism 910B provided in the light source part 411 may have the same configuration as the gas lock mechanism 910 of the EUV light generation apparatus 1 according to Embodiment 9 shown in FIG. 24. That is, the shielding tube of the gas lock mechanism 910B shown in FIG. 25 may be constituted by a shielding body 91B. The shielding body 91B shown in FIG. 25 may include a cylinder part 915B and an opening 913B. The cylinder part 915B and the opening 913B may have the configurations which are the same as those of the cylinder part 915A and the opening 913A of the shielding body 91A shown in FIG. 24, respectively.

The EUV light generation apparatus 1 according to the modification of Embodiment 9 may be provided with the gas lock mechanism 910B also for the light source part 411, and therefore can prevent a decrease in the amount of the continuous laser beam emitted from the light source part 411 due to the adhesion of the debris to the window 411c. By this means, in the EUV light generation apparatus 1 according to the modification of Embodiment 9, the light source part 411 can stably emit an appropriate amount of the continuous laser beam, and therefore the droplet measurement unit 41 can more stably measure the droplet 271. As a result, the EUV light generation apparatus 1 according to the modification of Embodiment 9 can further improve the energy stability of the outputted EUV light 252. Here, the other configuration of the EUV light generation apparatus 1 according to the modification of Embodiment 9 may be the same as the configuration of the EUV light generation apparatus 1 according to Embodiment 9 shown in FIG. 24.

15. EUV Light Generation Apparatus According to Embodiment 10

Now, with reference to FIGS. 26A and 26B, the EUV light generation apparatus 1 according to Embodiment 10 will be described. The EUV light generation apparatus 1 according to Embodiment 10 may be different in the configuration of the light receiving part 412 from the EUV light generation apparatus 1 according to Embodiment 9 shown in FIG. 24. In addition, the EUV light generation apparatus 1 according to Embodiment 10 may have a configuration where the shield 92 and the optical filter 916 are added to the EUV light generation apparatus 1 according to Embodiment 9 shown in FIG. 24. Moreover, the EUV light generation apparatus 1 according to Embodiment 10 may be different in the configuration of the shielding body 91A constituting the shielding tube from the EUV light generation apparatus 1 according to Embodiment 9 shown in FIG. 24. The configuration of the EUV light generation apparatus 1 according to Embodiment 10, which is the same as that of the EUV light generation apparatus 1 according to Embodiment 9 shown in FIG. 24, will not be described again here.

Figure 26A:
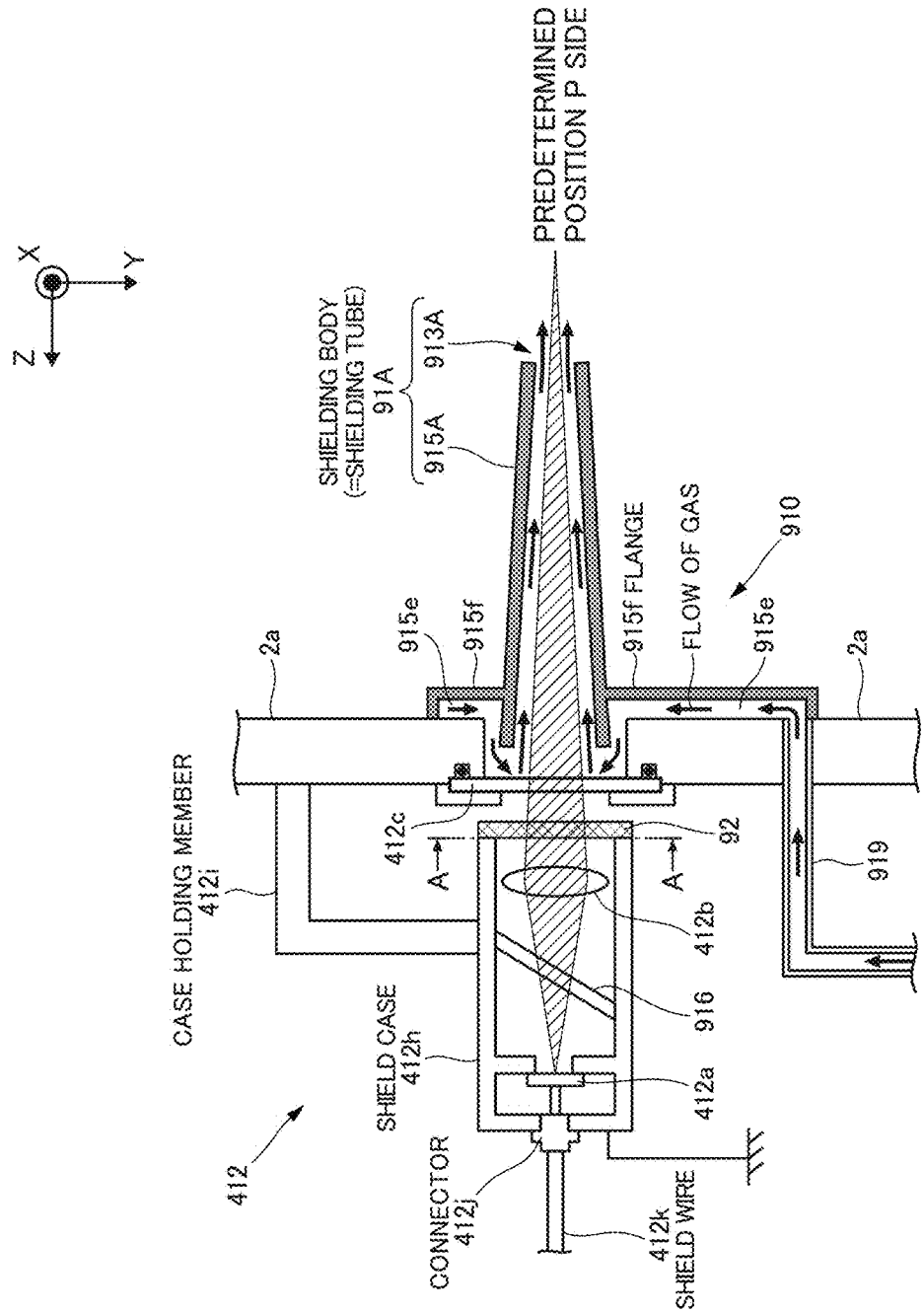
FIG. 26A is a drawing explaining the EUV light generation apparatus according to Embodiment 10.
Figure 26:
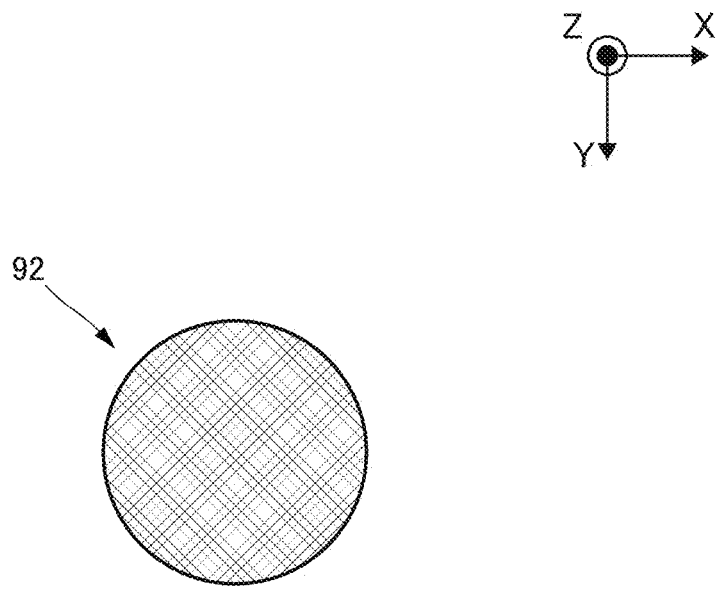
FIG. 26B is an enlarged cross sectional view of a shield, taken along line A-A shown in FIG. 26A.
Figure 27:
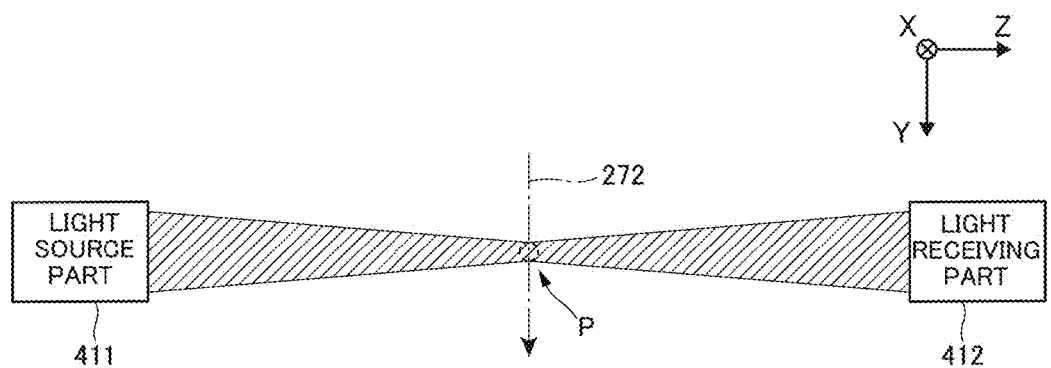
FIG. 27A is a drawing explaining a continuous laser beam emitted from a light source part of the EUV light generation apparatus according to Embodiment 11.
FIG. 27B is a drawing explaining the beam width of the continuous laser beam shown in FIG. 27A in an X-axis direction and a Y-axis direction.
FIG. 27C is a drawing explaining a cross sectional shape of the continuous laser beam shown in FIG. 27A.
Figure 27:
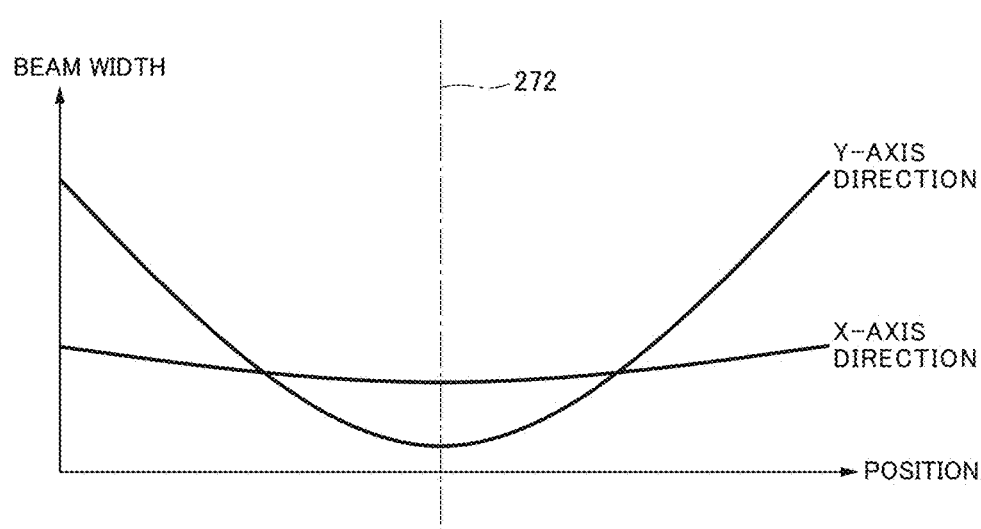
Figure 27:
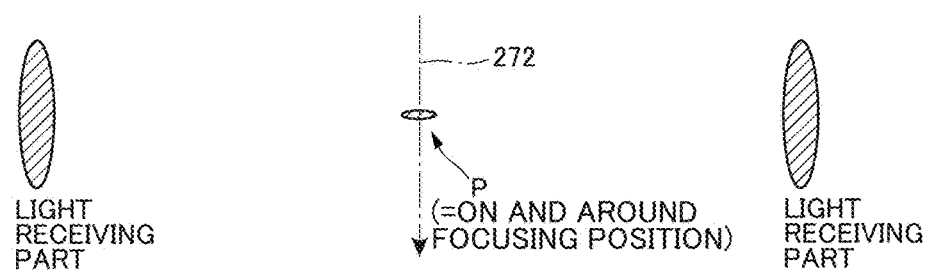
Figure 28:
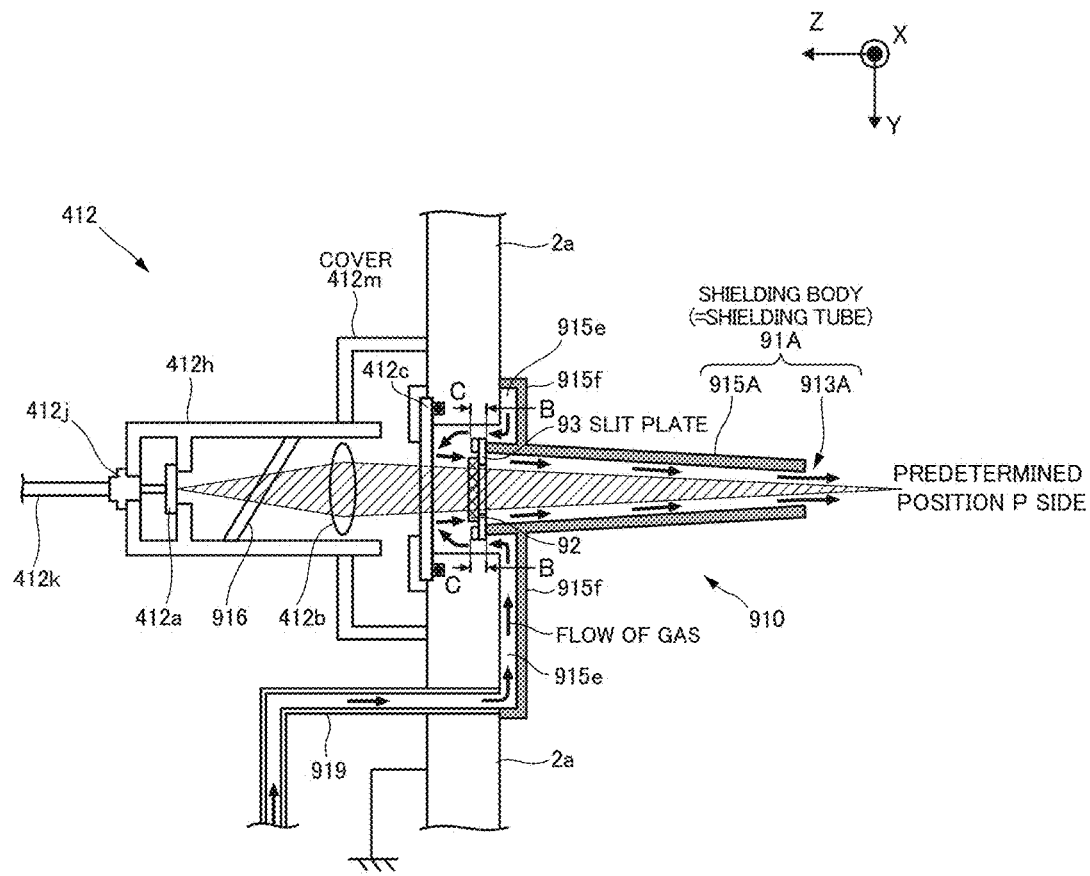
FIG. 28A is a drawing explaining a light receiving part of the EUV light generation apparatus according to Embodiment 11.
FIG. 28B is an enlarged cross sectional view showing the shield and a slit plate, taken along line B-B shown in FIG. 28A.
FIG. 28C is an enlarged cross sectional view showing the shield and the slit plate, taken along line C-C shown in FIG. 28A.
Figure 28:
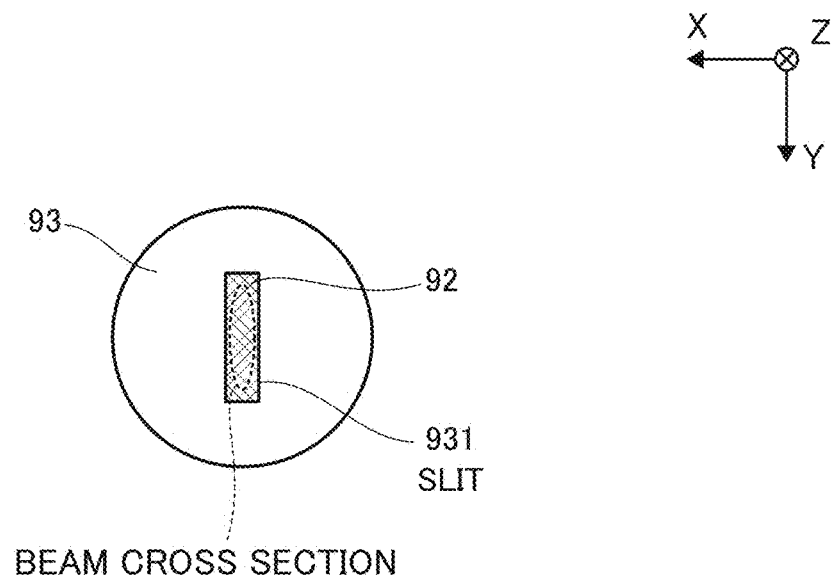
Figure 28:
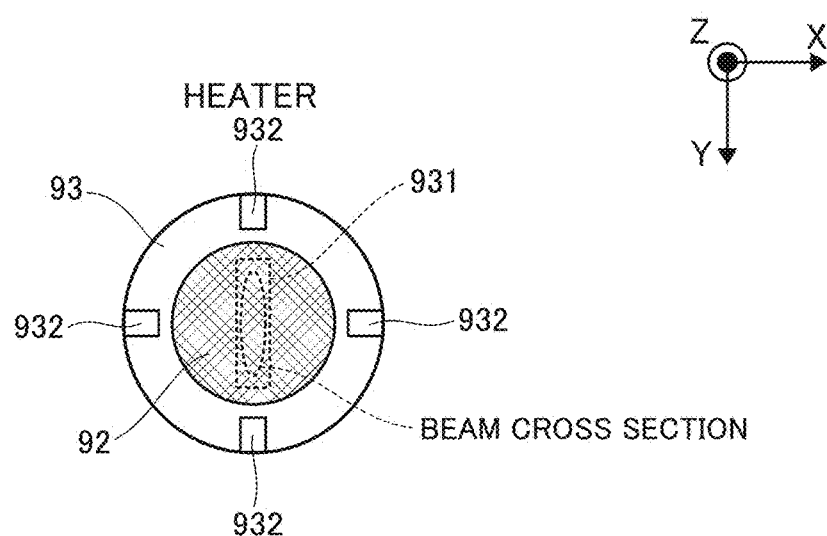

FIG. 26A is a drawing explaining the EUV light generation apparatus 1 according to Embodiment 10. FIG. 26B is an enlarged cross sectional view showing the shield 92 taken along line A-A in FIG. 26A. The light receiving part 412 shown in FIG. 26A may include a shield case 412h, a case holding member 412i, a connector 412j, and a shield wire 412k, in addition to the optical sensor 412a, the light receiving optical system 412b, and the window 412c.

The shield case 412h may be a case to accommodate the optical sensor 412a, the light receiving optical system 412b, and the optical filter 916. The shield case 412h may be formed by using a material that attenuates the noise of the electromagnetic waves emitted from the plasma. The shield case 412h may be formed by using an electrically conducting material. The shield case 412h may be connected to the wall 2a of the chamber 2 via the case holding member 412i. The shield case 412h may be disposed outside of the chamber 2 to face the window 412c, on the optical path of the continuous laser beam emitted from the light source part 411. An entrance at which the continuous laser beam emitted from the light source part 411 enters may be formed in the base surface of one end of the shield case 412h. The entrance of the shield case 412h may be disposed to face the surface of the window 412c outside of the chamber 2. The shield 92 may be provided on the entrance of the shield case 412h. The connector 412j may be provided in the base surface of the other end of the shield case 412h so as to close the base surface. The shield case 412h may be connected to the ground. The shield case 412h may be connected directly to the ground. When the case holding member 412i is made of an electrically conducting material, and the wall 2a of the chamber 2 is connected to the ground, the shield case 412h may be connected to the ground via the case holding member 412i and the wall 2a.

The case holding member 412i may be fixed to the shield case 412h and the wall 2a of the chamber 2, and configured to hold the shield case 412h to the wall 2a of the chamber 2. The case holding member 412i may be formed by using an electrically conducting material. The case holding member 412i may be electrically connected to the shield case 412h and the wall 2a of the chamber 2.

The light receiving optical system 412b may be constituted by an imaging lens. The light receiving optical system 412b may be disposed between the window 412c and the optical sensor 412a, on the optical path of the continuous laser beam emitted from the light source part 410.

The connector 412j may electrically connect an output terminal of the optical sensor 412a to the shield wire 412k. The connector 412j may be a BNC connector. The connector 412j may be fixed to the base surface of the end of the shield case 412h opposite to the entrance of the shield case 412h. A jacket of the connector 412j may be connected to the ground via the shield case 412h. By this means, the connector 412j may be shielded.

The shield wire 412k may be a signal wire to transmit the passage timing signal outputted from the optical sensor 412a to the controller 8. The shield wire 412k may be a BNC cable. The shield layer of the shield wire 412k may be connected to the ground via the jacket of the connector 412j and the shield case 412h. By this means, the shield wire 412k may be shielded. The other configuration of the light receiving part 412 shown in FIG. 26A may be the same as the configuration of the light receiving part 412 according to Embodiment 9 shown in FIG. 24.

As described above, the shield 92 shown in FIGS. 26A and 26B may be formed by using at least one of mesh metal, punched metal, and expanded metal. The pore size of the shield 92 may be about 1/100 of the wavelength of the noise of the electromagnetic waves. For example, when the frequency of the high frequency component of the noise of the electromagnetic waves is 1 GHz, the wavelength of the noise of the electromagnetic waves is 30 cm, and therefore the pore size of the shield 92 may be about 3 mm. As shown in FIG. 26B, the shield 92 may be formed as an approximately circular plate.

The shield 92 may be disposed between the light receiving optical system 412b and the window 412c, on the optical path of the continuous laser beam emitted from the light source part 411. The shield 92 may be disposed between the window 412c and the optical sensor 412a, outside of the chamber 2. The shield 92 may be disposed to close the entrance of the shield case 412h. The shield 92 may be disposed in an immediate vicinity of the light receiving optical system 412b constituted by the imaging lens. It is preferred that the shield 92 is disposed on the entrance of the shield case 412h at a position to increase the diameter of the continuous laser beam having passed through the window 412c as large as possible and to decrease the numerical aperture (NA) of the light receiving optical system 412b as small as possible. The other configuration of the shield 92 shown in FIGS. 26A and 26B may be the same as the configuration of the shield 92 according to Embodiment 4 shown in FIG. 16.

The optical filter 916 shown in FIG. 26A may be a bandpass filter configured to allow the light having the wavelength of the continuous laser beam emitted from the light source part 411 to transmit therethrough with a high transmittance. The optical filter 916 may be disposed between the light receiving optical system 412b and the optical sensor 412a, on the optical path of the continuous laser beam emitted from the light source 411. The other configuration of the optical filter 916 shown in FIG. 26A may be the same as the configuration of the optical filter 916 according to Modification 4 of Embodiment 1 shown in FIG. 10.

The cylinder part 915A of the shielding body 91A constituting the shielding tube shown in FIG. 26A may have not the double cylinder structure but a single cylinder structure. The cylinder part 915A may be formed by using a cylinder having a tapered cross section to decrease the inner diameter from the window 412c toward the predetermined position P. A flange 915f may be formed at the end of the cylinder part 915A on the window 412c side. The flange 915f may define the gas flow channel 915e between the inside wall surface of the wall 2a of the chamber 2 and the flange 915f. The flange 915f may be spaced from the inside wall surface of the wall 2a of the chamber 2 and extend along the inside wall surface. The end of the flange 915f may be fixed to the inside wall surface. An air inlet may be provided in the end of the flange 915f. The gas pipe 919 may be connected to the air inlet of the flange 915f. The space between the flange 915f and the inside wall surface of the wall 2a of the chamber 2 may form the gas flow channel 915e. The other configuration of the shielding body 91A shown in FIG. 26A may be the same as the configuration of the shielding body 91A according to Embodiment 9 shown in FIG. 24.

As described above, the EUV light generation apparatus 1 according to Embodiment 10 includes the shield 92, and therefore can prevent the noise of the electromagnetic waves emitted from the plasma from entering the optical sensor 412a. Moreover, the optical sensor 412a, the light receiving optical system 412b and the optical filter 916 are accommodated in the shield case 412h connected to the ground, and therefore the EUV light generation apparatus 1 according to Embodiment 10 can more effectively prevent the noise of the electromagnetic waves from entering the optical sensor 412a. Moreover, in the EUV light generation apparatus 1 according to Embodiment 1, the optical sensor 412a is connected to the controller 8 through the shielded connector 412j and the shield wire 412k, and therefore the noise of the electromagnetic waves may not be easy to be mixed into the passage timing signal outputted from the optical sensor 412a. Therefore, the EUV light generation apparatus 1 according to Embodiment 10 can further improve the energy stability of the outputted EUV light 252. Here, the other configuration of the EUV light generation apparatus 1 according to Embodiment 10 may be the same as the configuration of the EUV light generation apparatus 1 according to Embodiment 9 shown in FIG. 24.

Here, in the EUV light generation apparatus 1 according to Embodiment 10, the light receiving optical system 412b of the light receiving part 412 may be constituted by not the imaging lens but a relay lens optical system. In this case, when the path length of the relay lens optical system is relatively long, the shield 92 may be disposed not on the entrance of the shield case 412h, but between the plurality of lenses of the relay lens optical system. The optical filter 916 may be omitted from the EUV light generation apparatus 1 according to Embodiment 10. In the EUV light generation apparatus 1 according to Embodiment 10, also the light source part 411 may be provided with components equivalent to the shield case 412h, the case holding member 412i, the connector 412j, the shield wire 412k, the shield 92, the optical filter 916, and the gas lock mechanism 910.

16. EUV Light Generation Apparatus According to Embodiment 11

With reference to FIGS. 27A to 28C, the EUV light generation apparatus 1 according to Embodiment 11 will be described. The EUV light generation apparatus 1 according to Embodiment 11 may be different in the configuration of the light source part 411 from the EUV light generation apparatus 1 according to Embodiment shown in FIGS. 26A and 26B. In addition, the EUV light generation apparatus 1 according to Embodiment 11 may be different in the configuration of the light receiving part 412 from the EUV light generation apparatus 1 according to Embodiment shown in FIGS. 26A and 26B. Moreover, the EUV light generation apparatus 1 according to Embodiment 11 may be different in the configuration of the gas lock mechanism 910 from the EUV light generation apparatus 1 according to Embodiment 10 shown in FIGS. 26A and 26B. Furthermore, the EUV light generation apparatus 1 according to Embodiment 11 may be different in the configuration of the shield 92 from the EUV light generation apparatus 1 according to Embodiment 10 shown in FIGS. 26A and 26B. The configuration of the EUV light generation apparatus 1 according to Embodiment 11, which is the same as that of the EUV light generation apparatus 1 according to Embodiment 10 shown in FIGS. 26A and 26B, will not be described again here.

16.1 Configuration

FIG. 27A is a drawing explaining the continuous laser beam emitted from the light source part 411 of the EUV light generation apparatus 1 according to Embodiment 11. FIG. 27B is a drawing explaining the width of the continuous laser beam shown in FIG. 27A, in the X-axis direction and the Y-axis direction. FIG. 27C is a drawing explaining the cross-sectional shape of the continuous laser beam shown in FIG. 27A. The light source part 411 shown in FIG. 27A may emit the continuous laser beam with astigmatism. To be more specific, the illumination optical system 411b of the light source part 411 may convert the continuous laser beam emitted from the light source 411a into a continuous laser beam with astigmatism. The illumination optical system 411b may be constituted by an optical system including one or more cylindrical lenses.

The continuous laser beam with astigmatism which has been emitted from the light source part 411 may be focused on and around the predetermined position P at which the droplet 271 is measured, so that the width of the continuous laser beam is long in the direction approximately orthogonal to the target traveling path 272. For example, as shown in FIG. 27B, the continuous laser beam with astigmatism may be focused on and around the predetermined position P, so that the width of the continuous laser beam is long in the X-direction approximately orthogonal to the target traveling path 272 and short in the Y-axis direction approximately parallel to the target traveling path 272. In this case, the cross-sectional shape of the continuous laser beam with astigmatism may be short in the X-axis direction and long in the Y-axis direction as shown in FIG. 27C, at the position just after the continuous laser beam is emitted from the light source part 411 and at the position just before the continuous laser beam enters the light receiving part 412. Then, as shown in FIG. 27C, the cross-sectional shape of the continuous laser beam with astigmatism may be long in the X-axis direction and short in the Y-axis direction, at and around the predetermined position P. The other configuration of the light source part 411 shown in FIG. 27A may be the same as the configuration of the light source part 411 according to Embodiment 10 shown in FIG. 26A.

FIG. 28A is a drawing explaining the light receiving part 412 of the EUV light generation apparatus 1 according to Embodiment 11. FIG. 28B is an enlarged cross sectional view of the shield 92 and a slit plate 93, taken along line B-B shown in FIG. 28A. FIG. 28C is an enlarged cross sectional view of the shield 92 and the slit plate 93, taken along line C-C shown in FIG. 28A. The light receiving part 412 shown in FIG. 28A may include a cover 412m instead of the case holding member 412i shown in FIG. 26A.

The cover 412m may be a member to cover the gap between the wall 2a of the chamber 2 and the window 412c, and the shield case 412h. The cover 412m may be formed by using a light shielding material. The cover 412m may be formed by using an electrically conducting material. The cover 412m may be fixed to the shield case 412h and the wall 2a of the chamber 2, and hold the shield case 412h to the wall 2a of the chamber 2. The cover 412m may be electrically connected to the shield case 412h and the wall 2a of the chamber 2.

The shield case 412h may be connected to the ground via the wall 2a of the chamber 2 and the cover 412m both connected to the ground. The other configuration of the light receiving part 412 shown in FIG. 28A may be the same as the configuration of the light receiving part 412 according to Embodiment 10 shown in FIG. 26A.

The gas lock mechanism 910 shown in FIG. 28A may have a configuration where the slit plate 93 is added to the gas lock mechanism 910 according to Embodiment 10 shown in FIG. 26A.

The slit plate 93 may prevent any light except the continuous laser beam emitted from the light source part 411 from entering the light receiving part 412. The slit plate 93 may be disposed between the shielding body 91A and the window 412c, on the optical path of the continuous laser beam emitted from the light source part 411. The slit plate 93 may be disposed to close the opening of the end of the cylinder part 915A of the shielding body 91A on the window 412c side. The slit plate 93 may be fixed to the end of the cylinder part 915A via a heat insulating member. The slit plate 93 may be formed by using a light shielding material. The slit plate 93 may be formed by using a heat conducting material. The slit plate 93 may be formed by using an electrically conducting material.

As shown in FIG. 28B, a slit 931 may be formed at the center of the slit plate 93. The slit 931 may be formed at a position intersecting with the optical path of the continuous laser beam in the slit plate 93. The slit 931 may have a shape to extend along the target traveling path 272. The slit 931 may be formed to be slightly larger than the cross section of the continuous laser beam passing through the slit 931.

As shown in FIG. 28C, a heater 932 may be disposed on the outer edge of the slit plate 93. The heater 932 may be disposed on the slit plate 93 on the window 412c side. There may be a plurality of heaters 932. The plurality of heaters 932 may be disposed at approximately regular intervals along the circumferential direction of the shield 92 provided in contact with the slit plate 93. The operation of the heaters 932 may be controlled by a heater controller (not shown). The operation of the heaters 932 may be indirectly controlled by the controller 8 via the heater controller.

In the gas lock mechanism 910 shown in FIG. 28A, the shielding body 91A constituting the shielding tube may be formed by using an electrically conducting material. The flange 915f of the shielding body 91A may be electrically connected to the wall 2a of the chamber 2. The other configuration of the gas lock mechanism 910 shown in FIGS. 28A to 28C may be the same as the configuration of the gas lock mechanism 910 according to Embodiment 10 shown in FIG. 26A.

The shield 92 shown in FIG. 28A may be disposed between the shielding body 91A and the window 412c, on the optical path of the continuous laser beam emitted from the light source part 411. The shield 92 may be disposed on an end of the cylinder part 915A of the shielding body 91A on the window 412c side, via the slit plate 93. The shield 92 may be disposed on a surface of the slit plate 93 on the window 412c side, so as to close the slit 931. The shield 92 may be disposed in the chamber 2 to close the slit 931 provided on the end of the cylinder part 915A on the window 412c side. The shield 92 may be provided in contact with the slit plate 93 to transfer the heat generated by the heaters 932 to the shield 92 via the slit plate 93 by heat conduction. The shield 92 may be electrically connected to the cylinder part 915A of the shielding body 91A. The other configuration of the shield 92 shown in FIGS. 28A to 28C may be the same as the configuration of the shield 92 according to Embodiment 10 shown in FIGS. 26A and 26B.

16.2 Operation

The operation of the EUV light generation apparatus 1 according to Embodiment 11 will be described. To be more specific, the operation of the gas lock mechanism 910 will be described. The operation of the EUV light generation apparatus 1 according to Embodiment 11, which is the same as that of the EUV light generation apparatus 1 according to Embodiment 10 shown in FIGS. 26A and 26B and the EUV light generation apparatus 1 according to Embodiment 9 shown in FIG. 24, will not be described again here.

The heater controller (not shown) that controls the heaters 932 may supply electric power to the heaters 932 to control the heating operation of the heaters 932. The heater controller may supply electric power to the heaters 932 to heat the shield 92 to a predetermined temperature equal to or higher than the melting point of the target 27. When the target 27 is tin, the predetermined temperature may be equal to or higher than 232 degrees Celsius, for example, 293 degrees Celsius. The heaters 932 may heat the shield 92 via the slit plate 93.

The flow rate of the gas supplied from the gas supply unit 917 may be controlled by the flow rate controller 918, and then the gas may flow into the gas flow channel 915e via the gas pipe 919. The gas flowing through the gas flow channel 915e may be jetted to the window 412c, from the outer edge of the whole circumference of the window 412c toward the center of the window 412c. The gas jetted to the window 412c may pass through the pores of the shield 92 and the slit 931, and flow into the internal space of the cylinder part 915A of the shielding body 91A.

The gas having flowed in the internal space of the cylinder part 915A may flow from the window 412c side toward the predetermined position P side, and be discharged from the opening 913A. The gas being discharged from the opening 913A may allow the debris flying toward the window 412c due to the plasma generation to be moved away from the window 412c. Here, the flow rate controller 918 may control the flow rate of the gas not to excessively cool the heated shield 92 with the gas.

In addition, the light of the electromagnetic waves emitted from the plasma may be blocked by the cylinder part 915A of the shielding body 91A. If entering the cylinder part 915A, the light of the electromagnetic waves may be blocked by the slit plate 93. Meanwhile, the continuous laser beam emitted from the light source part 411 may pass through the opening 913A of the shielding body 91A, the slit 931 and the shield 92, transmit through the window 412c, and then enter the optical sensor 412a.

16.3 Effect

The EUV light generation apparatus 1 according to Embodiment 11 includes not only the cylinder part 915A but also the slit plate 93, and therefore can more effectively prevent the light of the electromagnetic waves emitted from the plasma from entering the optical sensor 412a. Moreover, the gas supplied into the cylinder part 915A passes through the shield 92 and then is discharged, and therefore the EUV light generation apparatus 1 according to Embodiment 11 can prevent a decrease in the amount of the continuous laser beam entering the optical sensor 412a due to the adhesion of the debris to the shield 92. In addition, the supplied gas has a high reactivity with the debris and the shield 92 is heated, and therefore, even if the debris adheres to the shield 92, the EUV light generation apparatus 1 according to Embodiment 11 can etch the adherent debris on the shield 92 with the gas. When the target 27 is tin and the gas contains hydrogen, the stannane ($SnH_4$) gas may be generated by the reaction between the tin and the hydrogen and discharged by the gas flowing through the shield 92, and therefore it is possible to remove the adherent debris from the shield 92. Accordingly, the EUV light generation apparatus 1 according to Embodiment 11 can more effectively prevent a decrease in the amount of the continuous laser beam entering the optical sensor 412a. By this means, in the EUV light generation apparatus 1 according to Embodiment 11, the light receiving part 412 can stably receive the continuous laser beam emitted from the light source part 411, and therefore the droplet measurement unit 41 can more stably measure the droplet 271. As a result, the EUV light generation apparatus 1 according to Embodiment 11 can further improve the energy stability of the outputted EUV light 252. Here, the other configuration of the EUV light generation apparatus 1 according to Embodiment 11 may be the same as the configuration of the EUV light generation apparatus 1 according to Embodiment 10 shown in FIGS. 26A and 26B.

17. Others

17.1 Detailed Configuration of the Line Filter

Now, with reference to FIGS. 29A to 29D, the detailed configuration of the line filter 42 will be described. As described above, the passage timing signal outputted from the optical sensor 412a of the light receiving part 412 may be changed in response to a change in the optical intensity at the time of the passage of the droplet 271.

The inventors conducted spectral analysis of signal components of the passage timing signal, indicating a change in the optical intensity at the time of the passage of the droplet 271. As a result of the analysis, it was found that the signal components indicating a change in the optical intensity at the time of the passage of the droplet 271 are dominated by frequency components of 1 to 7 MHz.

In addition, the inventors conducted spectral analysis of signal components of the noise, mixed in the passage timing signal, of the electromagnetic waves emitted from the plasma. Then, it was found that the signal components indicating the noise of the electromagnetic waves are dominated by frequency components of at and around 15 MHz.

Based on the results of the spectral analysis, it is preferred that the line filter 42 allows the signal components at frequencies of 1 to 7 MHz to pass therethrough and attenuates the signal components at frequencies of 12 to 18 MHz. Therefore, the line filter 42 may be a filter circuit having a function to allow the signal components at frequencies of 1 to 7 MHz to pass therethrough and attenuate the signal components at frequencies of 12 to 18 MHz. The line filter 42 constituted by a filter circuit may be any of a low-pass filter, a bandpass filter, and a band elimination filter which have the above-described function.

Figure 29:
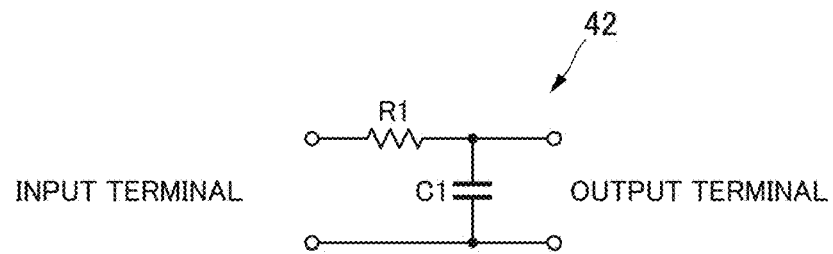
FIG. 29A is a drawing explaining an example of the circuit configuration of a line filter when a low-pass filter is used as a filter circuit constituting the line filter.
FIG. 29B is a drawing explaining an example of the circuit configuration of the line filter when a bandpass filter is used as a filter circuit constituting the line filter.
FIG. 29C is a drawing explaining an example of the circuit configuration of the line filter when a band elimination filter is used as a filter circuit constituting the line filter.
FIG. 29D is a drawing explaining another example of the circuit configuration of the line filter when a low-pass filter is used as a filter circuit constituting the line filter.
Figure 29:
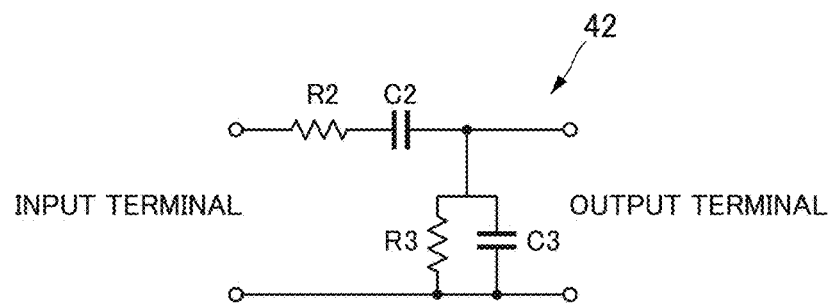
Figure 29:
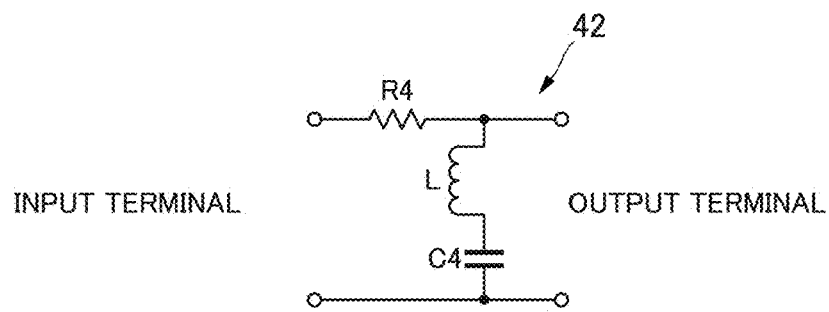
Figure 29:
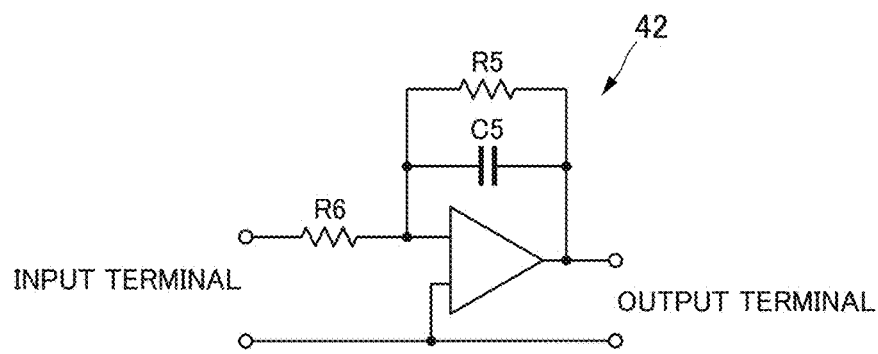

FIG. 29A is a drawing explaining an example of the circuit configuration of the line filter 42 when a low-pass filter is used as the filter circuit constituting the line filter 42. When the low-pass filter is used as the filter circuit constituting the line filter 42, the line filter 42 may have a circuit configuration shown in FIG. 29A. The low-pass filter constituting the line filter 42 may set values of a resistance R1 and a condenser C1 to allow the signal components at frequencies of 1 to 7 MHz to pass therethrough and attenuate the signal components at frequencies of 12 to 18 MHz.

FIG. 29B is a drawing explaining an example of the circuit configuration of the line filter 42 when a bandpass filter is used as the filter circuit constituting the line filter 42. When the bandpass filter is used as the filter circuit constituting the line filter 42, the line filter 42 may have a circuit configuration as shown in FIG. 29B. The bandpass filter constituting the line filter 42 may set values of resistances R2 and R3, and condensers C2 and C3 to allow the signal component at the frequency of 1 to 7 MHz to pass therethrough and attenuate the signal component at the frequency of 12 to 18 MHz.

FIG. 29C is a drawing explaining an example of the circuit configuration of the line filter 42 when a band elimination filter is used as the filter circuit constituting the line filter 42. When the band elimination filter is used as the filter circuit constituting the line filter 42, the line filter 42 may have a circuit configuration as shown in FIG. 29C. The band elimination filter constituting the line filter 42 may set values of a resistance R4, a condenser C4 and an inductor L to allow the signal components at frequencies of 1 to 7 MHz to pass therethrough and attenuate the signal components at frequencies of 12 to 18 MHz.

FIG. 29D is a drawing explaining another example of the circuit configuration of the line filter 42 when the low-pass filter is used as the filter circuit constituting the line filter 42. The filter circuit constituting the line filter 42 may not be limited to a passive type filter circuit, but an active type filter circuit may be applicable. For example, when the low-pass filter is used as the filter circuit constituting the line filter 42, the line filter 42 may have a circuit configuration using an operational amplifier as shown in FIG. 29D. The same may apply to the bandpass filter and the band elimination filter.

17.2 Hardware Environment of Each Controller

A person skilled in the art would understand that the subject matters disclosed herein can be implemented by combining a general purpose computer or a programmable controller with a program module or a software application. In general, the program module includes routines, programs, components and data structures which can execute the processes disclosed herein.

Figure 30:
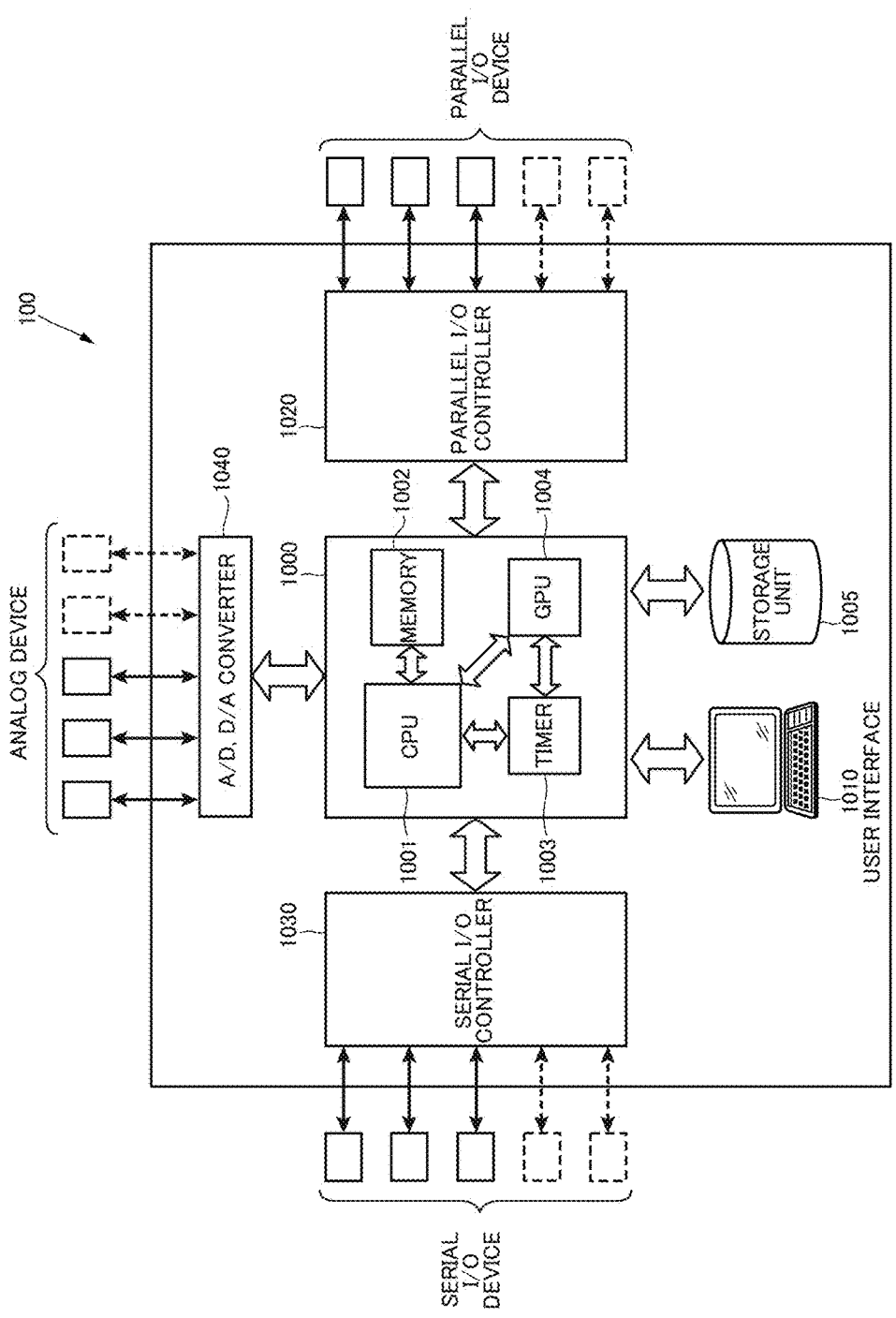
FIG. 30 is a block diagram showing a hardware environment of each controller.

FIG. 30 is a block diagram showing an exemplary hardware environment in which various aspects of the subject matters disclosed herein can be implemented. An exemplary hardware environment 100 shown in FIG. 30 may include a processing unit 1000, a storage unit 1005, a user interface 1010, a parallel I/O controller 1020, a serial I/O controller 1030, and an A/D, D/A converter 1040, but the configuration of the hardware environment 100 is not limited to this.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any of commercially available processors. A dual microprocessor or another multiprocessor architecture may be used as the CPU 1001.

The components shown in FIG. 30 may be interconnected with each other to perform the processes described herein.

During its operation, the processing unit 1000 may read and execute the program stored in the storage unit 1005, read data together with the program from the storage unit 1005, and write the data to the storage unit 1005. The CPU 1001 may execute the program read from the storage unit 1005. The memory 1002 may be a work area in which the program executed by the CPU 1001 and the data used in the operation of the CPU 1001 are temporarily stored. The timer 1003 may measure a time interval and output the result of the measurement to the CPU 1001 according to the execution of the program. The GPU 1004 may process image data according to the program read from the storage unit 1005, and output the result of the process to the CPU 1001.

The parallel I/O controller 1020 may be connected to parallel I/O devices that can communicate with the processing unit 1000, such as the exposure device controller 61, the EUV light generation controller 5, the temperature controller 714, and the controller 8. The parallel I/O controller 1020 may control the communication between the processing unit 1000 and those parallel I/O devices. The serial I/O controller 1030 may be connected to serial I/O devices that can communicate with the processing unit 1000, such as the laser beam direction control unit 34, the hearer power source 712, the piezoelectric power source 732, the pressure regulator 721, the light source 411a, the light source 413a, the image sensor 414a, the gas supply unit 917, the flow rate controller 918, and the heaters 932. The serial I/O controller 1030 may control the communication between the processing unit 1000 and those serial I/O devices. The A/D, D/A converter 1040 may be connected to analog devices such as the target sensor 4, the optical sensor 412a and the piezoelectric element 731 via analog ports, may control the communication between the processing unit 1000 and those analog devices, and may perform A/D, D/A conversion of the contents of the communication.

The user interface 1010 may present the progress of the program executed by the processing unit 1000 to an operator, in order to allow the operator to command the processing unit 1000 to stop the program and to execute an interruption routine.

The exemplary hardware environment 100 may be applicable to the exposure device controller 61, the EUV light generation controller 5, the temperature controller 714 and the controller 8 in the present disclosure. A person skilled in the art would understand that those controllers may be realized in a distributed computing environment, that is, an environment in which tasks are performed by the processing units connected to each other via a communication network. In this disclosure, the exposure device controller 61, the EUV light generation controller 5, the temperature controller 714, the controller 8 and so forth may be connected to each other via a communication network such as Ethernet or Internet. In the distributed computing environment, the program module may be stored in both of a local memory storage device and a remote memory storage device.

17.3 Other Modifications

The image analysis controller of the image sensor 414a of the droplet measurement unit 41 shown in FIG. 18 may be integrally formed with the controller 8. In this case, among the functions of the image analysis controller, the function to measure the timing at which the droplet 271 is passing through the predetermined position P may be carried out by the droplet measurement unit 41, and the other functions may be carried out by the controller 8.

It would be obvious to a person skilled in the art that the technologies described in the above-described embodiments including the modifications may be compatible with each other.

For example, the line filter 42 according to Embodiment 4 shown in FIG. 16 may be applicable to the EUV light generation apparatus 1 according to Embodiments 1 to 3 including the modifications. Moreover, the layout of the light source part 411 and the light receiving part 412 according to Embodiment 5 shown in FIG. 17 may be applicable to the layout of the light source part 411 and the light receiving part 412 according to Embodiments 1 to 3, and the layout of the light source part 413 and the imaging part 414 according to Embodiment 6.

The descriptions above are intended to be illustrative only and the present disclosure is not limited thereto. Therefore, it will be apparent to those skilled in the art that it is possible to make modifications to the embodiments of the present disclosure within the scope of the appended claims.

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the indefinite article "a/an" should be interpreted as "at least one" or "one or more."

REFERENCE SIGNS LIST

1 EUV light generation apparatus
2 chamber
27 target
271 droplet
41 droplet measurement unit
411 light source part
411a light source
412 light receiving part
412a optical sensor
412d transfer optical system
412e spatial filter
42 line filter
7 target generator
9 shielding member
91 shielding plate
91A shielding body
910 gas lock mechanism
913, 913A opening
915, 915A cylinder part
916 optical filter
92 shield
93 slit plate
931 slit
932 heater

The invention claimed is:

1. An extreme ultraviolet light generation apparatus comprising:
   a chamber in which extreme ultraviolet light is generated from plasma, the plasma being generated by irradiating a target supplied into the chamber with a laser beam;
   a target generator configured to supply the target into the chamber as a droplet;
   a droplet measurement unit configured to measure the droplet supplied from the target generator into the chamber; and
   a shielding member configured to shield the droplet measurement unit from electromagnetic waves emitted from the plasma,
   the droplet measurement unit including:
      a light source configured to emit continuous light to the droplet;
      a window provided in the chamber and configured to allow the continuous light to transmit therethrough; and
      an optical sensor configured to receive the continuous light via the window, and
   the shielding member including a shielding body provided on the chamber side with respect to the window configured to cover an optical path of the continuous light and having a light passing opening for passing the continuous light therethrough, and the shielding member is provided within the interior of the chamber, configured separately from a wall that constitutes the chamber.

2. The extreme ultraviolet light generation apparatus according to claim 1, wherein the shielding body prevents light of the electromagnetic waves emitted from the plasma from entering the droplet measurement unit.

3. The extreme ultraviolet light generation apparatus according to claim 2, wherein the shielding member further includes a shield configured to prevent noise of the electromagnetic waves emitted from the plasma from entering the droplet measurement unit.

4. The extreme ultraviolet light generation apparatus according to claim 2, wherein the droplet measurement unit further includes a transfer optical system configured to transfer an image of the droplet irradiated with the continuous light to the optical sensor.

5. The extreme ultraviolet light generation apparatus according to claim 2, wherein:
   the droplet measurement unit measures the droplet passing through a predetermined position in the chamber; and
   the shielding body includes:
      a cylinder part provided between the predetermined position and the window and configured to cover the optical path of the continuous light; and an opening formed at an end of the cylinder part on the predetermined position side.

6. The extreme ultraviolet light generation apparatus according to claim 5, further comprising a gas lock mechanism configured to supply gas into the cylinder part and discharge the gas in the cylinder part from the opening, the gas lock mechanism being provided within the interior of the chamber.

7. The extreme ultraviolet light generation apparatus according to claim 6, wherein:
the shielding member further includes a shield configured to prevent noise of the electromagnetic waves emitted from the plasma from entering the droplet measurement unit; and
the shield is disposed between the window and the optical sensor.

8. The extreme ultraviolet light generation apparatus according to claim 6, wherein:
the shielding member further includes a shield configured to prevent noise of the electromagnetic waves emitted from the plasma from entering the droplet measurement unit; and
the shield is disposed to close a slit provided on an end of the cylinder part on the window side.

9. The extreme ultraviolet light generation apparatus according to claim 8, further comprising a heater configured to heat the shield.

10. The extreme ultraviolet light generation apparatus according to claim 5, wherein the droplet measurement unit further includes an optical filter disposed to close the opening and configured to allow the continuous light to transmit therethrough, the optical filter and the opening are provided within the interior of the chamber.

11. The extreme ultraviolet light generation apparatus according to claim 5, wherein the droplet measurement unit further includes a spatial filter disposed between the window and the optical sensor and configured to prevent passage of light not traveling on the optical path of the continuous light.

12. The extreme ultraviolet light generation apparatus according to claim 5, wherein:
the droplet measurement unit outputs a passage timing signal indicating a timing at which the droplet is passing through the predetermined position; and
a line filter is provided on a signal wire through which the passage timing signal outputted from the droplet measurement unit is transmitted to attenuate noise of the electromagnetic waves.

13. An extreme ultraviolet light generation apparatus comprising:
a chamber in which extreme ultraviolet light is generated from plasma, the plasma being generated by irradiating a target supplied into the chamber with a laser beam;
a target generator configured to supply the target into the chamber as a droplet; and
a droplet measurement unit configured to measure the droplet supplied from the target generator into the chamber,
the droplet measurement unit including:
a light source configured to emit continuous light to the droplet;
a window provided in the chamber and configured to allow the continuous light to transmit therethrough;
an optical sensor configured to receive the continuous light via the window; and
a transfer optical system disposed between the window and the optical sensor and configured to transfer an image of the droplet irradiated with the continuous light to the optical sensor and prevent light of electromagnetic waves emitted from the plasma from entering the optical sensor, wherein:
the droplet measurement unit measures the droplet passing through a predetermined position in the chamber and outputs a passage timing signal indicating a timing at which the droplet is passing through the predetermined position; and
a line filter is provided on a signal wire through which the passage timing signal outputted from the droplet measurement unit is transmitted to attenuate noise of the electromagnetic waves emitted from the plasma, and the line filter includes an analog circuit.

14. The extreme ultraviolet light generation apparatus according to claim 3, wherein:
the droplet measurement unit measures the droplet passing through a predetermined position in the chamber; and the shielding body includes:
a cylinder part provided between the predetermined position and the window and configured to cover the optical path of the continuous light; and
an opening formed at an end of the cylinder part on the predetermined position side.

15. The extreme ultraviolet light generation apparatus according to claim 4, wherein:
the droplet measurement unit measures the droplet passing through a predetermined position in the chamber; and the shielding body includes:
a cylinder part provided between the predetermined position and the window and configured to cover the optical path of the continuous light; and
an opening formed at an end of the cylinder part on the predetermined position side.

16. The extreme ultraviolet light generation apparatus according to claim 6, wherein:
the gas lock mechanism is configured to supply gas to the interior of the cylinder part while causing the gas to contact the surface of the window toward the side of the chamber when supplying the gas to the interior of the cylinder part.

17. The extreme ultraviolet light generation apparatus according to claim 13, wherein:
the line filter is a filter circuit, which is one of a low pass filter, a band pass filter, and a band eliminating filter.

18. The extreme ultraviolet light generation apparatus according to claim 13, wherein:
the line filter attenuates signal components having frequencies within a range from 12 MHz to 18 MHz.

19. The extreme ultraviolet light generation apparatus according to claim 1, wherein:
a shielding surface of a portion of the shielding body at which the light passing opening is formed is inclined toward the side of the optical sensor as a distance from a region where the plasma is generated becomes greater.

20. The extreme ultraviolet light generation apparatus according to claim 1, wherein:
a shielding surface of a portion of the shielding body at which the light passing opening is formed is substantially parallel to a target traveling path.

* * * * *